United States Patent
Kori et al.

(10) Patent No.: US 11,851,530 B2
(45) Date of Patent: Dec. 26, 2023

(54) MATERIAL FOR FORMING ORGANIC FILM, PATTERNING PROCESS, AND POLYMER

(71) Applicant: SHIN-ETSU CHEMICAL CO., LTD., Tokyo (JP)

(72) Inventors: Daisuke Kori, Joetsu (JP); Takashi Sawamura, Joetsu (JP); Keisuke Niida, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 87 days.

(21) Appl. No.: 17/158,735

(22) Filed: Jan. 26, 2021

(65) Prior Publication Data

US 2021/0269597 A1 Sep. 2, 2021

(30) Foreign Application Priority Data

Feb. 19, 2020 (JP) ................. 2020-026190

(51) Int. Cl.
| | |
|---|---|
| C08G 73/10 | (2006.01) |
| C08J 5/18 | (2006.01) |
| G03F 7/09 | (2006.01) |
| G03F 7/075 | (2006.01) |
| G03F 7/16 | (2006.01) |
| C08J 5/08 | (2006.01) |

(52) U.S. Cl.
CPC ..... *C08G 73/1046* (2013.01); *C08G 73/1067* (2013.01); *C08J 5/08* (2013.01); *G03F 7/0755* (2013.01); *G03F 7/091* (2013.01); *G03F 7/094* (2013.01); *G03F 7/161* (2013.01); *C08J 2379/08* (2013.01)

(58) Field of Classification Search
CPC .................................................... C08G 73/10
See application file for complete search history.

(56) References Cited

U.S. PATENT DOCUMENTS

| | | | | |
|---|---|---|---|---|
| 4,303,775 | A | * 12/1981 | Chow | C08G 73/16 528/172 |
| 2002/0106909 | A1 | 8/2002 | Kato et al. | |
| 2005/0255712 | A1 | 11/2005 | Kato et al. | |
| 2006/0019195 | A1 | 1/2006 | Hatakeyama et al. | |
| 2006/0204891 | A1 | 9/2006 | Hatakeyama | |
| 2009/0274978 | A1 | 11/2009 | Ohashi et al. | |
| 2010/0099044 | A1 | 4/2010 | Hatakeyama et al. | |
| 2012/0135251 | A1 | * 5/2012 | Jeong | H01L 24/29 524/588 |
| 2013/0105998 | A1 | * 5/2013 | Matsumura | C08G 59/68 430/280.1 |
| 2013/0302990 | A1 | 11/2013 | Watanabe et al. | |
| 2017/0002131 | A1 | 1/2017 | Zeng et al. | |
| 2017/0184968 | A1 | * 6/2017 | Kori | C09D 5/008 |
| 2020/0041903 | A1 | 2/2020 | Takemura et al. | |
| 2020/0348595 | A1 | 11/2020 | Nakafuji et al. | |

FOREIGN PATENT DOCUMENTS

| | | |
|---|---|---|
| EP | 3604390 A1 | 2/2020 |
| JP | 2002-334869 A | 11/2002 |
| JP | 2005-128509 A | 5/2005 |
| JP | 2006-285095 A | 10/2006 |
| JP | 2006-293298 A | 10/2006 |
| JP | 2007-199653 A | 8/2007 |
| JP | 2009-269953 A | 11/2009 |

(Continued)

OTHER PUBLICATIONS

English Machine Translation of Takamatsu (TW201348296A) (Year: 2013).*
English Machine Translation of Hashimoto et al. (WO2011132641A1) (Year: 2011).*
Jul. 6, 2021 Search Report issued in Europeant Patent Application No. 21154424.2.
Nov. 15, 2022 Office Action issued in Japanese Patent Application No. 2020-26190.

(Continued)

*Primary Examiner* — Mark F. Huff
*Assistant Examiner* — Nicholas E Brown
(74) *Attorney, Agent, or Firm* — Oliff PLC

(57) ABSTRACT

A material for forming an organic film, including: a polymer having a structure shown by the following general formula (1A) as a partial structure; and an organic solvent, where in the general formula (1A), W1 represents a tetravalent organic group, W2 represents a single bond or a linking group shown by the following formula (1B), R1 represents a hydrogen atom or a monovalent organic group having 1 to 10 carbon atoms, n1 represents an integer of 0 or 1, and n2 and n3 satisfy $0 \leq n2 \leq 6, 0 \leq n3 \leq 6$, and $1 \leq n2+n3 \leq 6$, and where R2 and R3 each independently represent hydrogen or an organic group having 1 to 30 carbon atoms, and the organic group R2 and the organic group R3 optionally bond to each other within a molecule to form a cyclic organic group.

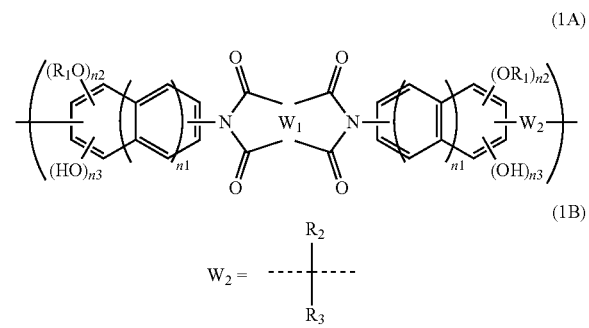

21 Claims, 3 Drawing Sheets

(56) References Cited

FOREIGN PATENT DOCUMENTS

| | | | |
|---|---|---|---|
| JP | 2010-122297 A | 6/2010 | |
| JP | 2010-122656 A | 6/2010 | |
| JP | 2013-137334 A | 7/2013 | |
| JP | 2013-232314 A | 11/2013 | |
| JP | 2013-253227 A | 12/2013 | |
| KR | 10-2013-0121722 A | 11/2013 | |
| TW | 201348296 A | 12/2013 | |
| TW | 201348296 A * | 12/2013 | ............. G03F 7/022 |
| WO | 2004066377 A1 | 8/2004 | |
| WO | WO-2011132641 A1 * | 10/2011 | ............. C08G 73/10 |
| WO | 2016/101538 A1 | 6/2016 | |
| WO | 2019/146378 A1 | 8/2019 | |

OTHER PUBLICATIONS

Aug. 1, 2023 Office Action issued in Korean Patent Application No. 10-2021-0016639.

* cited by examiner

[FIG. 1]
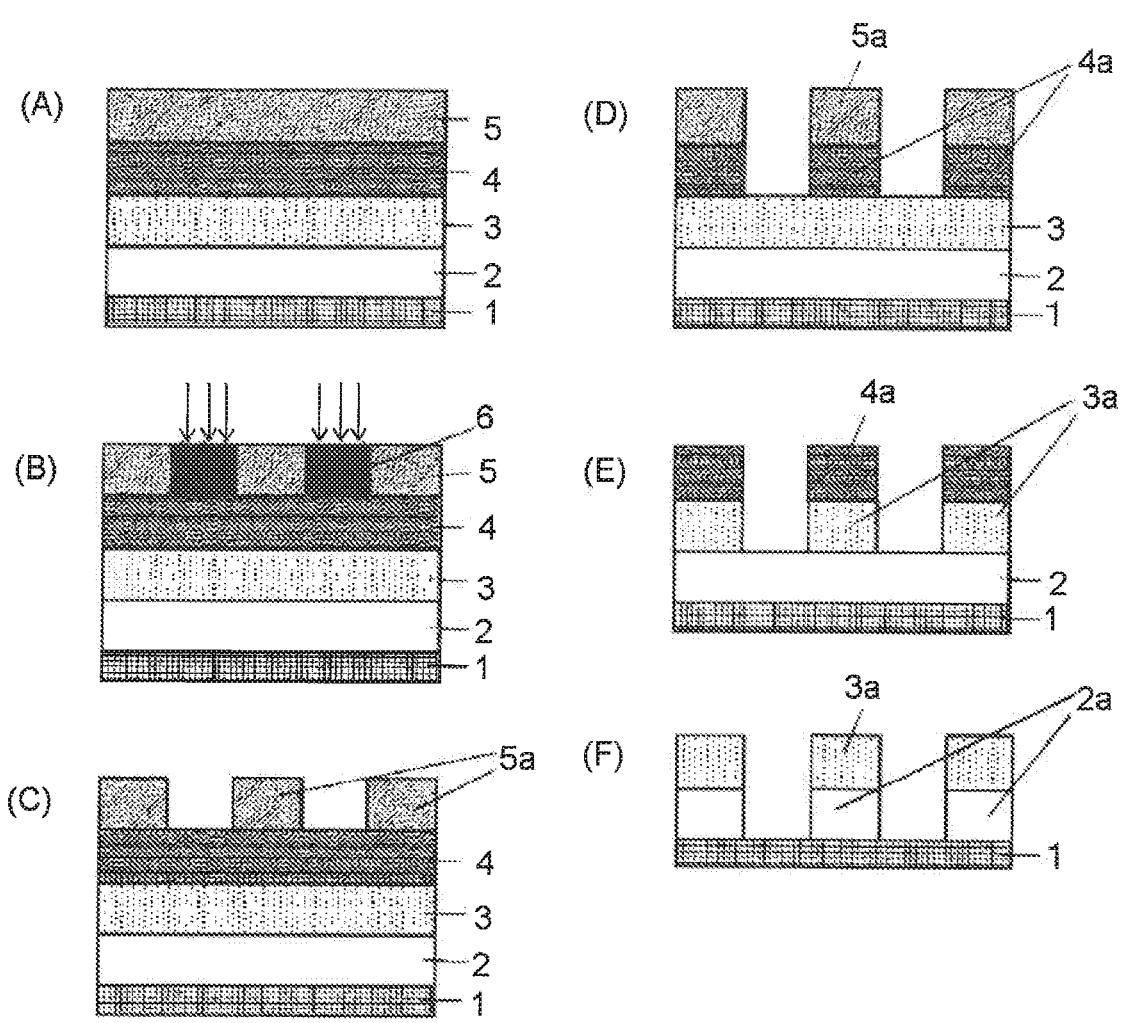

[FIG. 2]
(G)
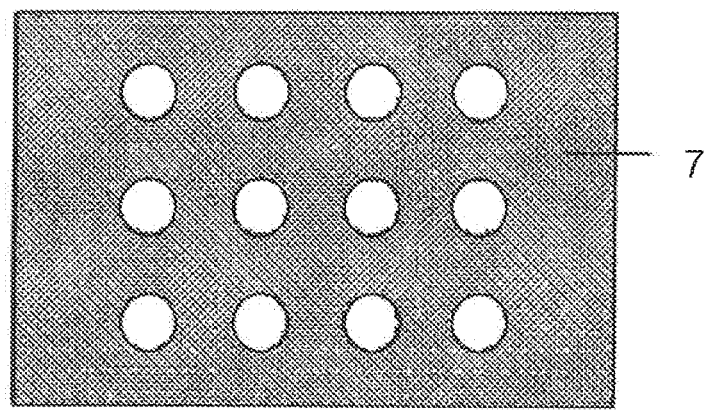
(H)
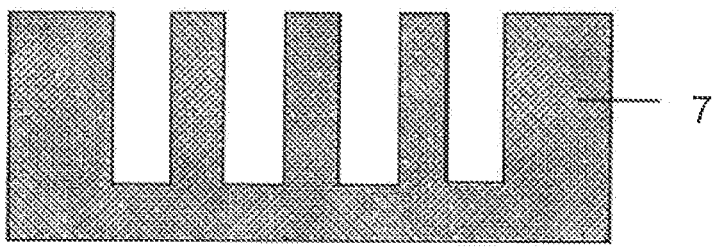
(I)
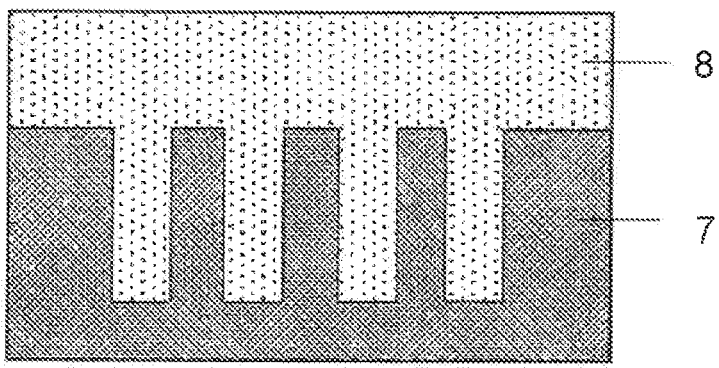

[FIG. 3]
(J)
(K)
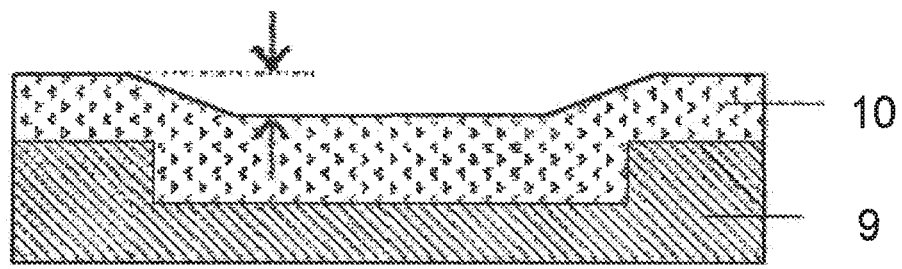

MATERIAL FOR FORMING ORGANIC FILM, PATTERNING PROCESS, AND POLYMER

TECHNICAL FIELD

The present invention relates to: a material for forming an organic film used, for example, in a semiconductor device manufacturing process; a patterning process by a multilayer resist method using the material; and a polymer used in a material for forming an organic film.

BACKGROUND ART

Conventionally, high integration and high processing speed of semiconductor devices have been achieved through the miniaturization of pattern size by shortening the wavelength of light sources in lithography technology using light exposure (photolithography), which is commonly employed technology. To form such a fine circuit pattern on a semiconductor device substrate (substrate to be processed), the following method is generally employed, where the substrate to be processed is processed by dry etching while using a patterned photoresist film as an etching mask. In practice, however, there is no dry etching method capable of providing an absolute etching selectivity between the photoresist film and the substrate to be processed. Hence, recently, it has been common to process a substrate by a multilayer resist method. This method is as follows: first, a middle layer film having a different etching selectivity from a photoresist film (hereinafter, resist upper layer film) is placed between the resist upper layer film and a substrate to be processed; a pattern is formed in the resist upper layer film; then, the pattern is transferred to the middle layer film by dry etching while using the resist upper layer film pattern as a dry etching mask; further, the pattern is transferred to the substrate to be processed by dry etching while using the middle layer film as a dry-etching mask.

One of the multilayer resist methods is a 3-layer resist method which can be performed using a typical resist composition used in a monolayer resist method. In this method, a substrate to be processed is coated with an organic underlayer film material composed of an organic resin-containing composition and then baked to form an organic underlayer film (hereinafter, organic film); the organic film is subsequently coated with a resist underlayer film material composed of a composition containing a silicon-containing resin, and baked to form a silicon-containing film (hereinafter, silicon-containing resist underlayer film); thereafter, a typical organic photoresist film (hereinafter, resist upper layer film) is formed on the silicon-containing resist underlayer film. The resist upper layer film is patterned and then subjected to dry etching with fluorine-based gas plasma, so that the organic resist upper layer film can exhibit a favorable etching selectivity ratio relative to the silicon-containing resist underlayer film. Thus, the resist upper layer film pattern can be transferred to the silicon-containing resist underlayer film. This method allows a pattern to be easily transferred to the silicon-containing resist underlayer film even if a resist upper layer film does not have film thickness sufficient for directly processing the substrate to be processed or if a resist upper layer film does not have sufficient dry-etching resistance for processing the substrate to be processed. This is because the silicon-containing resist underlayer film generally has a film thickness equal to or smaller than the resist upper layer film. Subsequently, using the silicon-containing resist underlayer film having the transferred pattern as a dry-etching mask, the pattern is transferred to the organic film by dry etching with oxygen- or hydrogen-based gas plasma. Thereby, the pattern can be transferred to the organic film having dry-etching resistance sufficient for substrate processing. This organic film pattern thus transferred can be transferred to the substrate by dry etching with a fluorine-based gas, chlorine-based gas, or the like.

Meanwhile, the miniaturization in the semiconductor device manufacturing process is approaching the limit inherent in the wavelength of light sources for photolithography. Accordingly, recently, the high integration of semiconductor devices that does not rely on miniaturization has been examined. As one means for the high integration, semiconductor devices having complicated structures such as multigate structure have been examined, and some of these have been already put into practical use. In forming such structures by multilayer resist methods, it is possible to employ an organic film material which is capable of filling a fine pattern including hole, trench, and fin formed on a substrate to be processed with a film without space, and capable of filling a step- or pattern-dense region and a pattern-free region with a film and planarizing the regions. The use of such an organic film material to form an organic film having a flat surface on a stepped substrate reduces fluctuations in film thicknesses of a silicon-containing resist underlayer film and a resist upper layer film formed thereon, and can suppress reductions in a focus margin in photolithography and a margin in a subsequent step of processing the substrate to be processed. This makes it possible to manufacture semiconductor devices with high yields. On the other hand, in the monolayer resist method, the upper layer resist film has to have a large film thickness to fill a stepped or patterned substrate to be processed. As a result, for example, pattern collapse occurs after exposure and development, and the pattern profile deteriorates due to reflection from the substrate at exposure. Consequently, the pattern formation margin at exposure is narrowed, making it difficult to manufacture semiconductor devices with high yields.

A pattern with a high aspect ratio needs to be formed on the organic film material as described above by a dry etching process. Accordingly, the organic film requires not only filling and planarizing performances as described above, but also high dry-etching resistance. Furthermore, the silicon-containing resist underlayer film on the organic film also requires high dry-etching resistance. Therefore, an inorganic hard mask formed by a CVD or ALD method, etc. is often selected as the silicon-containing resist underlayer film, since such a hard mask has a higher dry-etching resistance than a silicon-containing resist underlayer film formed by spin-coating. Since the temperature is usually 300° C. or higher when forming this hard mask, the organic film also requires a high heat resistance for withstanding such temperatures. Moreover, adhesion to the substrate to be processed is also required, since delamination from the substrate sometimes occurs when forming the inorganic hard mask by the CVD or ALD method. It is important for an organic film material excellent in process margin to be provided with these properties.

As known organic film materials, condensed resins using aromatic alcohols and carbonyl compounds such as ketones and aldehydes as condensing agents for a phenol compound or a naphthol compound, etc. have been known. Examples of such condensed resins include a fluorene bisphenol novolak resin described in Patent Document 1, a bisphenol compound and a novolak resin thereof described in Patent Document 2, a novolak resin of an adamantane phenol compound described in Patent Document 3, a bisnaphthol compound and a novolak resin thereof described in Patent Document 4, and the like. These bisphenol compounds and novolak resins form films by being cured due to a cross-linking reaction caused by the action of oxygen in air, the films having solvent resistance in relation to a coating film material used in the subsequent step. These bisphenol compounds and novolak resins are excellent in terms of curability, but heat resistance of the bisphenols, etc. used as a raw material has room for improvement.

CITATION LIST

Patent Literature

Patent Document 1: JP 2005-128509 A
Patent Document 2: JP 2006-293298 A
Patent Document 3: JP 2006-285095 A
Patent Document 4: JP 2010-122656 A
Patent Document 5: JP 2013-137334 A
Patent Document 6: JP 2010-122297 A

SUMMARY OF INVENTION

Technical Problem

The present invention has been made to solve the above-described problems, and an object thereof is to provide: a material for forming an organic film by which an organic film excellent in solvent resistance, heat resistance, filling property, planarizing property, and pattern formability can be formed; a patterning process using this material for forming an organic film; and a polymer contained in this material for forming an organic film.

Solution to Problem

To achieve the object, the present invention provides a material for forming an organic film, comprising: a polymer having a structure shown by the following general formula (1A) as a partial structure; and an organic solvent,

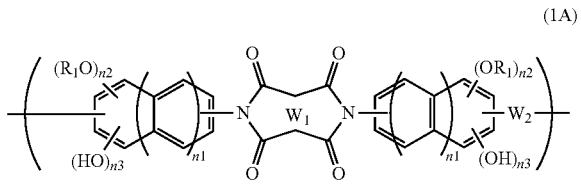

(1A)

wherein in the general formula (1A), $W_1$ represents a tetravalent organic group, $W_2$ represents a single bond or a linking group shown by the following formula (1B), $R_1$ represents a hydrogen atom or a monovalent organic group having 1 to 10 carbon atoms, n1 represents an integer of 0 or 1, and n2 and n3 satisfy $0 \leq n2 \leq 6$, $0 \leq n3 \leq 6$, and $1 \leq n2+n3 \leq 6$,

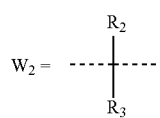

(1B)

wherein $R_2$ and $R_3$ each independently represent hydrogen or an organic group having 1 to 30 carbon atoms, and the organic group $R_2$ and the organic group $R_3$ optionally bond to each other within a molecule to form a cyclic organic group.

Such a material for forming an organic film has thermosetting property like a novolak resin, and since a main chain is constituted by a skeleton containing an imide group, an organic film having excellent heat resistance and favorable adhesion to a substrate can be formed by the material for forming an organic film. Moreover, the inventive material for forming an organic film can be used to form an organic film excellent in solvent resistance, filling property, planarizing property, and pattern formability.

The organic group $W_3$ in the general formula (1A) is preferably shown by the following formula (1C),

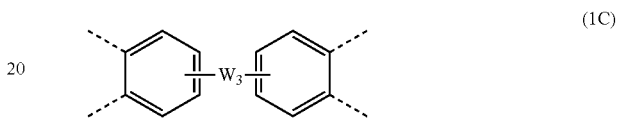

(1C)

wherein $W_3$ in the formula (1C) represents a single bond or a divalent organic group, the benzene rings in the formula (1C) optionally have a substituent thereon, and a substituent on the benzene ring and an organic group in $W_3$ optionally bond to each other to form a cyclic organic group.

It is preferable to have the partial structure described above in the main chain from the viewpoint of exhibiting excellent heat resistance.

Alternatively, the organic group $W_1$ in the general formula (1A) is preferably shown by any of the following formulae (1D),

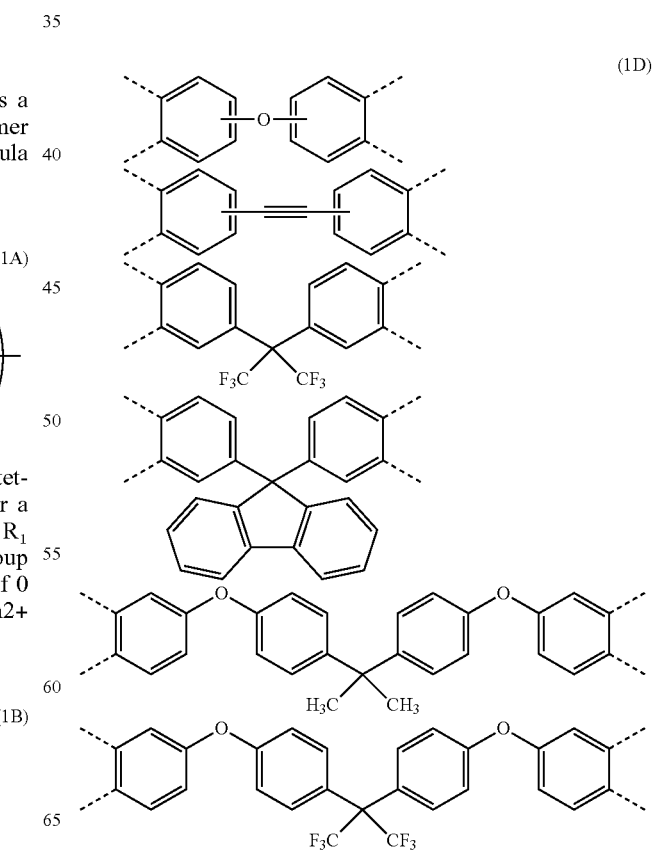

(1D)

-continued

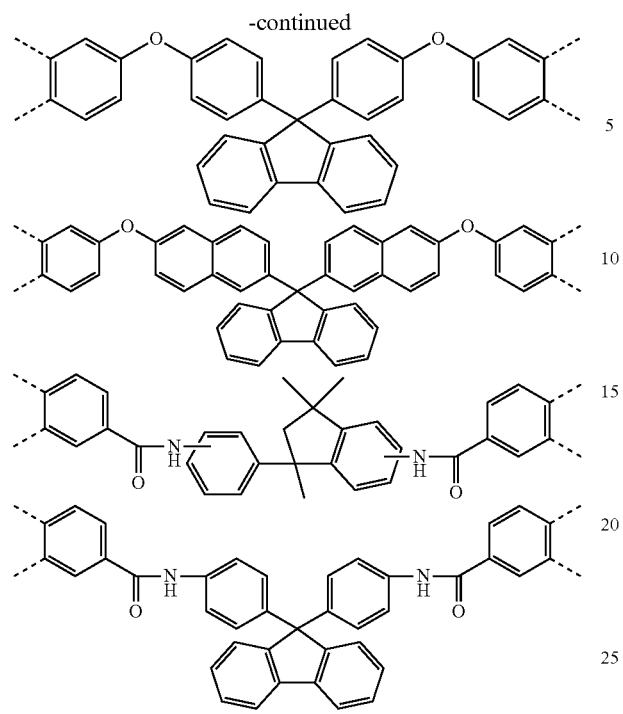

wherein an aromatic ring in the formula optionally has a substituent thereon.

It is preferable to have such a partial structure from the viewpoints of heat resistance, solubility in solvents, and enhancing thermal flowability.

The linking group $W_2$ in the general formula (1A) is preferably shown by the following formula (1E).

(1E)

It is preferable to have such a partial structure in the main chain from the viewpoint of curability.

Furthermore, the above-described polymer preferably has an Mw (weight-average molecular weight) of 1000 to 10000.

A material for forming an organic film containing a polymer with such an Mw range can suppress outgassing when baking without losing solubility in organic solvents.

The polymer is further preferably a novolak resin having the partial structure shown by the general formula (1A).

An organic film more excellent in solvent resistance can be formed by a material for forming an organic film containing such a polymer.

Furthermore, the organic solvent is preferably a mixture of one or more organic solvents each having a boiling point of lower than 180° C. and one or more organic solvents each having a boiling point of 180° C. or higher.

With such a material for forming an organic film, the above-described polymer is provided with thermal flowability of films due to adding a high-boiling-point solvent, so that a material for forming an organic film can achieve both higher filling property and planarizing property.

Furthermore, the above-described material for forming an organic film preferably comprises at least one of a surfactant and a plasticizer.

A material for forming an organic film containing such a component can be a material for forming an organic film more excellent in coating property or filling and planarizing properties.

In addition, the present invention provides a patterning process comprising:
  forming an organic film by using the inventive material for forming an organic film on a body to be processed;
  forming a silicon-containing resist underlayer film by using a silicon-containing resist underlayer film material on the organic film;
  forming a resist upper layer film by using a photoresist composition on the silicon-containing resist underlayer film;
  forming a circuit pattern in the resist upper layer film;
  transferring the pattern to the silicon-containing resist underlayer film by etching the silicon-containing resist underlayer film while using the resist upper layer film having the formed pattern as a mask;
  transferring the pattern to the organic film by etching the organic film while using the silicon-containing resist underlayer film having the transferred pattern as a mask; and
  further forming the pattern on the body to be processed by etching the body to be processed while using the organic film having the transferred pattern as a mask.

Furthermore, the present invention provides a patterning process comprising:
  forming an organic film by using the inventive material for forming an organic film on a body to be processed;
  forming a silicon-containing resist underlayer film by using a silicon-containing resist underlayer film material on the organic film;
  forming an organic antireflective coating on the silicon-containing resist underlayer film;
  forming a resist upper layer film by using a photoresist composition on the organic antireflective coating, so that a 4-layered film structure is constructed;
  forming a circuit pattern in the resist upper layer film;
  transferring the pattern to the organic antireflective coating and the silicon-containing resist underlayer film by etching the organic antireflective coating and the silicon-containing resist underlayer film while using the resist upper layer film having the formed pattern as a mask;
  transferring the pattern to the organic film by etching the organic film while using the silicon-containing resist underlayer film having the transferred pattern as a mask; and
  further forming the pattern on the body to be processed by etching the body to be processed while using the organic film having the transferred pattern as a mask.

Furthermore, the present invention provides a patterning process comprising:
  forming an organic film by using the inventive material for forming an organic film on a body to be processed;
  forming an inorganic hard mask selected from a silicon oxide film, a silicon nitride film, and a silicon oxynitride film on the organic film;
  forming a resist upper layer film by using a photoresist composition on the inorganic hard mask; forming a circuit pattern in the resist upper layer film;
  transferring the pattern to the inorganic hard mask by etching the inorganic hard mask while using the resist upper layer film having the formed pattern as a mask;
  transferring the pattern to the organic film by etching the organic film while using the inorganic hard mask having the formed pattern as a mask; and
  further forming the pattern on the body to be processed by etching the body to be processed while using the organic film having the formed pattern as a mask.

Furthermore, the present invention provides a patterning process comprising:
  forming an organic film by using the inventive material for forming an organic film on a body to be processed;
  forming an inorganic hard mask selected from a silicon oxide film, a silicon nitride film, and a silicon oxynitride film on the organic film;
  forming an organic antireflective coating on the inorganic hard mask;
  forming a resist upper layer film by using a photoresist composition on the organic antireflective coating, so that a 4-layered film structure is constructed;
  forming a circuit pattern in the resist upper layer film;
  transferring the pattern to the organic antireflective coating and the inorganic hard mask by etching the organic antireflective coating and the inorganic hard mask while using the resist upper layer film having the formed pattern as a mask;
  transferring the pattern to the organic film by etching the organic film while using the inorganic hard mask having the formed pattern as a mask; and
  further forming the pattern on the body to be processed by etching the body to be processed while using the organic film having the formed pattern as a mask.

The inventive material for forming an organic film can be suitably used for various patterning processes such as a 3-layer resist process using a silicon-containing resist underlayer film or an inorganic hard mask, and a 4-layer resist process additionally using an organic antireflective coating. In a semiconductor device manufacturing process where a circuit pattern is formed by the inventive patterning process as described, a semiconductor device can be manufactured with a high yield.

In this case, the formation of the inorganic hard mask is preferably performed by a CVD method or an ALD method.

In the inventive patterning process, the inorganic hard mask can be formed by such a method, for example.

Furthermore, in this case, the circuit pattern formation on the resist upper layer film is preferably performed by a photolithography using light with a wavelength of 10 nm or more to 300 nm or less, a direct drawing by electron beam, a nanoimprinting, or a combination thereof.

When the circuit pattern is formed, the circuit pattern is preferably developed by alkaline development or development with an organic solvent.

In the inventive patterning process, such circuit pattern formation means and development means can be suitably used.

Furthermore, the body to be processed is preferably a semiconductor device substrate or the semiconductor device substrate coated with any of a metal film, a metal carbide film, a metal oxide film, a metal nitride film, a metal oxycarbide film, and a metal oxynitride film.

Furthermore, as the body to be processed, a body to be processed comprising silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is preferably used.

The inventive patterning process is capable of processing the body to be processed as described above to form a pattern.

Furthermore, the present invention provides a polymer having a structure shown by the following general formula (1A) as a partial structure,

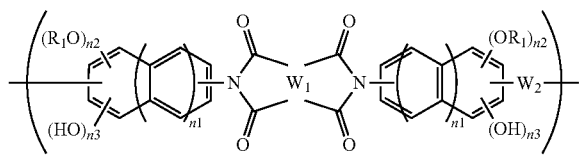

(1A)

wherein in the general formula (1A), $W_1$ represents a tetravalent organic group, $W_2$ represents a single bond or a linking group shown by the following formula (1B), $R_1$ represents a hydrogen atom or a monovalent organic group having 1 to 10 carbon atoms, n1 represents an integer of 0 or 1, and n2 and n3 satisfy $0 \leq n2 \leq 6$, $0 \leq n3 \leq 6$, and $1 \leq n2+n3 \leq 6$,

(1B)

wherein $R_2$ and $R_3$ each independently represent hydrogen or an organic group having 1 to 30 carbon atoms, and the organic group $R_2$ and the organic group $R_3$ optionally bond to each other within a molecule to form a cyclic organic group.

When the inventive polymer is used as a component for a material for forming an organic film, an organic film having heat resistance, adhesion to a substrate, and filling and planarizing properties can be formed with the obtained material for forming an organic film.

In the inventive polymer, the organic group $W_1$ in the general formula (1A) is preferably shown by the following formula (1C),

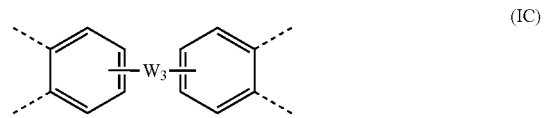

(1C)

wherein $W_3$ in the formula (1C) represents a single bond or a divalent organic group, the benzene rings in the formula (1C) optionally have a substituent thereon, and a substituent on the benzene ring and an organic group in $W_3$ optionally bond to each other to form a cyclic organic group.

It is preferable for the polymer to have such a partial structure on the main chain from the viewpoint of exhibiting heat resistance.

Alternatively, in the inventive polymer, the organic group $W_1$ in the general formula (1A) is preferably shown by any of the following formulae (1D),

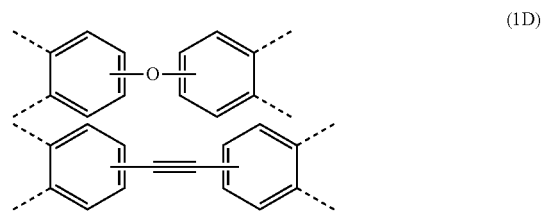

(1D)

-continued

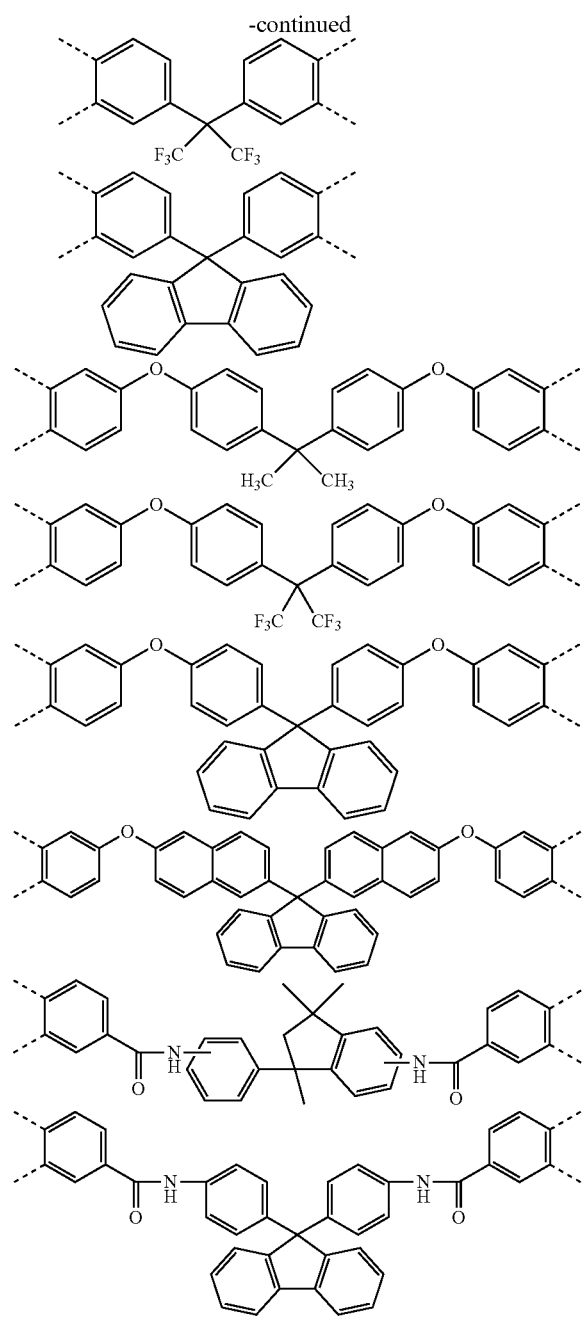

wherein an aromatic ring in the formula optionally has a substituent thereon.

It is preferable to have such a partial structure in the polymer from the viewpoints of solubility in solvents and providing thermal flowability.

The linking group $W_2$ in the general formula (1A) is preferably shown by the following formula (1E).

$$W_2=\!\!-\!\!CH_2\!\!-\!\! \tag{1E}$$

It is preferable to have such a partial structure in the polymer from the viewpoint of providing curability.

Furthermore, the above-described polymer preferably has an Mw (weight-average molecular weight) of 1000 to 10000.

A material for forming an organic film containing a polymer with such an Mw range can suppress outgassing when baking without losing solubility in organic solvents.

The polymer is further preferably a novolak resin having the partial structure shown by the general formula (1A).

An organic film more excellent in solvent resistance can be formed by a material for forming an organic film containing such a polymer.

Advantageous Effects of Invention

As described above, the present invention can provide: a polymer useful as a component of a material for forming an organic film for forming an organic film having excellent heat resistance, excellent solvent resistance, excellent filling property, excellent planarizing property, and excellent adhesion to a substrate; and a material for forming an organic film containing this polymer. Moreover, this material for forming an organic film has excellent heat resistance, solvent resistance, filling property, planarizing property, and adhesion to a substrate, does not lose other characteristics such as etching resistance, and has excellent pattern formability. Accordingly, the material for forming an organic film is extremely useful as a resist underlayer film material in a multilayer resist process such as a 2-layer resist process, a 3-layer resist process using a silicon-containing underlayer film or an inorganic hard mask, or a 4-layer resist process using a silicon-containing underlayer film or an inorganic hard mask and an organic antireflective coating, or as a planarizing material for manufacturing a semiconductor device, for example.

In addition, a sufficiently cured and flat organic film can be formed on a substrate to be processed by a method for forming an organic film using the inventive material for forming an organic film. Furthermore, according to the inventive patterning process, a fine pattern can be formed on a substrate to be processed with high precision in a multi-layer resist process.

BRIEF DESCRIPTION OF DRAWINGS

FIG. 1 is an explanatory diagram of an example of a 3-layer resist process according to an inventive patterning process.

FIG. 2 is an explanatory diagram of a method for evaluating the filling property in Examples and Comparative Examples.

FIG. 3 is an explanatory diagram of a method for evaluating the planarizing property in Examples and Comparative Examples.

DESCRIPTION OF EMBODIMENTS

The present invention relates to: a material for forming an organic film effective as an organic underlayer film (organic film) material used in a multilayer resist process or the like employed for fine processing in a manufacturing process of a semiconductor device, etc. and as a planarizing material for manufacturing a semiconductor device, and the like; a patterning process using the material for forming an organic film, the process being suitable for exposure to deep ultra-violet ray, KrF excimer laser beam (248 nm), ArF excimer laser beam (193 nm), $F_2$ laser beam (157 nm), $Kr_2$ laser beam (146 nm), $Ar_2$ laser beam (126 nm), soft X-ray (EUV), electron beam (EB), ion beam, X-ray, and the like; and a polymer useful as a component of the material for forming an organic film.

As described above, a material for forming an organic film by which an organic film excellent in solvent resistance, heat resistance, filling property, planarizing property, and pattern formability can be formed has been desired.

The present inventors have earnestly studied the problem, and found out that a material for forming an organic film containing a polymer having a partial structure containing an imide structure shown by the following general formula (1A) allows an organic film material capable of forming an organic film having excellent heat resistance, excellent solvent resistance, high filling property, high planarizing property, excellent pattern formability, and excellent adhesion to a substrate, and completed the present invention.

That is, the present invention is a material for forming an organic film, including: a polymer having a structure shown by the following general formula (1A) as a partial structure; and an organic solvent,

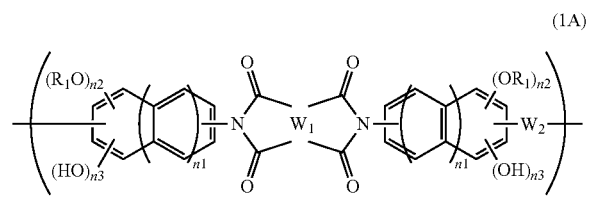

(1A)

wherein in the general formula (1A), $W_1$ represents a tetravalent organic group, $W_2$ represents a single bond or a linking group shown by the following formula (1B), $R_1$ represents a hydrogen atom or a monovalent organic group having 1 to 10 carbon atoms, n1 represents an integer of 0 or 1, and n2 and n3 satisfy $0 \leq n2 \leq 6$, $0 \leq n3 \leq 6$, and $1 \leq n2+n3 \leq 6$,

(1B)

wherein $R_2$ and $R_3$ each independently represent hydrogen or an organic group having 1 to 30 carbon atoms, and the organic group $R_2$ and the organic group $R_3$ optionally bond to each other within a molecule to form a cyclic organic group.

Hereinafter, the present invention will be described in detail. However, the present invention is not limited thereto. Note that the dotted lines in the following formulae represent bonds between a group or atomic group shown by each formula and another group or atomic group in the general formula (1A).

<Polymer for Forming Organic Film>

The inventive polymer is a polymer having a structure shown by the following general formula (1A) as a partial structure,

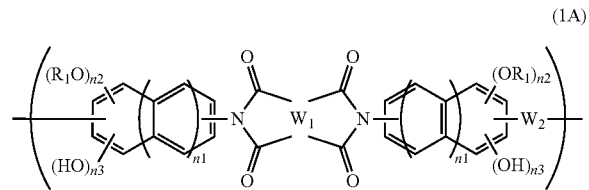

(1A)

where in the general formula (1A), $W_1$ represents a tetravalent organic group, $W_2$ represents a single bond or a linking group shown by the following formula (1B), $R_1$ represents a hydrogen atom or a monovalent organic group having 1 to 10 carbon atoms, n1 represents an integer of 0 or 1, and n2 and n3 satisfy $0 \leq n2 \leq 6$, $0 \leq n3 \leq 6$, and $1 \leq n2+n3 \leq 6$,

(1B)

where $R_2$ and $R_3$ each independently represent hydrogen or an organic group having 1 to 30 carbon atoms, and the organic group $R_2$ and the organic group $R_3$ optionally bond to each other within a molecule to form a cyclic organic group.

By employing an imide structure that is already ring-closed as in the general formula (1A), an elimination reaction of water or the like produced as a by-product that occurs when an imide precursor such as amic acid undergoes ring closure is eliminated. Thus, film shrinking is suppressed and the planarizing property of the organic film is not lost. By obtaining a stable imide structure beforehand, decomposition and the like of an imide compound precursor due to an equilibrium reaction can be suppressed, allowing superiority in storage stability as well. The substituent represented by $OR_1$ can also be selected appropriately according to use, for example, a hydroxy group for providing solubility, an alkyloxy group for providing flowability, and an alkenyl or alkynyloxy group for providing curability in an inert gas.

Furthermore, various physical properties such as etching resistance and optical characteristics can be adjusted by appropriately selecting the structure of the linking group portion represented by $W_2$. In addition to providing heat resistance, the imide structure also contributes to the enhancement of adhesion to a substrate. When adhesion is enhanced, film delamination on forming an inorganic hard mask directly on an organic film by a CVD method or an ALD method can be prevented, and an organic film excellent in process margin can be formed.

Examples of other organic film materials having imide structures include polyimides disclosed in Patent Document 5 and Patent Document 6. These polyimides are excellent in adhesion and heat resistance, but have poor solvent solubility due to the rigid structure thereof, and problems in versatility remain. Moreover, since polyimide itself does not have curability, it is necessary to add an additional component such as an acid generator as a crosslinking agent and a crosslinking catalyst. Therefore, there has been a problem that the inherent heat resistance of the polyimide is lost.

On the other hand, the inventive polymer for forming an organic film has the partial structure shown by the general formula (1A) containing an aromatic ring portion having an $OR_1$ group in addition to the imide structure, so that an appropriate solvent solubility can be exhibited, and excellent solvent resistance and heat resistance can be exhibited after curing.

Examples of the partial structure having an imide ring containing $W_1$ in the general formula (1A) include the following, and these aromatic rings may have a substituent thereon. Examples of the substituent include an alkyl group having 1 to 10 carbon atoms, an alkynyl group and an alkenyl group having 3 to 10 carbon atoms, an aryl group having 6 to 10 carbon atoms, a nitro group, a halogen group, a nitrile group, an alkoxycarbonyl group having 1 to 10 carbon atoms, and an alkanoyloxy group having 1 to 10 carbon atoms. In particular, those having a naphthalene ring where $n1=1$ are preferable from the viewpoint of heat resistance.
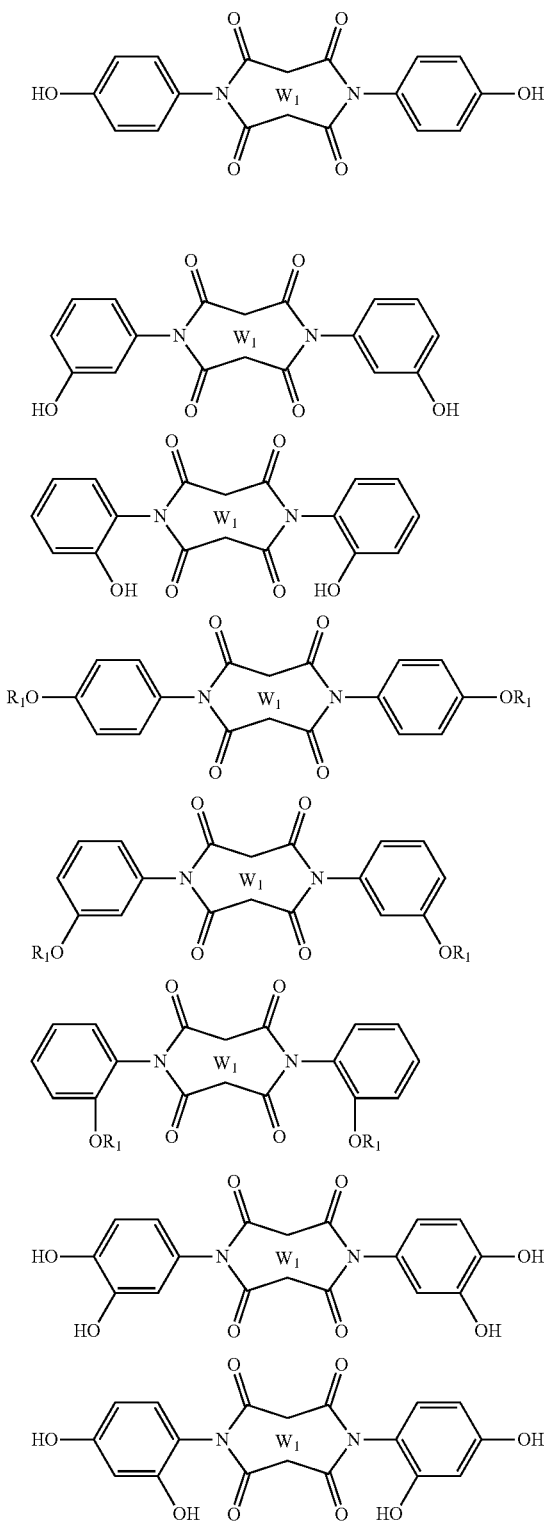
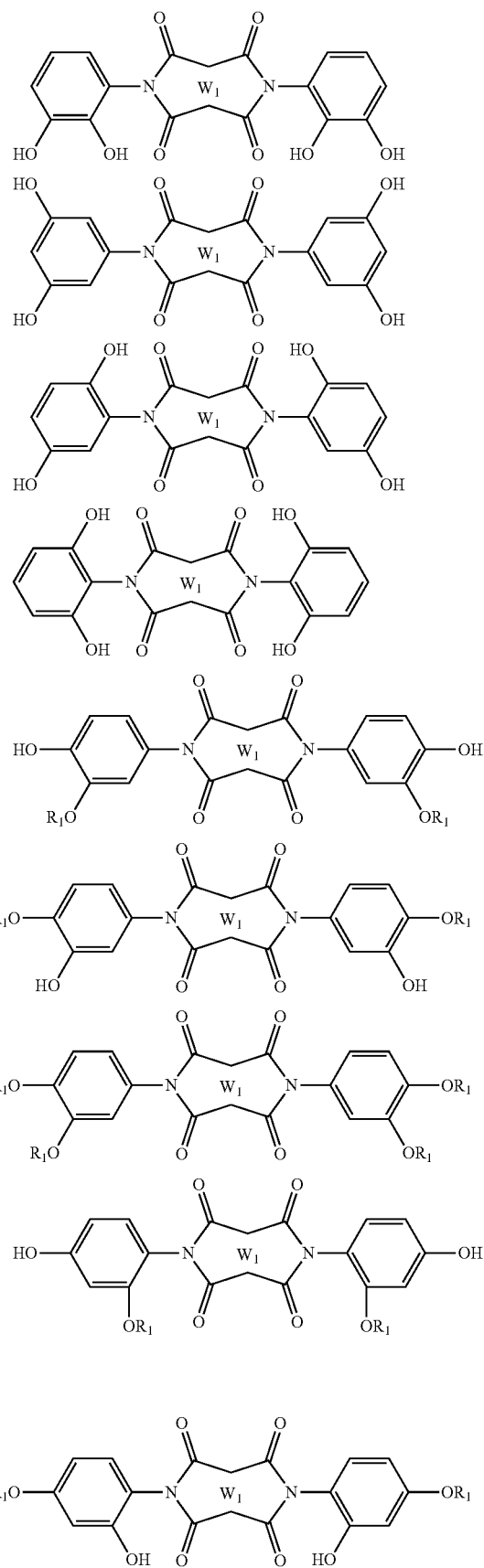

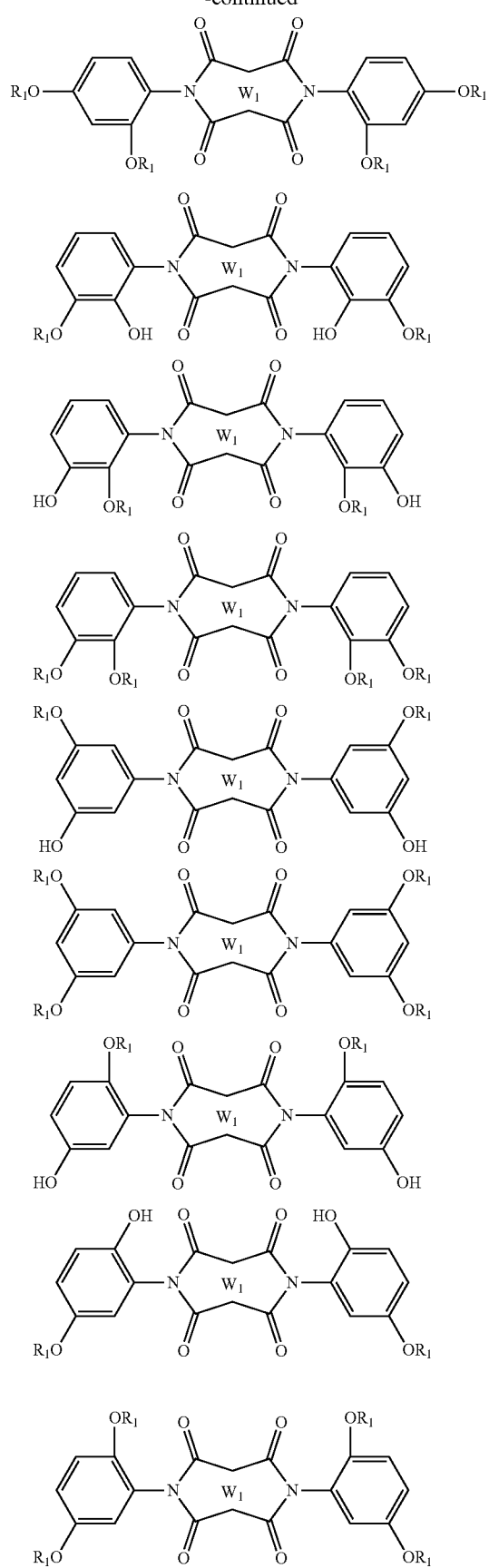
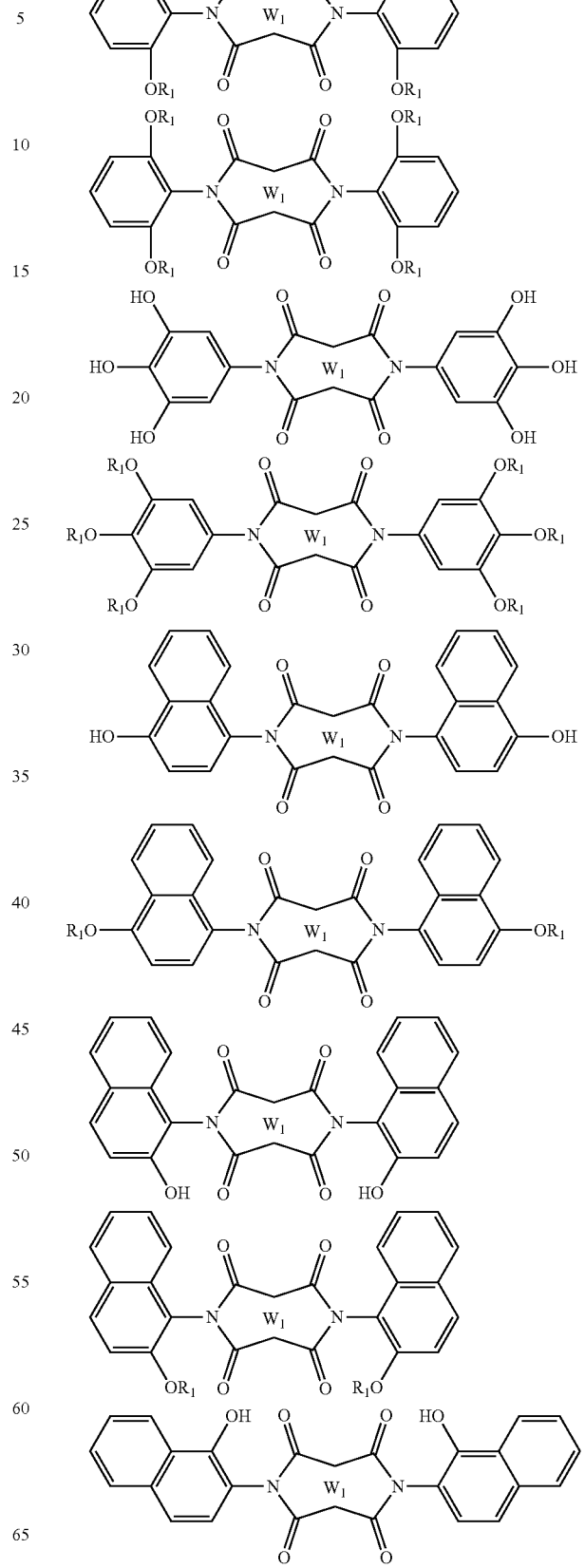

-continued
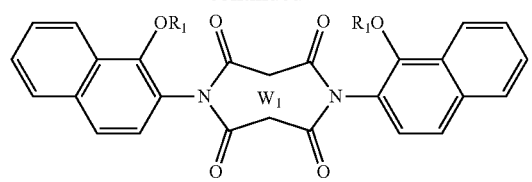
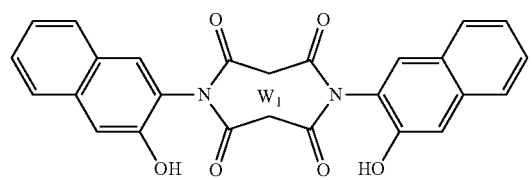
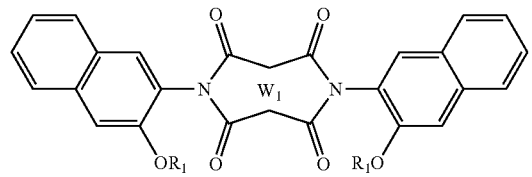
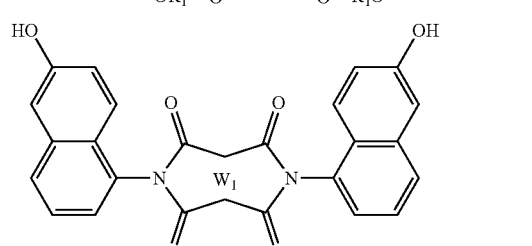
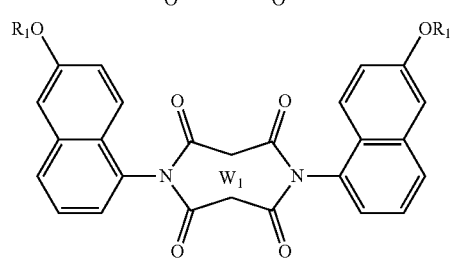
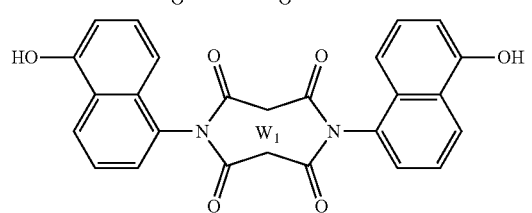
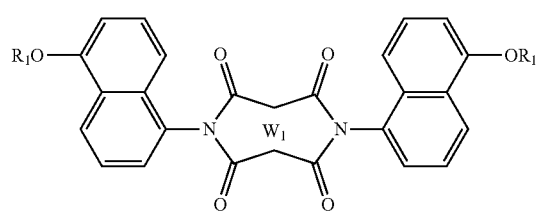
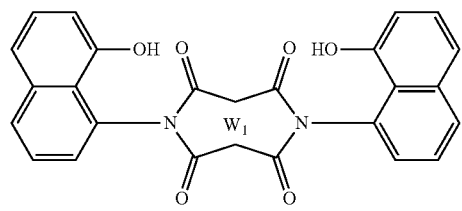
-continued
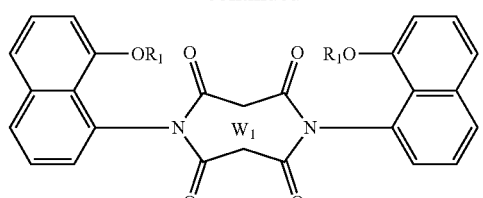
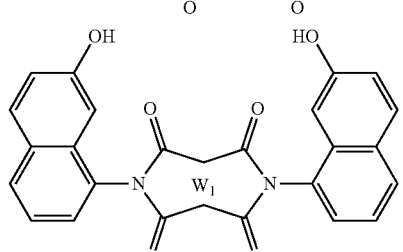
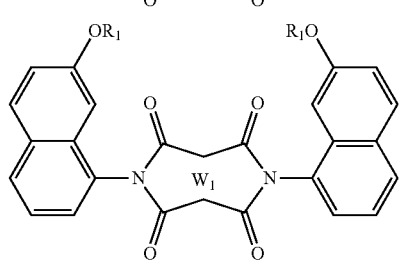
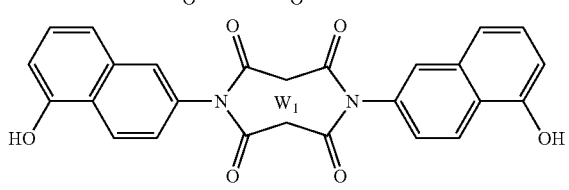
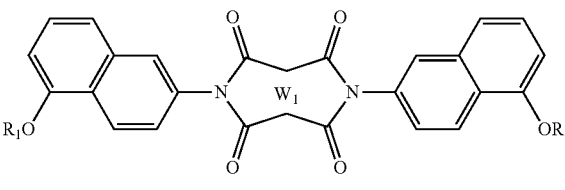
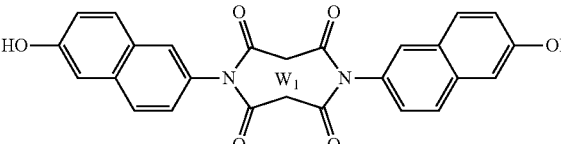
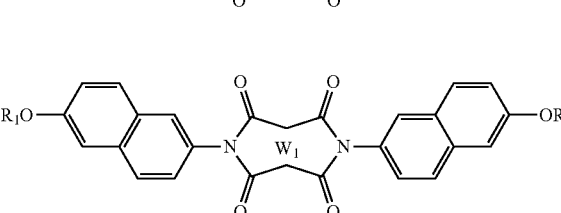
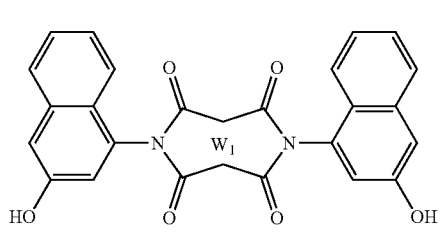

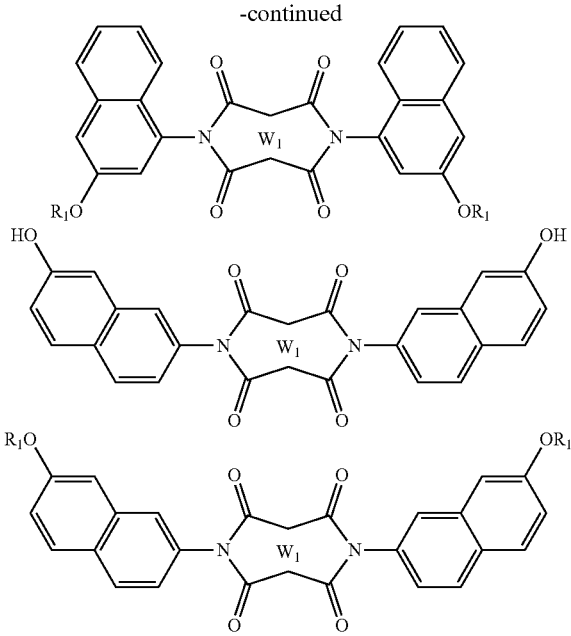

Examples of the substituents represented by $OR_1$ on the aromatic rings include the following, and n4 in the following formula represents an integer of 1 to 9. When the general formula $R_1$ has an aryl group, substituents such as a hydroxy group, a trifluoromethyl group, an alkyl group having 1 to 10 carbon atoms, an alkynyl group and an alkenyl group having 3 to 10 carbon atoms, an alkyloxy group having 1 to 10 carbon atoms, an alkynyloxy group and an alkenyloxy group having 3 to 10 carbon atoms, an aryl group having 6 to 10 carbon atoms, a nitro group, a halogen group, a nitrile group, an alkoxycarbonyl group having 1 to 10 carbon atoms, and an alkanoyloxy group having 1 to 10 carbon atoms are possible. In particular, a propargyloxy group is preferable from the viewpoint of curability.

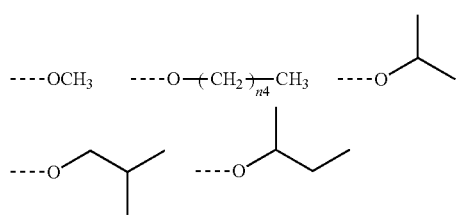

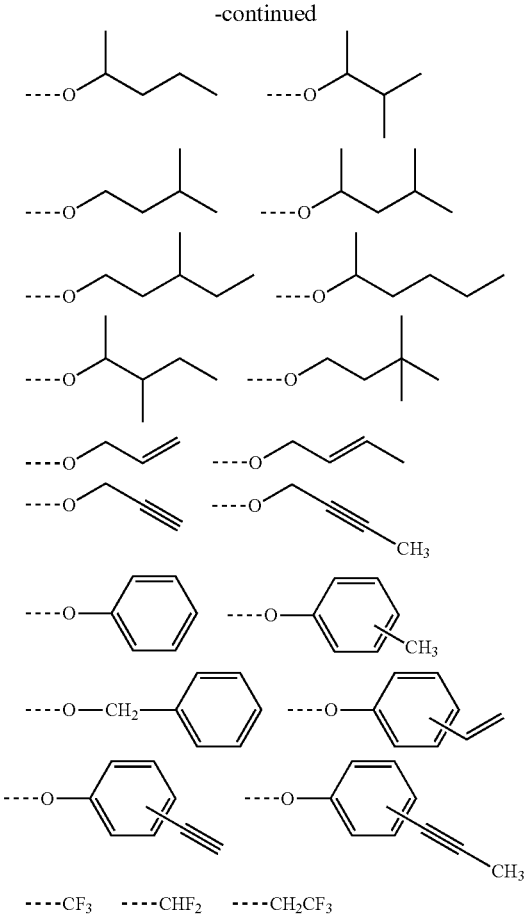

Examples of the organic group $W_1$ in the general formula (1A) include the following, and these aromatic rings may have a substituent thereon. Examples of the substituent include a hydroxy group, a trifluoromethyl group, an alkyl group having 1 to 10 carbon atoms, an alkynyl group and an alkenyl group having 3 to 10 carbon atoms, an alkyloxy group having 1 to 10 carbon atoms, an alkynyloxy group and an alkenyloxy group having 3 to 10 carbon atoms, an aryl group having 6 to 10 carbon atoms, a nitro group, a halogen group, a nitrile group, an alkoxycarbonyl group having 1 to 10 carbon atoms, and an alkanoyloxy group having 1 to 10 carbon atoms.

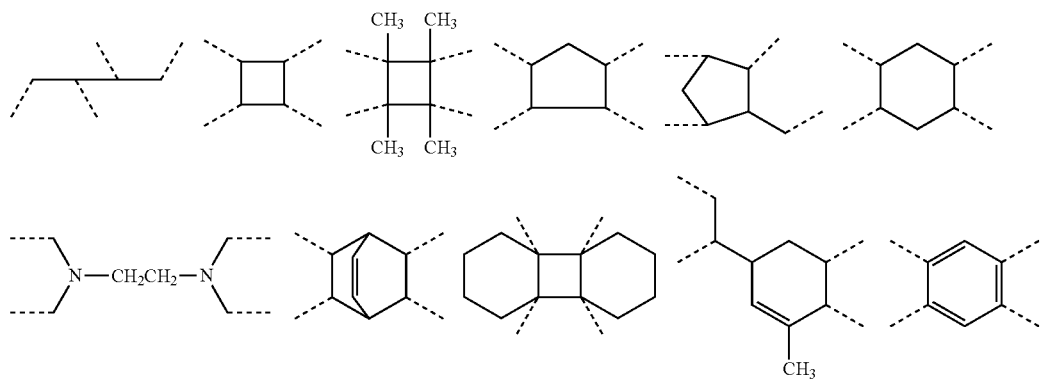

-continued
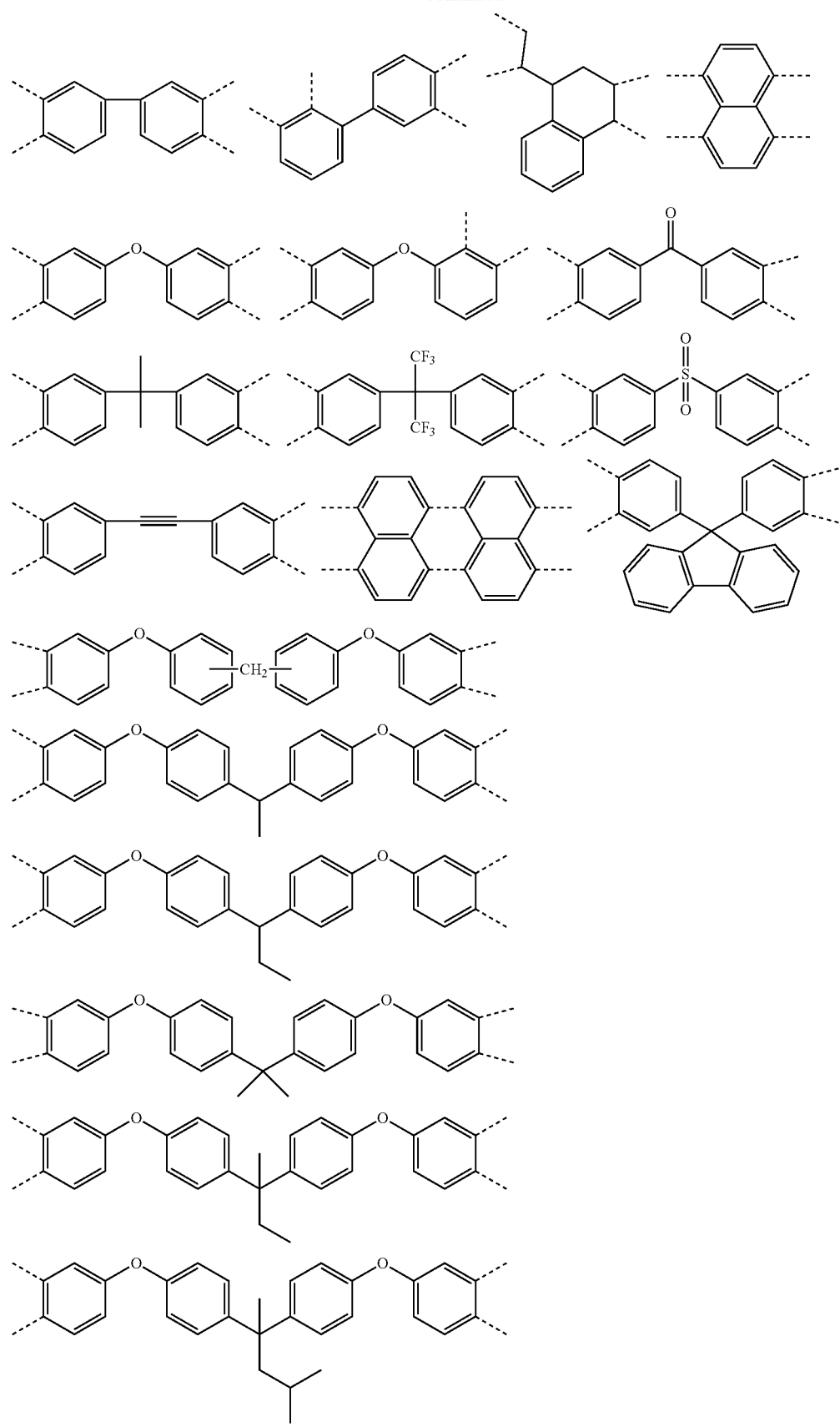

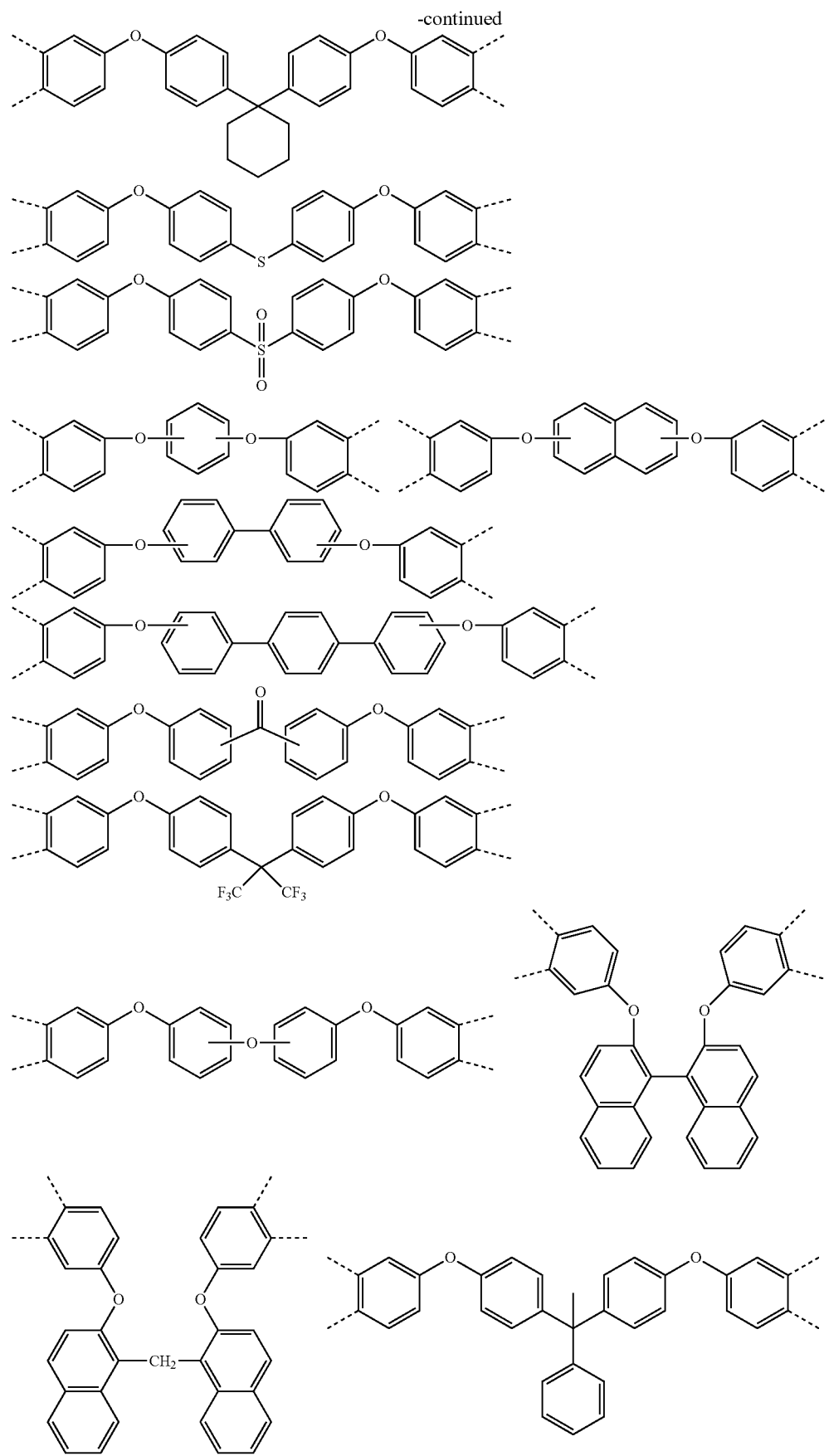

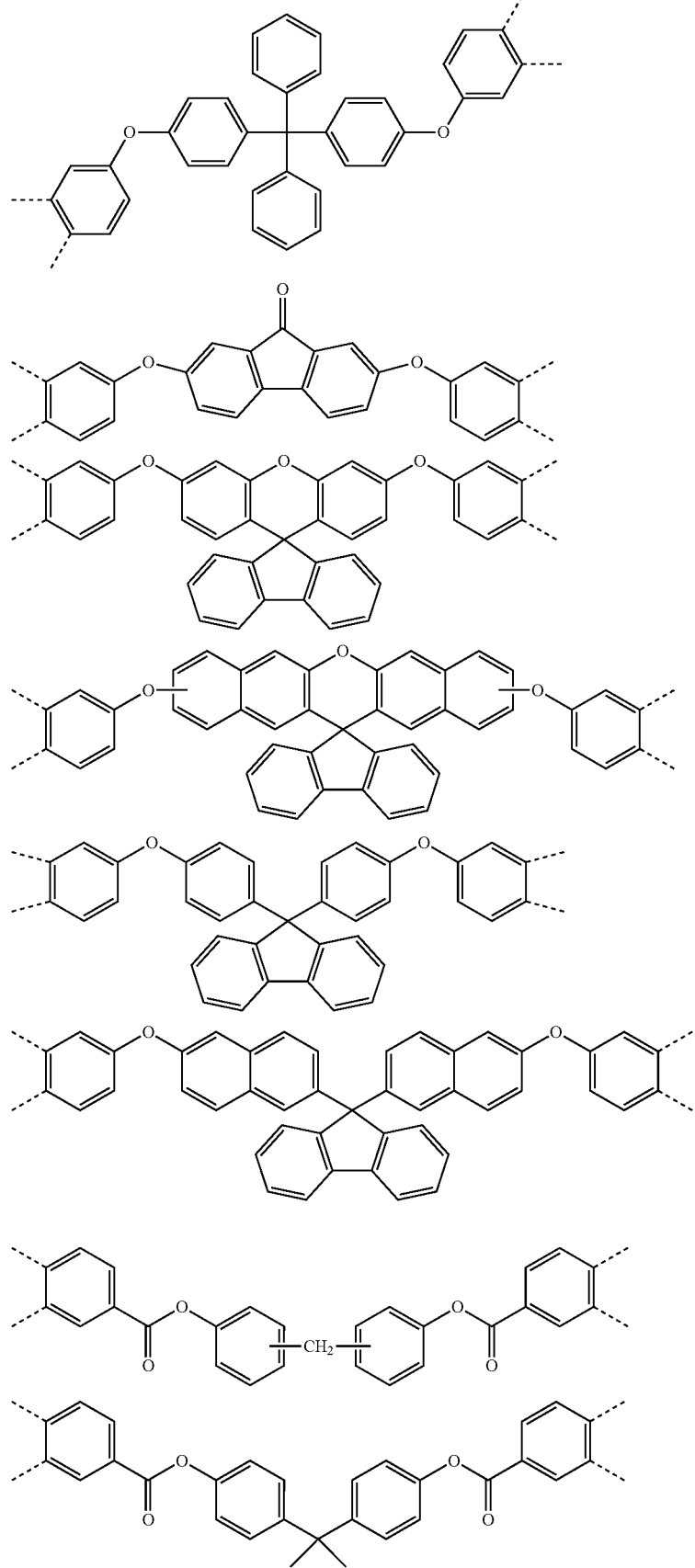

-continued
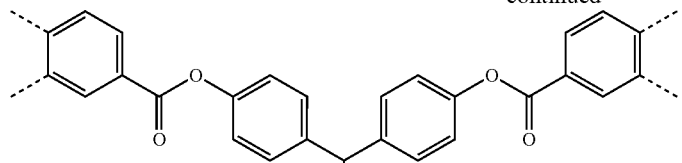
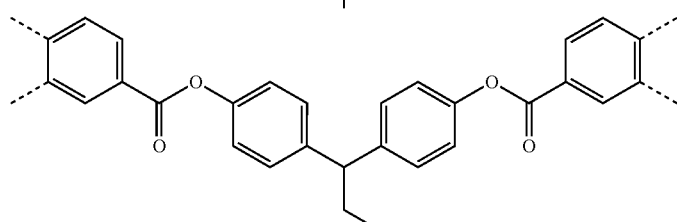
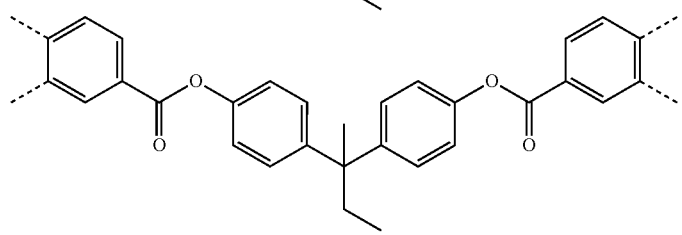
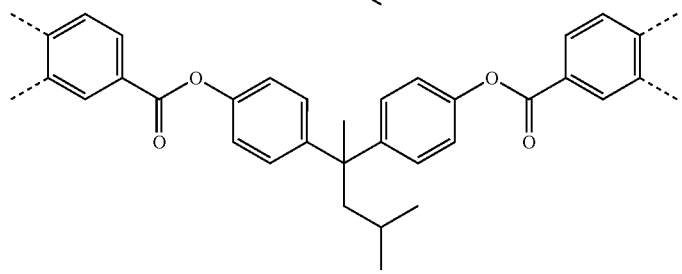
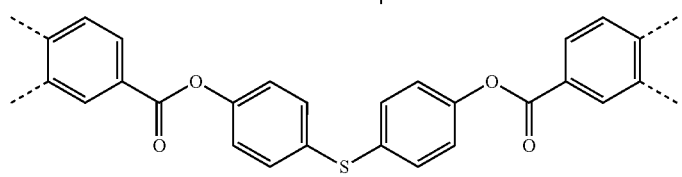
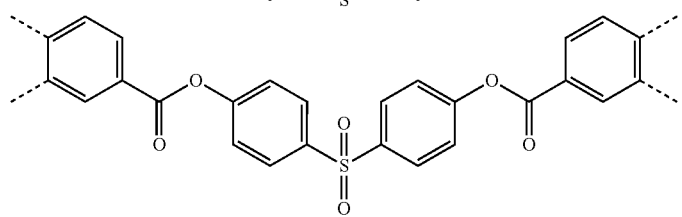
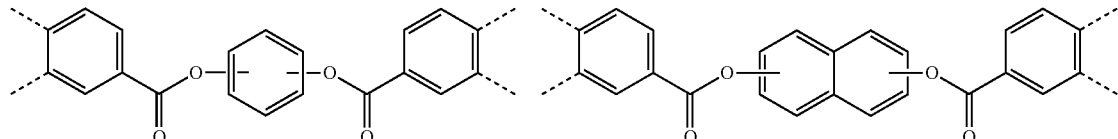
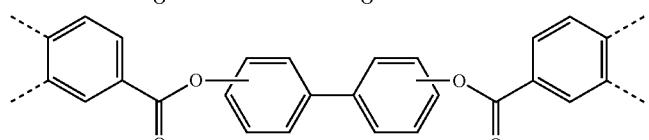
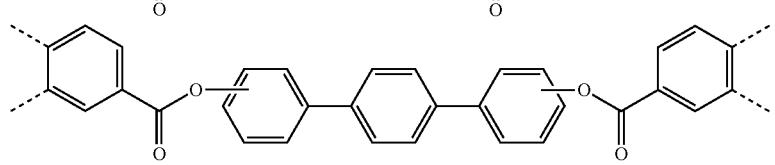

-continued
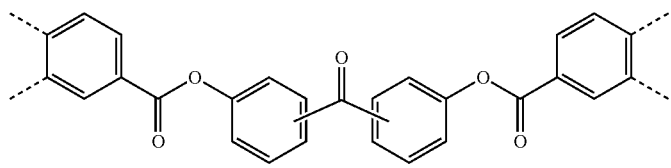
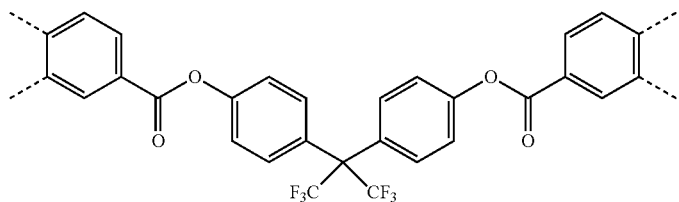
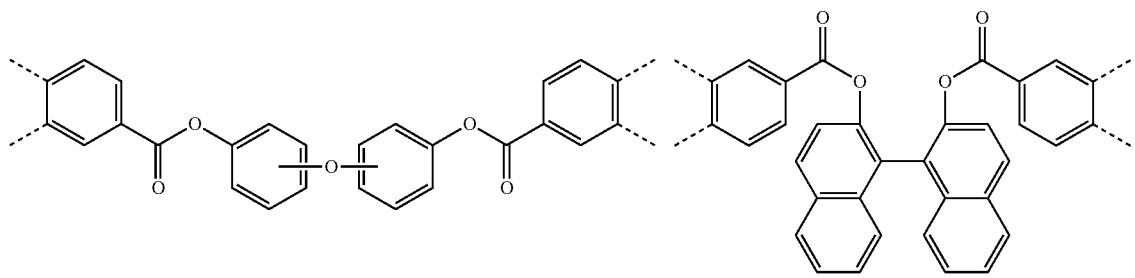
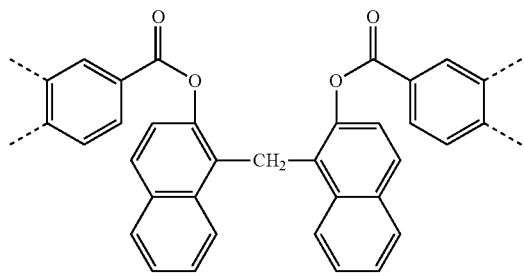
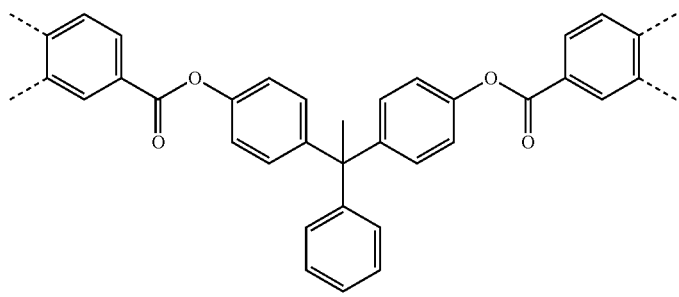
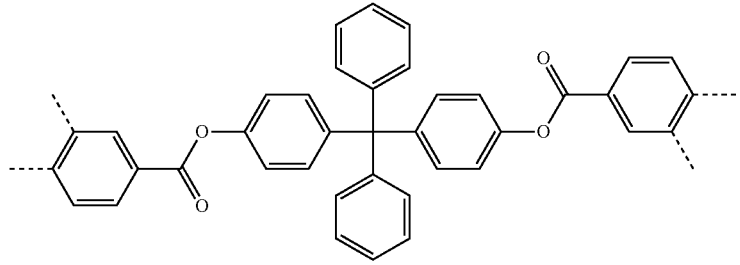
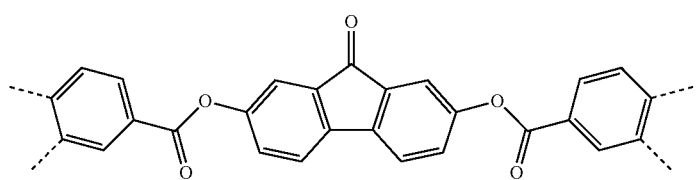

-continued
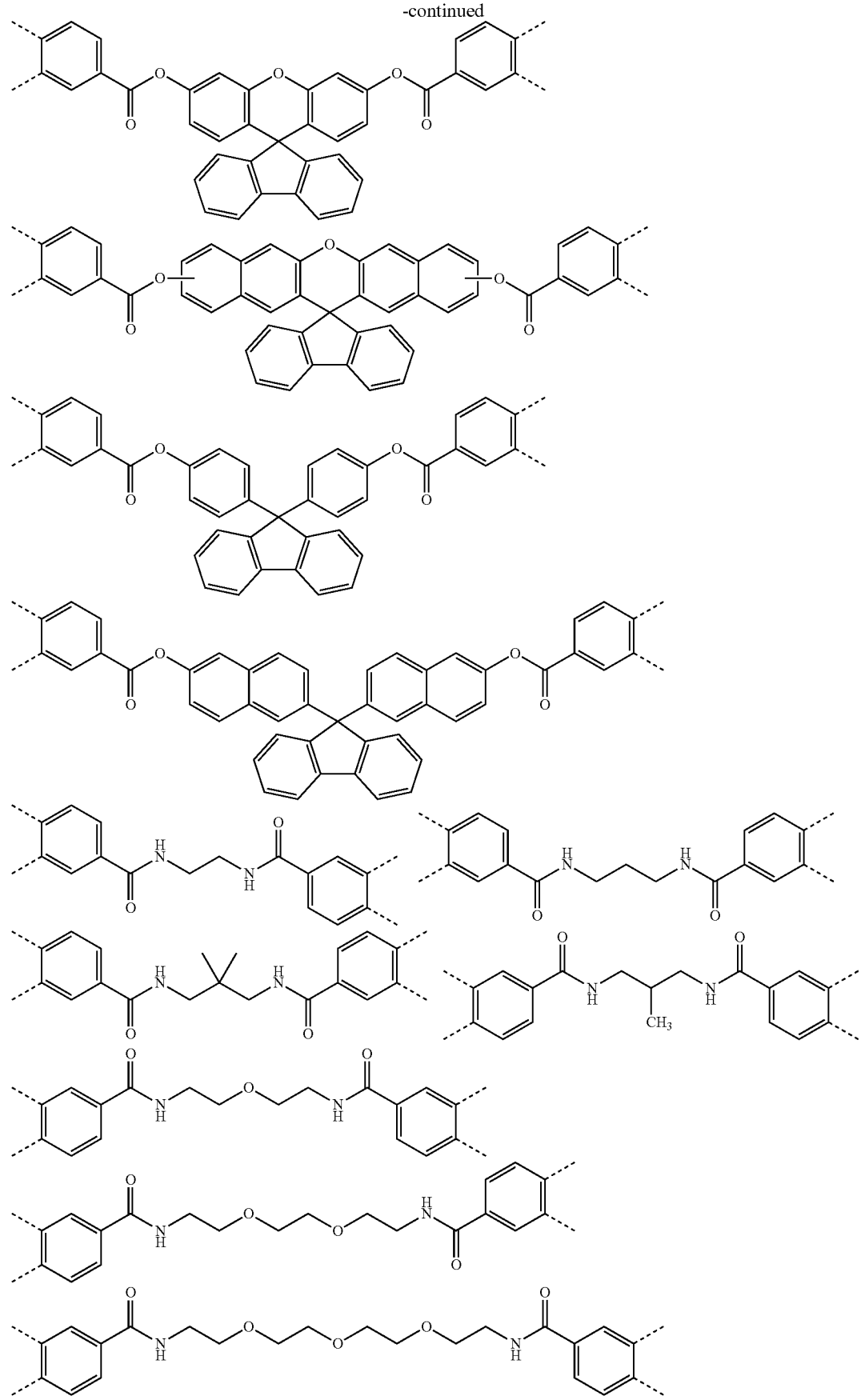

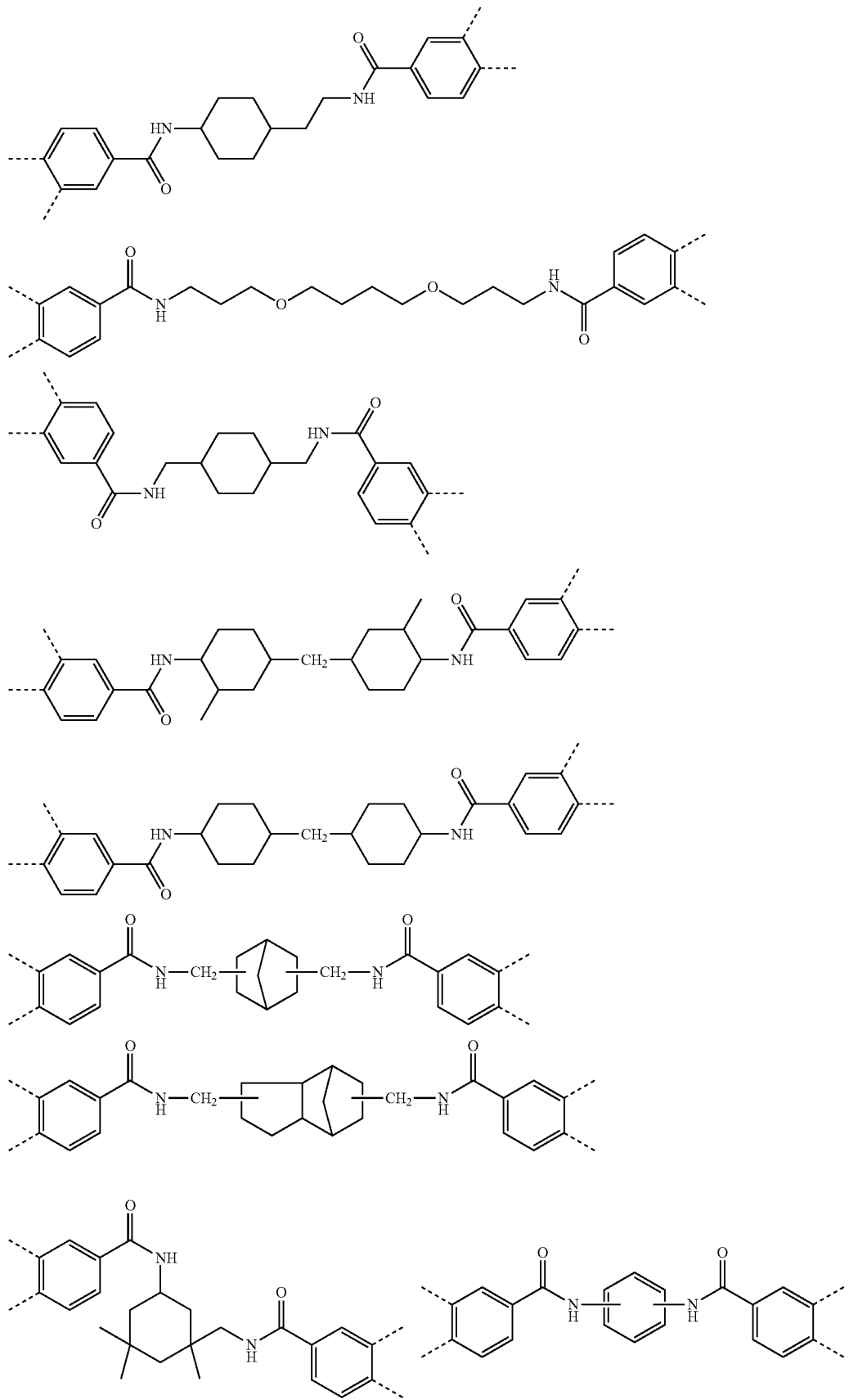

-continued
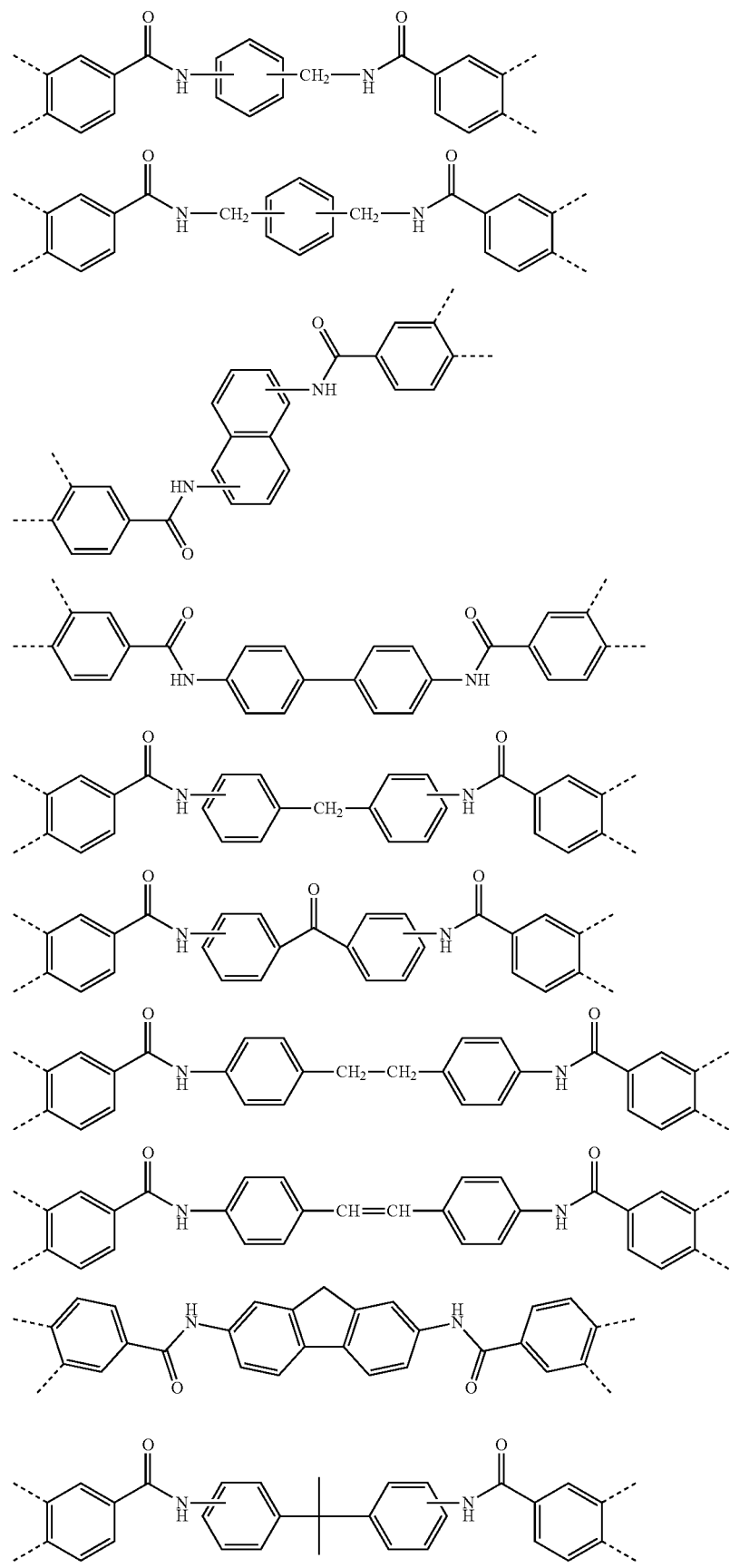

-continued
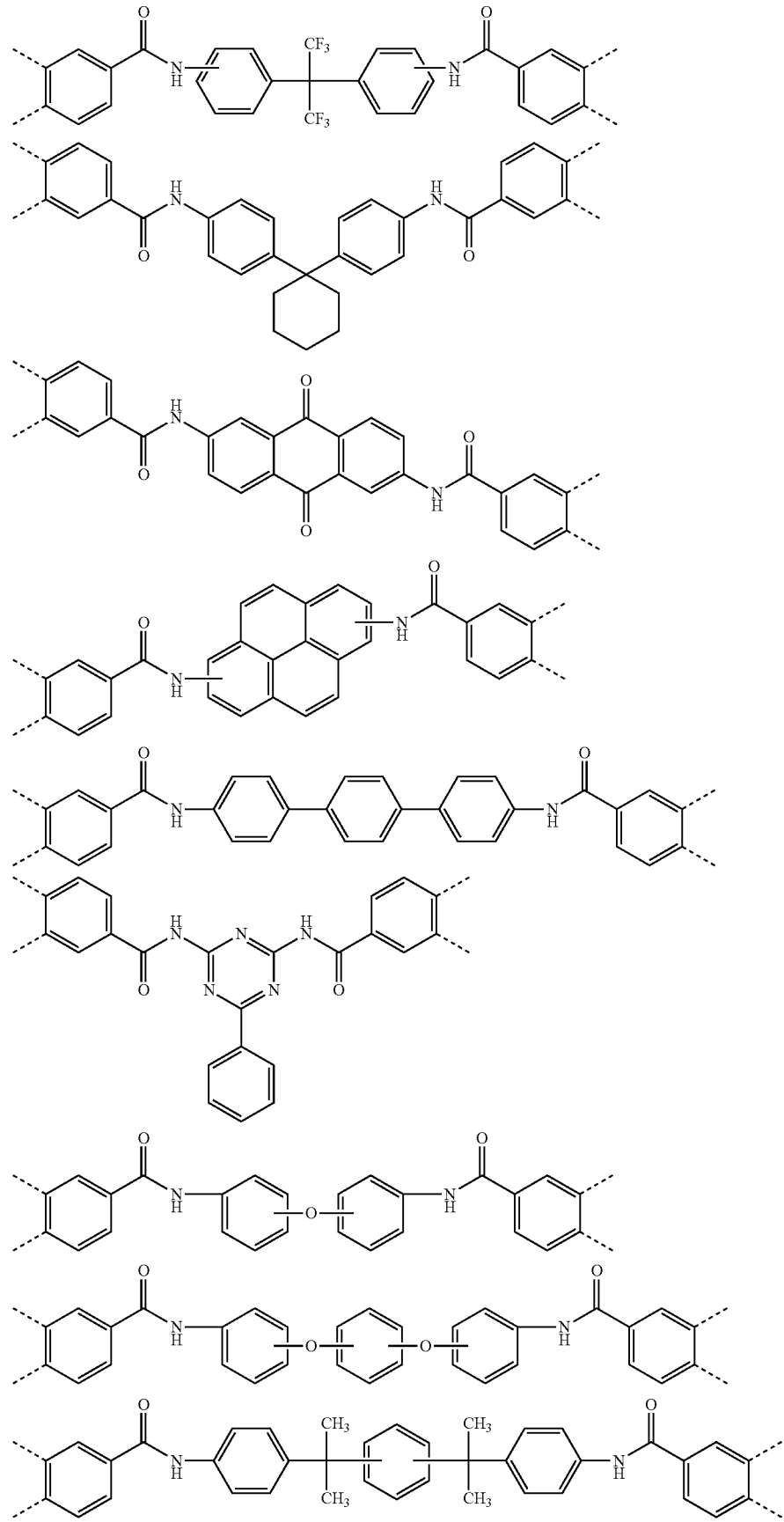

-continued
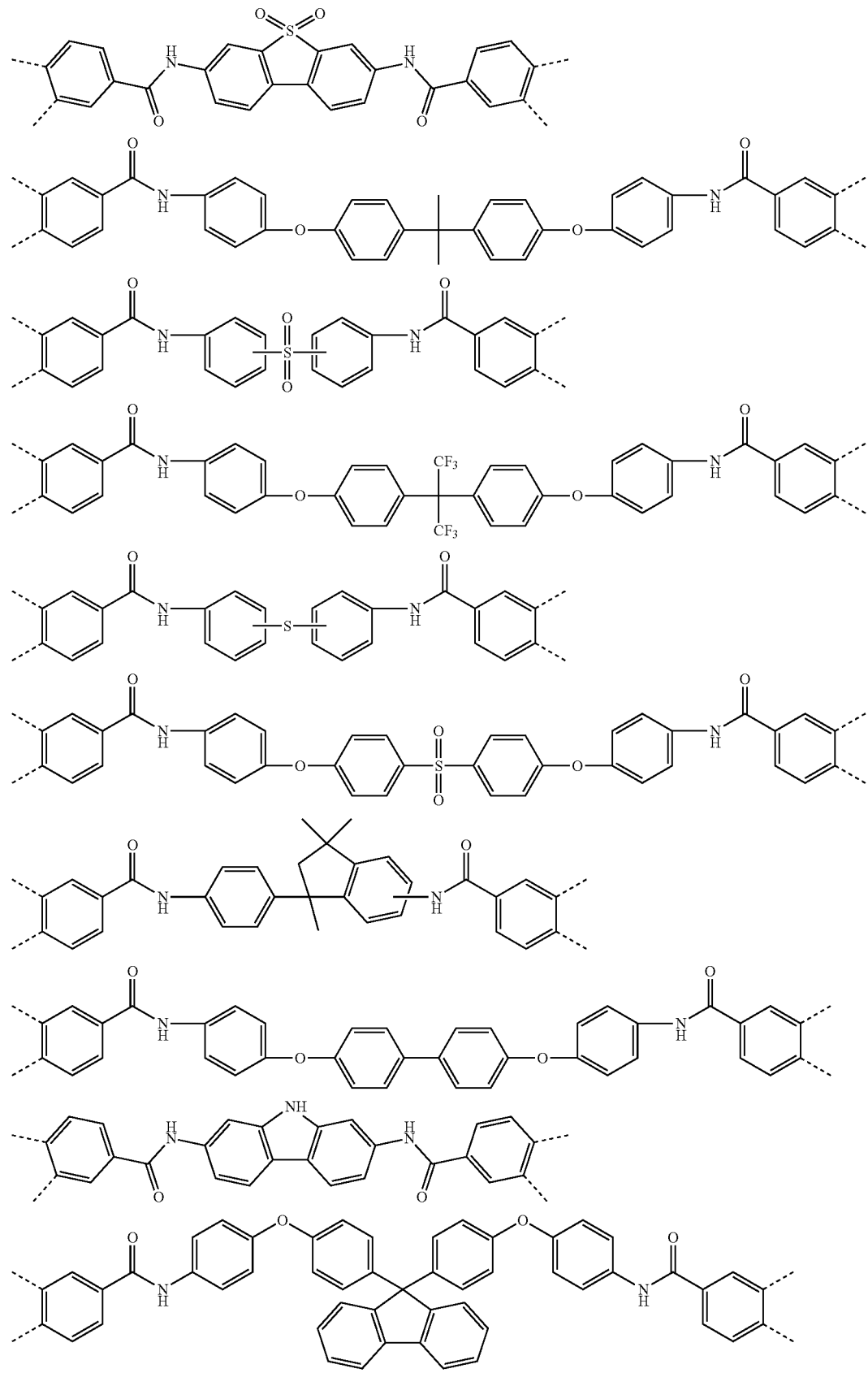

Furthermore, in the inventive polymer for forming an organic film, the organic group $W_1$ in the general formula (1A) is preferably shown by the following formula (1C),

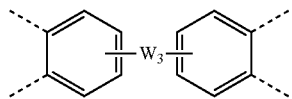

(1C)

where $W_3$ in the formula (1C) represents a single bond or a divalent organic group, the benzene rings in the formula (1C) optionally have a substituent thereon, and a substituent on the benzene ring and an organic group in $W_3$ optionally bond to each other to form a cyclic organic group.

Specific examples of the $W_3$ include a single bond and the following. These aromatic rings may have a substituent thereon, and examples include a hydroxy group, a trifluoromethyl group, an alkyl group having 1 to 10 carbon atoms, an alkynyl group and an alkenyl group having 3 to 10 carbon atoms, an alkyloxy group having 1 to 10 carbon atoms, an alkynyloxy group and an alkenyloxy group having 3 to 10 carbon atoms, an aryl group having 6 to 10 carbon atoms, a nitro group, a halogen group, a nitrile group, an alkoxycarbonyl group having 1 to 10 carbon atoms, and an alkanoyloxy group having 1 to 10 carbon atoms. The broken lines in the following figures show attachment points to aromatic rings.

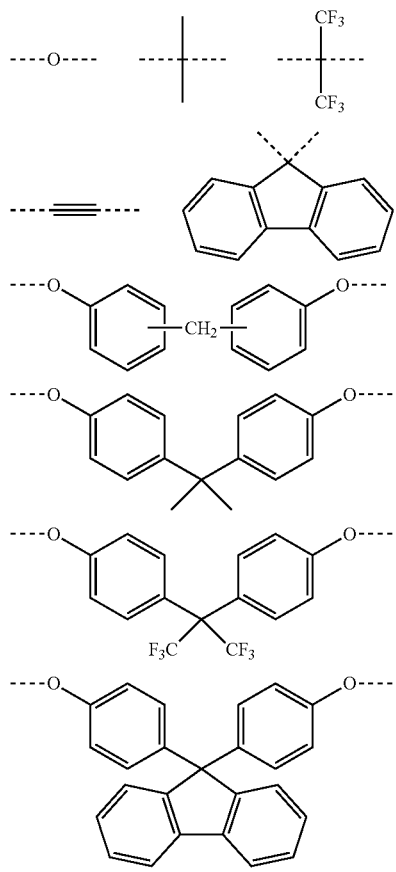

-continued

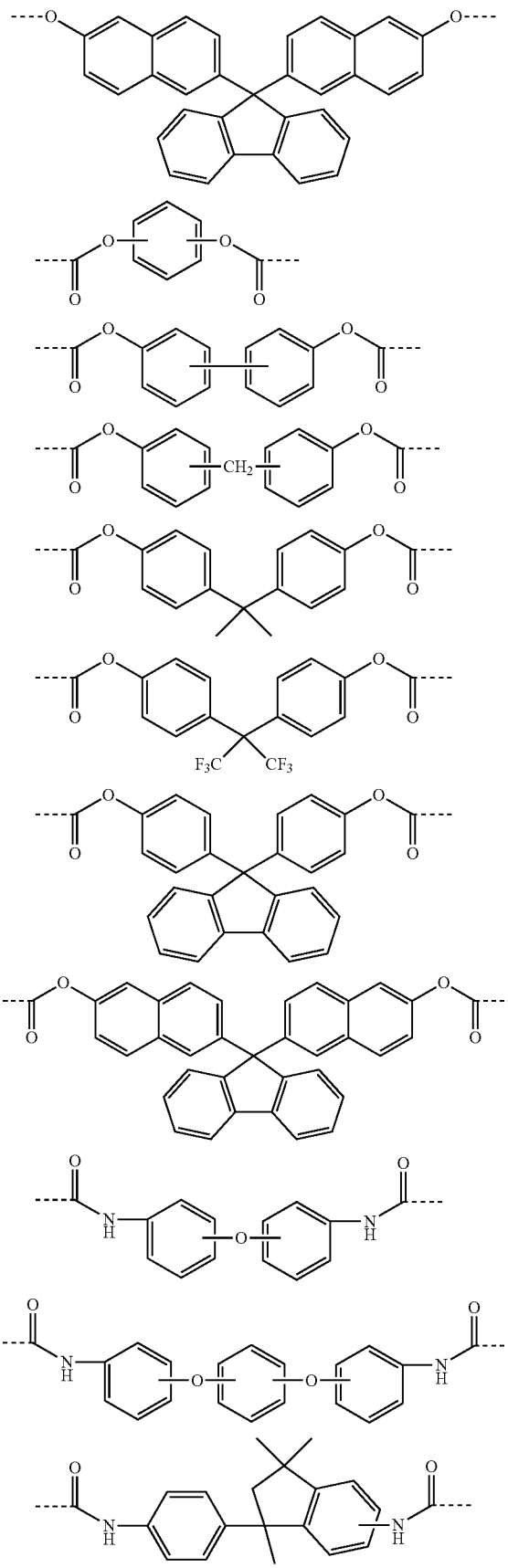

-continued

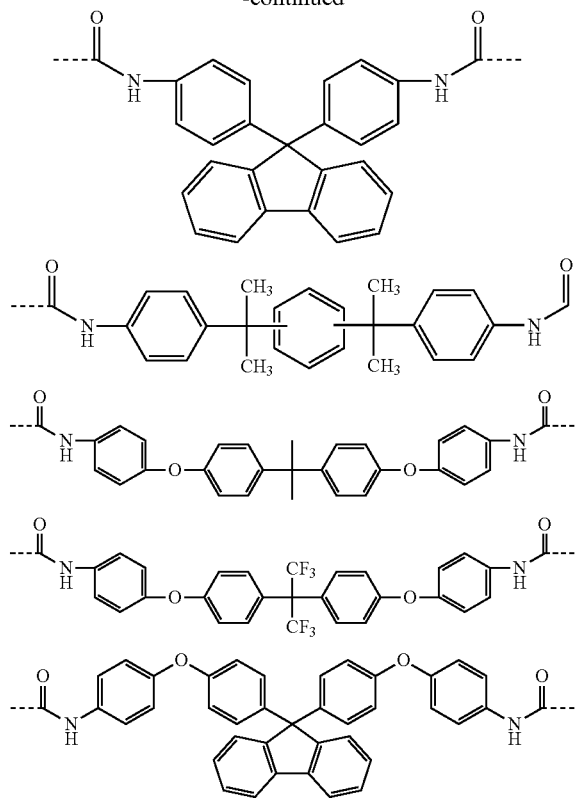

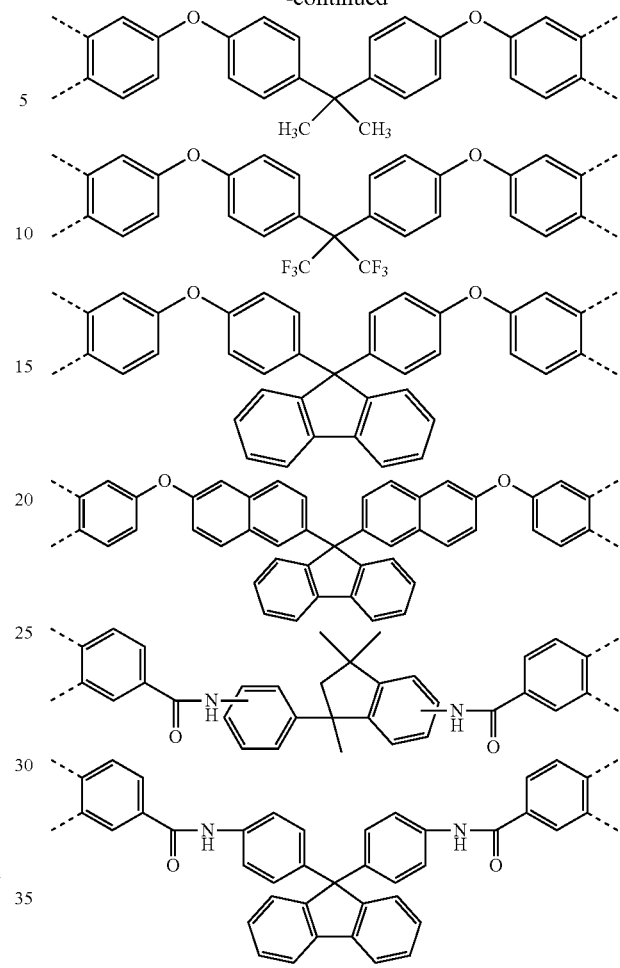

(An aromatic ring in the formula optionally has a substituent thereon.)

It is preferable to have the partial structure described above in the main chain from the viewpoint of exhibiting excellent heat resistance.

Alternatively, in the inventive polymer for forming an organic film, the organic group $W_1$ in the general formula (1A) is preferably shown by any of the following formulae (1D). In particular, examples having any one or more of a hexafluoroisopropylidene group, an ether bond, a fluorene structure, and an indane structure are preferable from viewpoints of providing solubility in solvents and flowability.

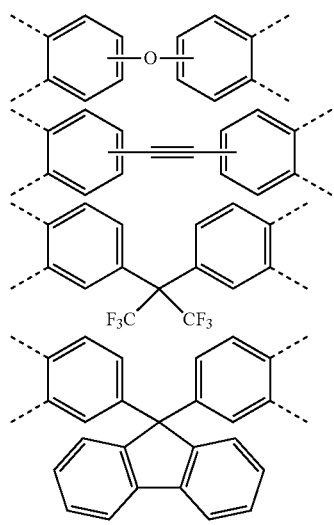
(1D)

It is preferable to have such a partial structure from the viewpoints of heat resistance, solubility in solvents, and enhancing thermal flowability. In particular, a structure having a hexafluoroisopropylidene group as a linking group of the main chain, a structure having an ether bond as a linking group of the main chain, and a structure having a fluorene structure as a linking group of the main chain are particularly preferable. An ether bond functions as a flexible linking group, and it becomes possible to provide thermal flowability and solubility in solvents. Similarly, the hexafluoroisopropylidene group and the fluorene structure allow a substituent with a large steric hindrance in the main chain, and agglomeration among molecules induced by an imide group can be suppressed. Therefore, a similar effect to the ether bond can be obtained. Thereby, filling property and planarizing property can be enhanced without losing heat resistance.

Furthermore, in the inventive polymer for forming an organic film, examples of $W_2$ shown by the general formula (1) include a single bond and the following.

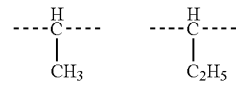

-continued
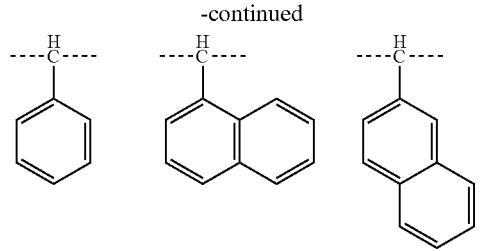
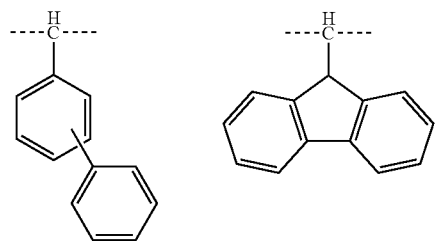
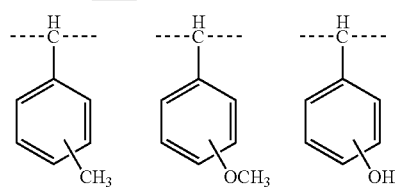
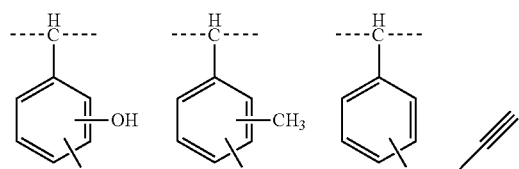
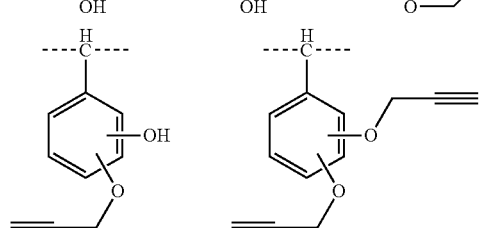
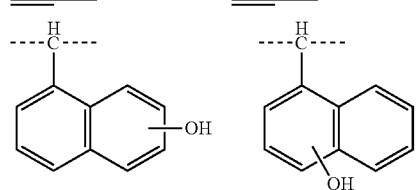
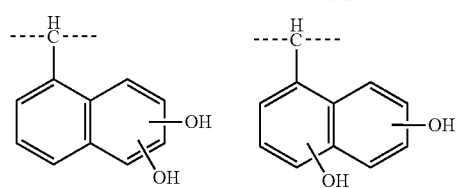
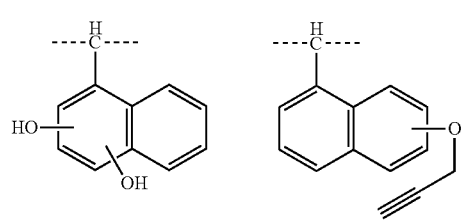
-continued
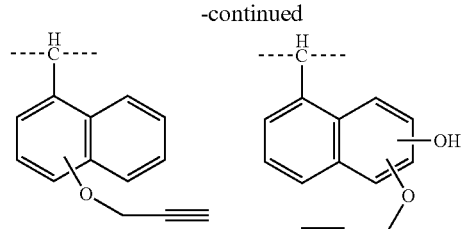
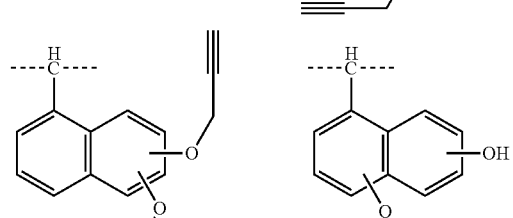
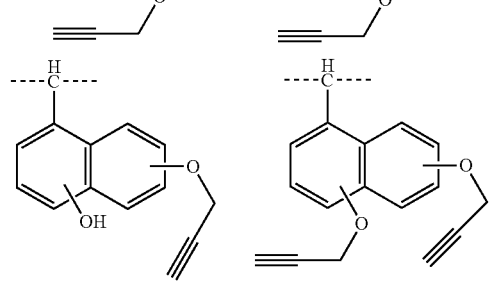
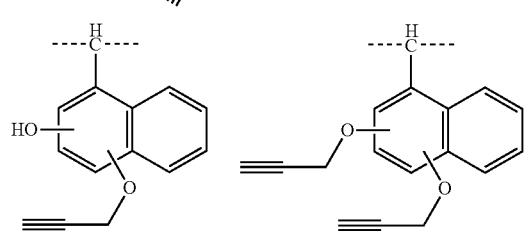
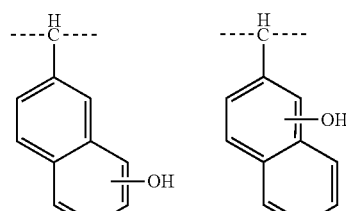
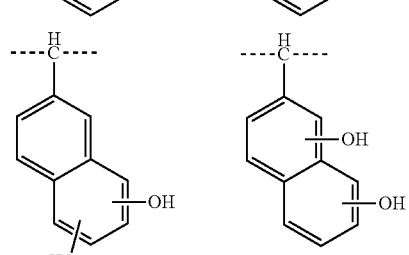
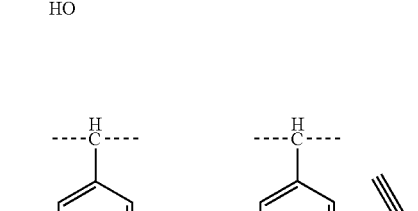
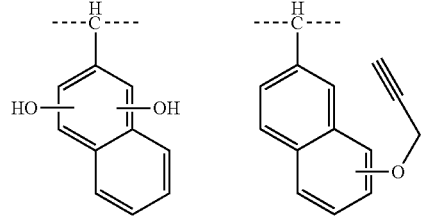

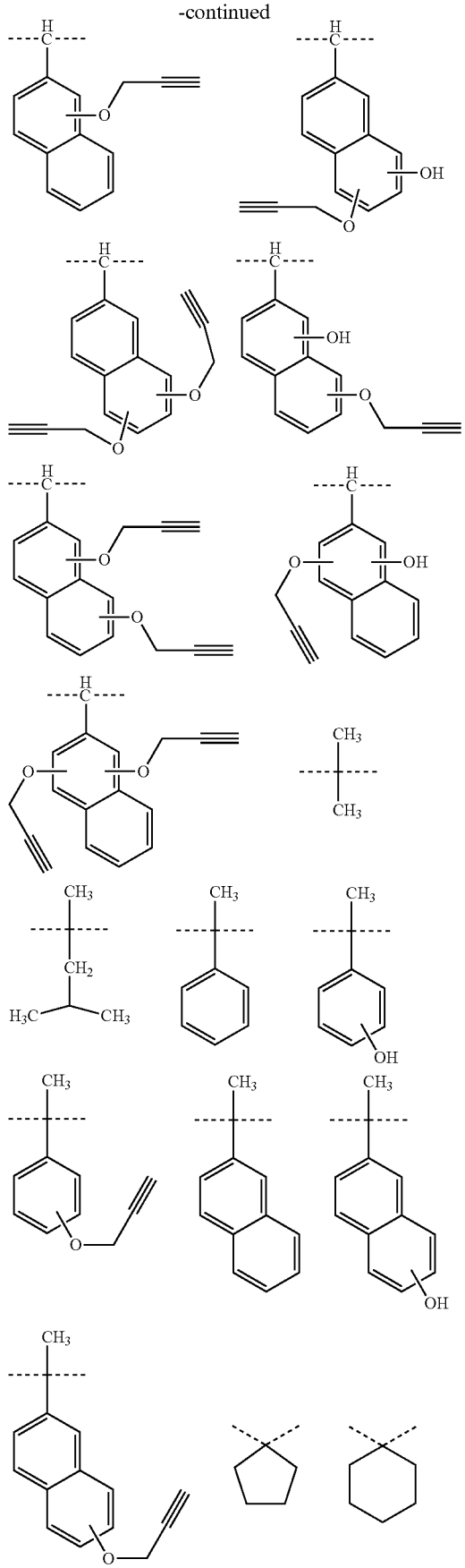
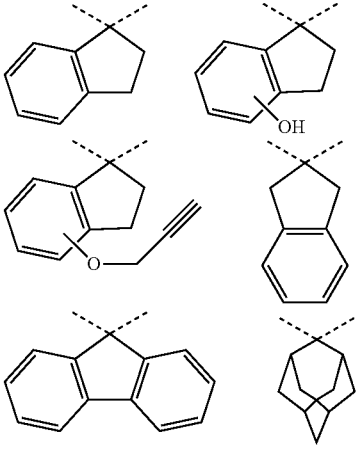

Furthermore, in the inventive polymer for forming an organic film, the linking group $W_2$ in the general formula (1A) is particularly preferably shown by the following formula (1E) from viewpoints of curability, availability of raw materials and ease of polymer manufacturing.

$$W_2\!=\!-CH_2-\tag{1E}$$

Furthermore, the above-described polymer preferably has an Mw (weight-average molecular weight) of 1000 to 10000, and the Mw is further preferably 1000 to 5000. Note that weight-average molecular weight (Mw) can be determined by gel permeation chromatography (GPC) using tetrahydrofuran as an eluent in terms of polystyrene.

When the molecular weight is within such a range, solubility in organic solvents can be ensured, and sublimation products that are generated when baking can be suppressed. In addition, the thermal flowability of the polymer for forming an organic film becomes favorable. Therefore, when blended in a composition, the polymer can not only favorably fill a fine structure formed on a substrate but also form an organic film having the entire substrate planarized.

The polymer is further preferably a novolak resin having the partial structure shown by the general formula (1A).

The polymer, being a novolak resin, can be shown by the general formula (1A), where $W_2$ is a linking group shown by the general formula (1B).

An organic film more excellent in solvent resistance can be formed by a material for forming an organic film containing such a polymer.

[Method for Manufacturing Polymer]

As a means for obtaining the polymer used in the inventive material for forming an organic film, a polycondensation reaction between an imide compound shown below, being a partial structure of the general formula (1A), and an aldehyde compound or a ketone compound is possible, for example, except when $W_2$ represents a single bond. $R_1$, $R_2$, $R_3$, n1, n2, n3, and $W_1$ in the following formulae have the same meanings as defined above. (The following shows polycondensation with aldehyde when one or both of $R_2$ and $R_3$ are hydrogen atoms, and in other cases, polycondensation with ketone.)

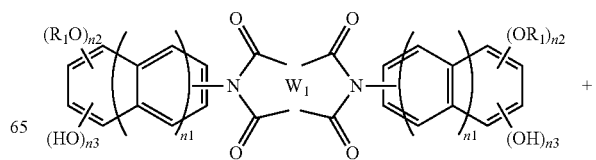

-continued

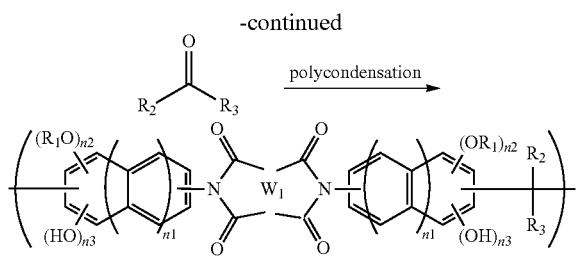

The imide compound used in the above-described polycondensation can be obtained by obtaining an amic acid compound, being an intermediate, through the reaction of an amine compound and a tetracarboxylic anhydride shown below (STEP 1), followed by thermal or chemical imidization (STEP 2). The amine compound and the tetracarboxylic anhydride may each be used alone or as a mixture of two or more thereof. These can be appropriately selected and combined according to required properties. $W_1$, $W_2$, and $R_1$ in the following formulae have the same meanings as defined above.

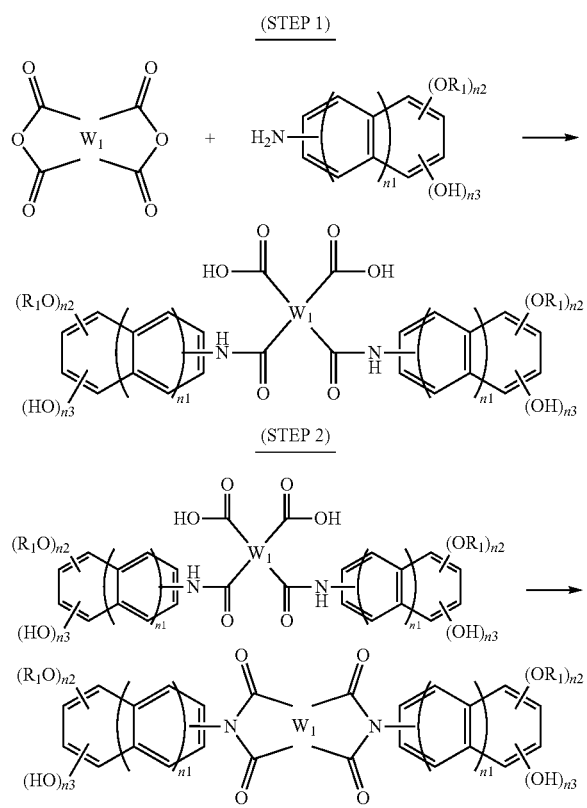

Synthesis of the amic acid, being an intermediate, shown by STEP 1 can generally be performed in an organic solvent at room temperature or under cooling or heating as necessary. Examples of the solvent used include alcohols such as methanol, ethanol, isopropyl alcohol, butanol, ethylene glycol, propylene glycol, diethylene glycol, glycerol, ethylene glycol monomethyl ether, propylene glycol monomethyl ether, and propylene glycol monoethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, isobutyl methyl ketone, and cyclohexanone; esters such as methyl acetate, ethyl acetate, n-butyl acetate, propylene glycol methyl ether acetate, and γ-butyrolactone; non-protic polar solvents such as N-methyl-2-pyrrolidone, N,N-dimethylacetamide, dimethylsulfoxide, N,N-dimethylformamide, and hexamethylphosphoric triamide; and the like. These can be used alone or in mixture of two or more thereof.

For these syntheses, a base catalyst can be used as necessary, and examples of the base catalyst include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic bases such as triethyl amine, diisopropyl ethyl amine, N,N-dimethylaniline, pyridine, and 4-dimethylaminopyridine; and the like. One of these can be used alone or in combination of two or more thereof.

The reaction method includes: a method where the amine compound and the tetracarboxylic anhydride are charged into the solvent at once; a method of charging a dispersed or dissolved amine compound and tetracarboxylic anhydride separately or mixed by adding dropwise; a method where either the amine compound or the tetracarboxylic anhydride is dispersed or dissolved in the solvent, then the other dispersed or dissolved in the solvent is added dropwise to charge; and the like. Furthermore, when multiple amine compounds and tetracarboxylic anhydrides are each charged, they can be mixed for reaction beforehand, or they can be made to react individually in succession. When a catalyst is used, methods include: a method where the catalyst is charged at once together with the amine compound or the tetracarboxylic anhydride; a method where the catalyst is dispersed or dissolved beforehand, then dropwise addition is performed; and the like. The obtained reaction solution of the amic acid compound, being an intermediate, may proceed successively to the imidization step of STEP 2, but, in order to remove unreacted raw materials, the catalyst, and so on present in the system as reaction intermediates, the obtained reaction solution can also be diluted with an organic solvent, and then subjected to liquid-liquid separation and washing, or be subjected to crystallization using a poor solvent to collect a powder.

In the imidization step shown by STEP 2, synthesis can be performed by thermal or chemical imidization. These methods can be suitably selected according to the thermal stability of the substituent in the desired imide compound and the reactivity of the introduced substituent and the reagent used in the chemical imidization.

When a thermal imidization is performed, a solvent capable of forming an azeotrope with water is added to a reaction solution of the amic acid obtained in STEP 1, or, if collected as a powder, the powder dissolved in soluble solvent beforehand, and heated to 100° C. to 250° C., and a dehydrative cyclization reaction takes place while generated water is being removed to perform imidization.

As the solvent in this event, esters such as γ-butyrolactone; polar solvents such as N-methyl-2-pyrrolidone, N,N-dimethylacetamide, dimethylsulfoxide, and N,N-dimethylformamide; non-polar solvents such as benzene, toluene, xylene, and mesitylene; and the like can be used. It is preferable to heat these solvents individually or mixed, and perform dehydration while distilling the water generated by ring-closure out of the system.

When a chemical imidization is performed, a base catalyst and an acid anhydride and the like as a dehydrating agent are added to a reaction solution of the imide precursor obtained in STEP 1, or if collected as a powder, the powder dissolved in soluble solvent beforehand, and heated to perform imidization.

Base catalysts used in the chemical imidization include pyridine, triethyl amine, trimethylamine, tributylamine, trioctylamine, and the like. Among these, pyridine is preferable, having suitable basicity for promoting the reaction. Dehydrating agents include acetic anhydride, trimellitic anhydride, pyromellitic anhydride, trifluoroacetic anhydride, polyphosphoric acid, phosphorus pentoxide, phosphorus pentachloride, and thionyl chloride. Acetic anhydride is preferable from the viewpoint of purification after the reaction. Furthermore, the base catalyst and the dehydrating agent may each be used alone or as a mixture of two or more thereof, and the imidization ratio thereof can be controlled appropriately according to the required performance of the target compound by adjusting the amount of the catalyst, the amount of the dehydrating agent, the reaction temperature, and the reaction time.

The solvent used in this event is not particularly limited, as long as the solvent is inactive in the above reaction. Examples of the solvent include ethers such as diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, isobutyl methyl ketone, and cyclohexanone; esters such as methyl acetate, ethyl acetate, n-butyl acetate, propylene glycol methyl ether acetate, and γ-butyrolactone; non-protic polar solvents such as N-methyl-2-pyrrolidone, N,N-dimethylacetamide, dimethylsulfoxide, N,N-dimethylformamide, and hexamethylphosphoric triamide; and the like. These can be used alone or in mixture.

The obtained reaction solution of the imide compound, being an intermediate, may proceed successively to the above-described polycondensation reaction, but, in order to remove unreacted raw materials, the catalyst, and so on present in the system as reaction intermediates, can also be diluted with an organic solvent, and then subjected to liquid-liquid separation and washing, or be subjected to crystallization using a poor solvent to collect a powder.

In a polycondensation reaction performed using the imide compound obtained by the above-described method or the like, the imide compound, the aldehyde compound, and the ketone compound may each be used alone or as a mixture of two or more thereof, and the aldehyde compound and the ketone compound may be used in combination.

These compounds may be selected and combined appropriately according to the required properties.

A polycondensation reaction can generally be achieved in an organic solvent in the presence of an acid catalyst at room temperature or under cooling or heating as necessary. As the acid catalyst to be used, it is possible to use: inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the solvent used include: alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; non-protic polar solvents such as dimethylsulfoxide, N,N-dimethylformamide, and hexamethylphosphoric triamide; and the like. These can be used alone or in mixture of two or more thereof.

The reaction method includes: a method where the imide compound and the aldehyde compound or the ketone compound and the catalyst are charged at once; a method of dispersing or dissolving the imide compound and the aldehyde compound or the ketone compound, then adding the catalyst at once or diluting with a solvent and adding dropwise; and a method of dispersing or dissolving the catalyst, then adding a nitrogen-containing compound and the imide compound or the ketone compound at once or diluting with a solvent and adding dropwise. After completion of the reaction, the resultant may be used directly as an organic film material, but, in order to remove unreacted raw materials, the catalyst, and so on present in the system, may also be diluted with an organic solvent, then subjected to liquid-liquid separation and washing, and thus collected.

The organic solvent used in this event is not particularly limited, as long as the organic solvent is capable of dissolving the compounds and is separated into two layers when mixed with water. The organic solvent includes hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-tert-butyl ether, and ethylcyclopentylmethyl ether; chlorinated solvents such as methylene chloride, chloroform, dichloroethane, and trichloroethylene; mixtures thereof; and the like. As washing water used in this event, generally, what is called deionized water or ultrapure water may be used. The washing may be performed once or more, preferably approximately once to five times because washing ten times or more does not always produce the full washing effects thereof.

In the liquid-liquid separation and washing, the washing may be performed with a basic aqueous solution to remove the unreacted raw materials or acidic components in the system. The base specifically includes hydroxides of alkaline metals, carbonates of alkaline metals, hydroxides of alkali earth metals, carbonates of alkali earth metals, ammonia, organic ammonium, and the like.

Further, in the liquid-liquid separation and washing, the washing may be performed with an acidic aqueous solution to remove the unreacted raw materials, metal impurities, or basic components in the system. The acid specifically includes: inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and the like.

The liquid-liquid separation and washing may be performed with any one of the basic aqueous solution and the acidic aqueous solution, or can be performed with a combination of the two. The liquid-liquid separation and washing is preferably performed with the basic aqueous solution and the acidic aqueous solution in this order from the viewpoint of removing the metal impurities.

After the liquid-liquid separation and washing with the basic aqueous solution and the acidic aqueous solution, washing with neutral water may be successively performed. The washing may be performed once or more, preferably approximately once to five times. As the neutral water, deionized water, ultrapure water, or the like as mentioned above may be used. The washing may be performed once or more, but if the washing is not performed sufficiently, the basic components and acidic components cannot be removed in some cases. The washing is preferably performed approximately once to five times because washing ten times or more does not always produce the full washing effects thereof.

Further, the reaction product after the liquid-liquid separation can also be collected as a powder by evaporating the solvent to dryness or crystallizing the reaction product under reduced pressure or normal pressure. Alternatively, the reaction product can also be retained in the state of solution with an appropriate concentration to improve the workability in preparing the organic film material. The concentration in this event is preferably 0.1 to 50 mass %, more preferably 0.5 to 30 mass %. With such a concentration, the viscosity is hardly increased, making it possible to prevent deterioration of the workability; in addition, since the amount of the solvent is not excessive, it is economical.

The solvent in this event is not particularly limited, as long as the solvent is capable of dissolving the compound. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, and propylene glycol mono-tert-butyl ether acetate. These can be used alone or in mixture of two or more thereof.

To prepare a compound for an organic film, it is possible to combine an imide compound, an aldehyde compound, and a ketone compound according to the required performance. A side chain structure that contributes to improvement of planarizing property and a rigid aromatic ring structure that contributes to etching resistance and heat resistance can be combined at any ratio. An organic film material using these compounds can achieve both higher filling and planarizing properties and etching resistance.

Furthermore, as an alternative method for obtaining the compound used in the organic film material, it is also possible to obtain the compound by obtaining an intermediate by the polycondensation of an imide compound having a hydroxy group, an aldehyde compound, and a ketone compound as shown below in the same manner as described above (STEP 1), then further converting the hydroxy group to have $R_1$ (STEP 2). n1, n2, n3, $W_1$, $R_1$, $R_2$, and $R_3$ in the following formulae have the same meanings as defined above.

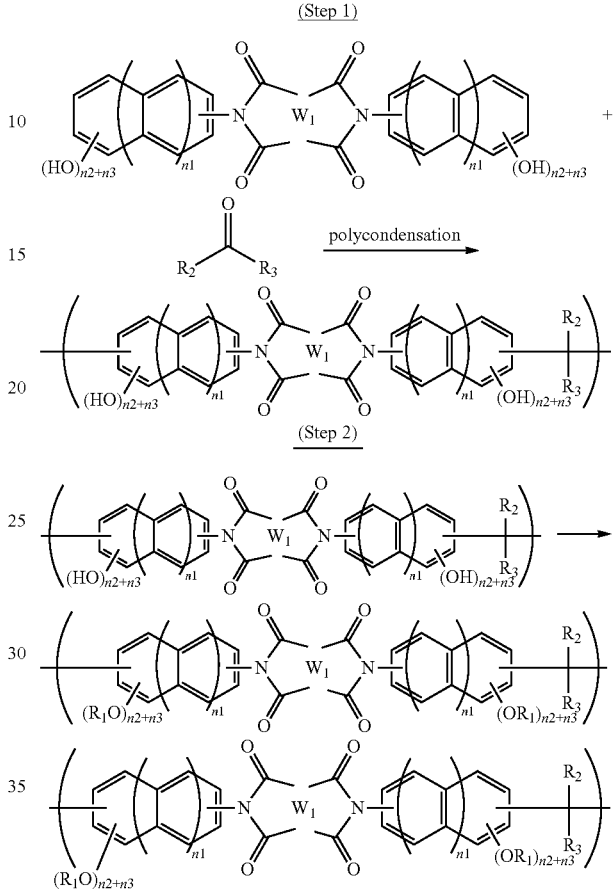

The reaction is not particularly limited as long as the reaction enables the above-described introduction of the substituent. Examples of the reaction include a substitution reaction using a base catalyst with a halide, a tosylate, or a mesylate as shown below. X in the following formula represents a halogen, a tosyl group, or a mesyl group, and n1, n2, n3, $W_1$, $R_1$, $R_2$, and $R_3$ have the same meanings as defined above.

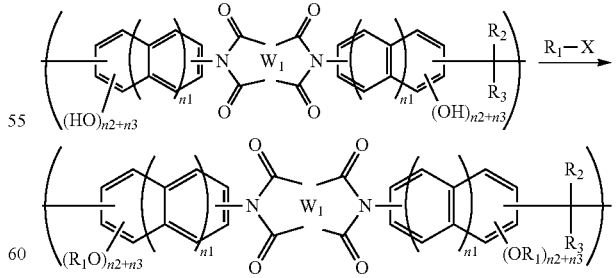

The base catalyst used in the substitution reaction includes inorganic base compounds such as sodium hydrogen carbonate, sodium carbonate, potassium carbonate, calcium carbonate, cesium carbonate, sodium hydroxide, potassium hydroxide, sodium hydride, and potassium phosphate;

organic amine compounds such as triethyl amine, pyridine, and N-methylmorpholine; and the like. On of these can be used alone or the combination of two or more thereof can be used.

The solvent used in this event is not particularly limited, as long as the solvent is inactive in the above reaction. Examples of the solvent include ether-based solvents such as diethyl ether, tetrahydrofuran, and dioxane; aromatic solvents such as benzene, toluene, and xylene; acetonitrile, dimethylsulfoxide, N,N-dimethylformamide, N-methylpyrrolidone, water, and the like. These can be used alone or in mixture.

The method for reacting and collecting the compounds include the methods described above.

To prepare the polymer used in the organic film material obtained by this method, one of various halides, tosylates, and mesylates can be used alone or the combination of two or more thereof can be used according to the required performance. For example, a substituent that contributes to improvement of adhesion to a substrate or filling and planarizing properties, a substituent for improving curing property, and the like can be introduced in any ratio. Therefore, an organic film material using these polymers can achieve both higher filling and planarizing properties and etching resistance.

Furthermore, a method for obtaining a polymer used in the inventive organic film material when $W_2$ represents a single bond includes oxidative coupling polymerization shown below using an imide compound and accompanied by dehydrogenation. $R_1$, n1, n2, n3, and $W_1$ in the following formula have the same meanings as defined above,

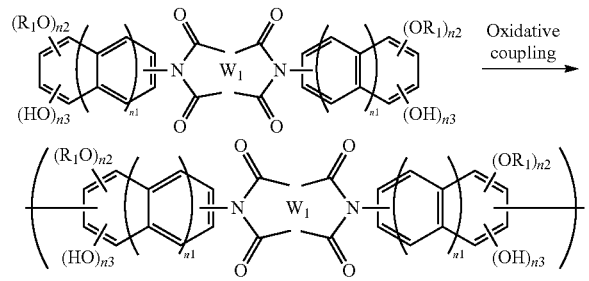

The oxidative coupling polymerization can be performed while supplying oxygen in the presence of a catalyst in an organic solvent at room temperature or under cooling or heating as necessary. The catalyst used includes di-µ-hydroxo-bis [(N, N, N',N'-tetramethylethylenediamine)copper (II)]chloride, di-µ-hydroxo-bis(N,N,N',N'-tetramethylpropylenediamine)copper(II)]chloride, di-µ-hydroxo-bis[(N,N,N',N'-tetraethylethylenediamine)copper(II)]chloride, di-µ-hydroxo-bis[(N,N,N',N'-tetraethylethylenediamine)copper (II)]chloride, di-µ-hydroxo-bis[(N,N,N',N'-tetramethyl-1,6-hexanediamine)copper(II)]chloride, di-µ-hydroxo-bis[(N,N,N',N'-tetramethyl-1,8-naphthalenediamine)copper(II)]chloride, di-µ-hydroxo-bis[(N,N,N',N'-tetramethylethylenediamine)titanium(II)]chloride, di-µ-hydroxo-bis[(N,N,N',N'-tetramethylethylenediamine)cerium(II)]chloride, and di-µ-hydroxo-bis[(N,N,N',N'-tetramethylethylenediamine)iron]chloride.

Examples of the solvent used include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; non-protic polar solvents such as dimethylsulfoxide, N,N-dimethylformamide, and hexamethylphosphoric triamide; and the like. These can be used alone or in mixture of two or more thereof.

The method for reacting and collecting the compounds include the methods described above.

As described above, the inventive polymer for forming an organic film can provide a composition (material) for forming an organic film that can form an organic film having excellent heat resistance, excellent solvent resistance, high filling property, high planarizing property, and excellent adhesion to a substrate.

<Material for Forming Organic Film>

Furthermore, the present invention provides a material for forming an organic film, containing: the above-described inventive polymer for forming an organic film; and an organic solvent. The inventive material for forming an organic film can also be referred to as a composition for forming an organic film. Note that in the inventive material for forming an organic film, one of the above-described inventive polymers for forming an organic film can be used alone or the combination of two or more thereof can be used.

The organic solvent that can be used in the inventive material for forming an organic film is not particularly limited as long as the solvent can dissolve the inventive polymer (base polymer) and optional components such as an acid generator, a crosslinking agent, other additives, and the like described below. Specifically, solvents with a boiling point of lower than 180° C. such as those disclosed in paragraphs (0091) to (0092) of JP 2007-199653 A can be used. Above all, propylene glycol monomethyl ether acetate, propylene glycol monomethyl ether, 2-heptanone, cyclopentanone, cyclohexanone, and a mixture of two or more thereof are preferably used.

Such a material is a material for forming an organic film that can be applied by spin-coating, and that can form an organic film having excellent heat resistance, excellent solvent resistance, adhesion, and high filling and planarizing properties because the inventive polymer for forming an organic film as described above is incorporated.

Furthermore, the inventive material for forming an organic film may use the organic solvent with a high-boiling-point solvent having a boiling point of 180° C. or higher added to the aforementioned solvent having a boiling point of lower than 180° C. (a mixture of the solvent having a boiling point of lower than 180° C. with the solvent having a boiling point of 180° C. or higher).

The high-boiling-point organic solvent is not particularly limited to hydrocarbons, alcohols, ketones, esters, ethers, chlorinated solvents, and so forth, as long as the high-boiling-point organic solvent is capable of dissolving the compound for forming an organic film. Specific examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, and the like. One of these may be used alone or the mixture of two or more thereof may be used.

The boiling point of the high-boiling-point solvent may be appropriately selected according to the temperature at which the organic film composition is heated. The boiling point of the high-boiling-point solvent to be added is preferably 180° C. to 300° C., more preferably 200° C. to 300° C. Such a boiling point prevents the evaporation rate at baking (heating) from becoming excessive, which would otherwise occur if the boiling point is too low. Thus, the boiling point of 180° C. or higher can provide sufficient thermal flowability. Meanwhile, with such a boiling point, the boiling point is not too high, so that the high-boiling-point solvent evaporates after baking and does not remain in the film; thus, the boiling point of 300° C. or lower does not adversely affect the film physical properties such as etching resistance.

When the high-boiling-point solvent is used, the formulation amount of the high-boiling-point solvent is preferably 1 to 30 parts by mass based on 100 parts by mass of the solvent having a boiling point of lower than 180° C. The formulation amount in this range can prevent a failure in providing sufficient thermal flowability during baking, which would otherwise occur if the formulation amount is too small. In addition, deterioration of the film physical properties such as etching resistance can be prevented, which would otherwise occur if the formulation amount is so large that the solvent remains in the film.

With such a material for forming an organic film, the above-described polymer for forming an organic film is provided with thermal flowability by adding the high-boiling-point solvent, so that the composition for forming an organic film also has higher filling and planarizing properties.

In the inventive material for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One of the acid generators can be used alone or combination of two or more thereof can be used. When the acid generator is added, the added amount is preferably 0.05 to 50 parts, more preferably 0.1 to 10 parts, based on 100 parts of the polymer.

To the inventive material for forming an organic film, a surfactant can be added so as to enhance the coating property in spin-coating. As examples of the surfactant, those disclosed in (0142) to (0147) of JP 2009-269953 A can be used.

Moreover, to the inventive material for forming an organic film, a crosslinking agent can also be added so as to increase the curability and to further suppress intermixing with an upper layer film. The crosslinking agent is not particularly limited, and known various types of crosslinking agents can be widely used. Examples thereof include methylol or methoxymethyl-type crosslinking agents of polynuclear phenols, melamine-based crosslinking agents, glycoluril-based crosslinking agents, benzoguanamine-based crosslinking agents, urea-based crosslinking agents, @-hydroxyalkylamide-based crosslinking agents, isocyanurate-based crosslinking agents, aziridine-based crosslinking agents, oxazoline-based crosslinking agents, and epoxy-based crosslinking agents.

Specific examples of the melamine-based crosslinking agents include hexamethoxymethylated melamine, hexabutoxymethylated melamine, alkoxy- and/or hydroxy-substituted derivatives thereof, and partial self-condensates thereof. Examples of the methoxymethyl type crosslinking agents of polynuclear phenols include tetramethylated and tetramethoxymethylated bisphenols such as bisphenol A and bisphenol F, hexamethoxymethylated trisphenols such as triphenolmethane, triphenolethane, 1,1,1-tris(4-hydroxyphenyl)ethane, tris(4-hydroxyphenyl)-1-ethyl-4-isopropylbenzene, and partial condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidene bis(4-benzyl-2-oxazoline), 2,2'-isopropylidene bis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Further, to the inventive material for forming an organic film, a plasticizer can be added so as to further enhance the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

Particularly, like the plasticizer, as an additive for providing the inventive material for forming an organic film with filling and planarizing properties, it is preferable to use, for example, liquid additives having polyethylene glycol or polypropylene glycol structures, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

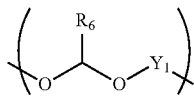

(DPI)

(In the formula, $R_6$ represents a hydrogen atom or a saturated or unsaturated monovalent organic group having 1 to 30 carbon atoms which may be substituted. $Y_1$ represents a saturated or unsaturated divalent organic group having 2 to 30 carbon atoms.)

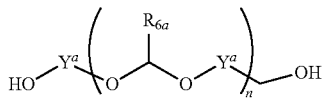

(DP1a)

(In the formula, $R_{6a}$ represents an alkyl group having 1 to 4 carbon atoms. $Y^a$ represents a saturated or unsaturated divalent hydrocarbon group having 4 to 10 carbon atoms which may have an ether bond. "n" represents an average repeating unit number of 3 to 500.)

As described above, the inventive material for forming an organic film is a material for forming an organic film having excellent heat resistance, excellent solvent resistance and adhesion to a substrate, and high filling and planarizing properties. Thus, the inventive material for forming an organic film is extremely useful as an organic film material in multilayer resist methods such as a 2-layer resist method, a 3-layer resist method using a silicon-containing resist underlayer film or a silicon-containing inorganic hard mask, and a 4-layer resist method using a silicon-containing resist underlayer film or a silicon-containing inorganic hard mask and an organic antireflective coating.

<Method for Forming Organic Film>

Using the inventive material for forming an organic film, an organic film that functions, for example, as an organic underlayer film in a multilayer resist film used in lithography, or as a flat film for manufacturing a semiconductor (organic flat film) can be formed.

The film formation step by heating to form an organic film as an organic underlayer film can employ 1-stage baking, 2-stage baking, or multi-stage baking of three or more stages. Nevertheless, the 1-stage baking or the 2-stage baking is economically preferable. The film formation by the 1-stage baking is performed at a temperature of 100° C. or higher to 600° C. or lower for 5 to 3600 seconds, and preferably at a temperature of 150° C. or higher to 500° C. or lower for 10 to 7200 seconds. Heating under such conditions can promote the planarization due to thermal flow and the crosslinking reaction. In a multilayer resist method, a coating-type silicon-containing resist underlayer film or a CVD hard mask is sometimes formed on a film obtained as described above. In the case where a coating-type silicon-containing resist underlayer film is employed, the film formation is performed preferably at a temperature higher than a temperature at which the silicon-containing resist underlayer film is formed. Generally, a silicon-containing resist underlayer film is formed at 100° C. or higher to 400° C. or lower, preferably 150° C. or higher to 350° C. or lower. Forming the organic film at a temperature higher than these temperatures makes it possible to prevent a composition for forming the silicon-containing resist underlayer film from dissolving the organic film, and to form an organic film not mixed with the composition.

In the case where a CVD hard mask is employed, the organic film is formed preferably at a temperature higher than a temperature at which the CVD hard mask is formed. Examples of the temperature at which the CVD hard mask is formed include temperatures at 150° C. or higher to 500° C. or lower.

On the other hand, in the film formation by the 2-stage baking, the first baking is performed in air with a temperature having an upper limit of 300° C. or lower, preferably 250° C. or lower for 10 to 600 seconds, considering the influence of oxygen in air on the substrate corrosion. The second baking temperature is higher than the first baking temperature, and the second baking is performed at a temperature of 600° C. or lower, preferably 500° C. or lower for preferably 10 to 7200 seconds. In a multilayer resist method, a coating-type silicon-containing resist underlayer film or a CVD hard mask is sometimes formed on a film obtained as described above. In the case where a coating-type silicon-containing resist underlayer film is employed, the film formation is performed preferably at a temperature higher than a temperature at which the silicon-containing resist underlayer film is formed. Generally, a silicon-containing resist underlayer film is formed at 100° C. or higher to 400° C. or lower, preferably 150° C. or higher to 350° C. or lower. Forming the organic film at a temperature higher than these temperatures makes it possible to prevent a composition for forming the silicon-containing resist underlayer film from dissolving the organic film, and to form an organic film not mixed with the composition.

In the case where a CVD hard mask is employed in the 2-stage baking, the organic film is formed preferably at a temperature higher than a temperature at which the CVD hard mask is formed. Examples of the temperature at which the CVD hard mask is formed include temperatures at 150° C. or higher to 500° C. or lower.

Meanwhile, the methods for forming an organic film using the inventive material for forming an organic film make it possible to use, for example, a substrate to be processed having a structure or a step with a height of 30 nm or more. As described above, since the inventive material for forming an organic film is excellent in filling and planarizing properties, even when the substrate to be processed has a structure or a step (asperity) with a height of 30 nm or more, a flat cured film can be formed. Specifically, the method for forming an organic film using the inventive material for forming an organic film is particularly useful when a flat organic film is formed on such a substrate to be processed.

Note that the thickness of the organic film to be formed is appropriately selected, but is preferably 30 to 20,000 nm, particularly preferably 50 to 15,000 nm.

Additionally, the above-described methods for forming an organic film are applicable, using the inventive material for forming an organic film, to both cases where an organic film for an organic underlayer film is formed, and where an organic film for a flat film is formed.

The inventive material for forming an organic film can be employed in, for example, a method for forming an organic film by which the surface of a stepped substrate used in a semiconductor device manufacturing process can be planarized, the method including: spin-coating a substrate to be processed with the above-described inventive composition for forming an organic film; heating the substrate coated with the composition for forming an organic film in air at a temperature of 50° C. or higher to 250° C. or lower for 10 to 600 seconds; then heating under an inert gas at a temperature of 250° C. or higher for 10 to 7200 seconds to form a cured film.

In these methods for forming an organic film, first, a substrate to be processed is spin-coated with the above-described inventive material for forming an organic film. By employing the spin-coating method, favorable filling property can be obtained. After the spin-coating, baking (heating) is performed to promote the planarization due to thermal flow and the crosslinking reaction. Note that since this baking allows the solvent in the material to evaporate, even when a resist upper layer film or a silicon-containing resist underlayer film is formed on the organic film, the mixing can be prevented.

<Patterning Processes>
[3-Layer Resist Method using Silicon-Containing Resist Underlayer Film]

The present invention provides a patterning process including:
  forming an organic film by using the inventive material for forming an organic film on a body to be processed;
  forming a silicon-containing resist underlayer film by using a silicon-containing resist underlayer film material on the organic film;
  forming a resist upper layer film by using a photoresist composition on the silicon-containing resist underlayer film;
  forming a circuit pattern in the resist upper layer film;
  transferring the pattern to the silicon-containing resist underlayer film by etching the silicon-containing resist underlayer film while using the resist upper layer film having the formed pattern as a mask;
  transferring the pattern to the organic film by etching the organic film while using the silicon-containing resist underlayer film having the transferred pattern as a mask; and
  further forming the pattern on the body to be processed by etching the body to be processed while using the organic film having the transferred pattern as a mask.

As the body to be processed, it is preferable to use a semiconductor device substrate or the semiconductor device substrate coated with any of a metal film, a metal carbide film, a metal oxide film, a metal nitride film, a metal oxycarbide film, and a metal oxynitride film. More specifically, examples of the body which may be used include, but are not particularly limited to: substrates made of Si, α-Si, p-Si, $SiO_2$, SiN, SiON, W, TiN, Al, or the like; and these substrates coated with the above-described metal film or the like as a layer to be processed.

As the layer to be processed, used are various Low-k films made of Si, $SiO_2$, SiON, SiN, p-Si, α-Si, W, W—Si, Al, Cu, Al—Si, or the like, and stopper films thereof. The layer can be formed to have a thickness of generally 50 to 10,000 nm, particularly 100 to 5,000 nm. Note that when the layer to be processed is formed, the substrate and the layer to be processed are formed from different materials.

Note that the metal of the body to be processed is preferably silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

Further, as the body to be processed, a substrate to be processed having a structure or a step with a height of 30 nm or more is preferably used.

When the organic film is formed by using the inventive material for forming an organic film on the body to be processed, the above-described methods can be employed.

Next, using a resist underlayer film material containing silicon atoms, a resist underlayer film (silicon-containing resist underlayer film) is formed on the organic film. The silicon-containing resist underlayer film material is preferably a polysiloxane-based underlayer film material. The silicon-containing resist underlayer film having an antireflective effect can suppress the reflection. Particularly, for 193-nm light exposure, a material containing many aromatic groups and having a high etching selectivity relative to the substrate is used as a material for forming an organic film, so that the k-value and thus the substrate reflection are increased; in contrast, the reflection can be suppressed by imparting absorption to the silicon-containing resist underlayer film so as to have an appropriate k-value, and the substrate reflection can be reduced to 0.5% or less. As the silicon-containing resist underlayer film having an antireflective effect, a polysiloxane is preferably used, the polysiloxane having anthracene for 248-nm and 157-nm light exposure, or a phenyl group or a light-absorbing group having a silicon-silicon bond for 193-nm light exposure in a pendant structure or a polysiloxane structure, and being crosslinked by an acid or heat.

Next, using a resist upper layer film material composed of a photoresist composition, a resist upper layer film is formed on the silicon-containing resist underlayer film. The resist upper layer film material may be a positive type or a negative type, and any generally-used photoresist composition can be used. After the spin-coating of the resist upper layer film material, pre-baking is preferably performed at 60 to 180° C. for 10 to 300 seconds. Then, light exposure, and further, post-exposure bake (PEB) and development are performed according to conventional methods to obtain a resist upper layer film pattern. Note that the thickness of the resist upper layer film is not particularly limited, but is preferably 30 to 500 nm, particularly preferably 50 to 400 nm.

Next, a circuit pattern (the resist upper layer film pattern) is formed in the resist upper layer film. The circuit pattern is preferably formed by a lithography using light with a wavelength ranging from 10 nm or more to 300 nm or less, a direct drawing by electron beam, a nanoimprinting, or a combination thereof.

Note that the exposure light includes high energy beam with a wavelength of 300 nm or less; specifically, deep ultraviolet ray, KrF excimer laser beam (248 nm), ArF excimer laser beam (193 nm), $F_2$ laser beam (157 nm), $Kr_2$ laser beam (146 nm), $Ar_2$ laser beam (126 nm), soft X-ray (EUV) with a wavelength of 3 to 20 nm, electron beam (EB), ion beam, X-ray, and the like.

Additionally, in forming the circuit pattern, the circuit pattern is preferably developed by alkaline development or development with an organic solvent.

Next, the pattern is transferred to the silicon-containing resist underlayer film by etching the silicon-containing resist underlayer film while using the resist upper layer film having the formed circuit pattern as a mask. The etching of the silicon-containing resist underlayer film while using the resist upper layer film pattern as a mask is preferably performed using a fluorocarbon-based gas. Thereby, a silicon-containing resist underlayer film pattern is formed.

Next, the pattern is transferred to the organic film by etching the organic film while using the silicon-containing resist underlayer film having the transferred pattern as a mask. Since the silicon-containing resist underlayer film exhibits higher etching resistance to an oxygen gas or a hydrogen gas than an organic film, the etching of the organic film while using the silicon-containing resist underlayer film pattern as a mask is preferably performed using an etching gas mainly containing an oxygen gas or a hydrogen gas. Thereby, an organic film pattern can be formed.

Next, the pattern is transferred to the body to be processed by etching the body to be processed while using the organic film having the transferred pattern as a mask. The subsequent etching of the body to be processed (layer to be processed) can be performed according to a conventional method. For example, the body to be processed made of $SiO_2$, SiN, or silica-based low-dielectric insulating film is etched mainly with a fluorocarbon-based gas. The body to be processed made of p-Si, Al, or W is etched mainly with a chlorine- or bromine-based gas. When the substrate is processed by etching with a fluorocarbon-based gas, the silicon-containing resist underlayer film pattern is removed together with the substrate processing. Meanwhile, when the substrate is processed by etching with a chlorine- or bromine-based gas, the silicon-containing resist underlayer film pattern needs to be removed by additional dry etching with a fluorocarbon-based gas after the substrate processing.

The organic film obtained using the inventive material for forming an organic film can exhibit excellent etching resistance when the body to be processed is etched as described above.

[4-Layer Resist Method Using Silicon-Containing Resist Underlayer Film and Organic Antireflective Coating]

The present invention provides a patterning process including:
forming an organic film by using the inventive material for forming an organic film on a body to be processed;
forming a silicon-containing resist underlayer film by using a silicon-containing resist underlayer film material on the organic film;
forming an organic antireflective coating on the silicon-containing resist underlayer film;
forming a resist upper layer film by using a photoresist composition on the organic antireflective coating, so that a 4-layered film structure is constructed;
forming a circuit pattern in the resist upper layer film;
transferring the pattern to the organic antireflective coating and the silicon-containing resist underlayer film by etching the organic antireflective coating and the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

Note that this method can be performed in the same manner as the above-described 3-layer resist method using the silicon-containing resist underlayer film, except that the organic antireflective coating (BARC) is formed between the silicon-containing resist underlayer film and the resist upper layer film.

The organic antireflective coating can be formed by spin-coating using a known organic antireflective coating material.

[3-Layer Resist Method Using Inorganic Hard Mask]

Furthermore, as a patterning process by a 3-layer resist method using the above-described inventive composition for forming an organic film, the present invention provides a patterning process including:
forming an organic film by using the inventive material for forming an organic film on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

Note that this method can be performed in the same manner as the above-described 3-layer resist method using the silicon-containing resist underlayer film, except that the inorganic hard mask is formed in place of the silicon-containing resist underlayer film on the organic film.

The inorganic hard mask selected from a silicon oxide film, a silicon nitride film, and a silicon oxynitride film (SiON film) can be formed by a CVD method, an ALD method, or the like. The method for forming the silicon nitride film is disclosed in, for example, JP 2002-334869 A, WO 2004/066377 A1, and so forth. The film thickness of the inorganic hard mask is preferably 5 to 200 nm, more preferably 10 to 100 nm. As the inorganic hard mask, a SiON film is most preferably used, being effective as an antireflective coating. When the SiON film is formed, the substrate temperature reaches 300 to 500° C. Hence, the underlayer film needs to withstand the temperature of 300 to 500° C. Since the organic film formed using the inventive composition for forming an organic film has high heat resistance and can withstand high temperatures of 300° C. to 500° C., this enables the combination of the inorganic hard mask formed by a CVD method or an ALD method with the organic film formed by a spin-coating method.

[4-Layer Resist Method Using Inorganic Hard Mask and Organic Antireflective Coating]

Furthermore, as a patterning process by a 4-layer resist method using the above-described inventive composition for forming an organic film, the present invention provides a patterning process including:

forming an organic film by using the inventive material for forming an organic film on a body to be processed;

forming an inorganic hard mask selected from a silicon oxide film, a silicon nitride film, and a silicon oxynitride film on the organic film;

forming an organic antireflective coating on the inorganic hard mask;

forming a resist upper layer film by using a photoresist composition on the organic antireflective coating, so that a 4-layered film structure is constructed;

forming a circuit pattern in the resist upper layer film;

transferring the pattern to the organic antireflective coating and the inorganic hard mask by etching the organic antireflective coating and the inorganic hard mask while using the resist upper layer film having the formed pattern as a mask;

transferring the pattern to the organic film by etching the organic film while using the inorganic hard mask having the formed pattern as a mask; and further forming the pattern on the body to be processed by etching the body to be processed while using the organic film having the formed pattern as a mask.

Note that this method can be performed in the same manner as the above-described 3-layer resist method using the inorganic hard mask, except that the organic antireflective coating (BARC) is formed between the inorganic hard mask and the resist upper layer film.

Particularly, when the SiON film is used as the inorganic hard mask, two layers of antireflective coating including the SiON film and the BARC make it possible to suppress the reflection even in liquid immersion exposure at a high NA exceeding 1.0. Another merit of the BARC formation is having an effect of reducing footing of the resist upper layer film pattern immediately above the SiON film.

Herein, FIG. 1 (A) to (F) show an example of the inventive patterning process according to the 3-layer resist method. In the 3-layer resist method as shown in FIG. 1 (A), an organic film 3 is formed by using the inventive material for forming an organic film on a layer 2 to be processed formed on a substrate 1. Then, a silicon-containing resist underlayer film 4 is formed on the organic film 3, and a resist upper layer film 5 is formed on the silicon-containing resist underlayer film 4. Subsequently, as shown in FIG. 1 (B), an exposed portion 6 of the resist upper layer film 5 is exposed to light, followed by PEB (post-exposure bake). Thereafter, as shown in FIG. 1 (C), a resist upper layer film pattern 5a is formed by development. After that, as shown in FIG. 1 (D), the silicon-containing resist underlayer film 4 is processed by dry-etching using a fluorocarbon-based gas while using the resist upper layer film pattern 5a as a mask. Thereby, a silicon-containing resist underlayer film pattern 4a is formed. Then, as shown in FIG. 1 (E), after the resist upper layer film pattern 5a is removed, the organic film 3 is etched with oxygen plasma while using the silicon-containing resist underlayer film pattern 4a as a mask. Thereby, an organic film pattern 3a is formed. Further, as shown in FIG. 1 (F), after the silicon-containing resist underlayer film pattern 4a is removed, the layer 2 to be processed is processed by etching while using the organic film pattern 3a as a mask. Thus, a pattern 2a is formed.

In the case where an inorganic hard mask is formed, the silicon-containing resist underlayer film 4 may be replaced with the inorganic hard mask. In the case where an antireflective coating (BARC) is formed, the BARC may be formed between the silicon-containing resist underlayer film 4 and the resist upper layer film 5. The BARC may be etched continuously and before the etching of the silicon-containing resist underlayer film 4. Alternatively, after the BARC is etched alone, the silicon-containing resist underlayer film 4 may be etched, for example, after an etching apparatus is changed.

As described above, the inventive patterning processes make it possible to precisely form a fine pattern in a body to be processed by the multilayer resist methods.

EXAMPLE

Hereinafter, the present invention will be more specifically described by referring to Synthesis Examples, Comparative Synthesis Examples, Examples, and Comparative Examples. However, the present invention is not limited thereto. Note that, with respect to molecular weight and dispersity, weight-average molecular weight (Mw) and number-average molecular weight (Mn) were measured by gel permeation chromatography (GPC) using tetrahydrofuran as an eluent in terms of polystyrene, and dispersity (Mw/Mn) was calculated therefrom.

Synthesis Examples: Synthesis of Polymers Used in Organic Film Material

Imide compounds (A1) to (A6) to be intermediates of polymers used in a material for forming an organic film were synthesized using tetracarboxylic anhydrides (B1) to (B3) and amine compounds ($C_1$) to (C6) shown below.

Tetracarboxylic Anhydrides:

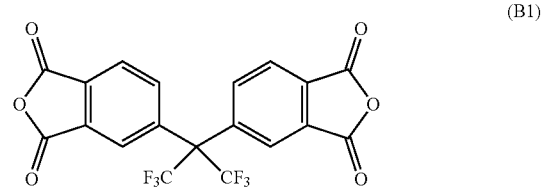

(B1)

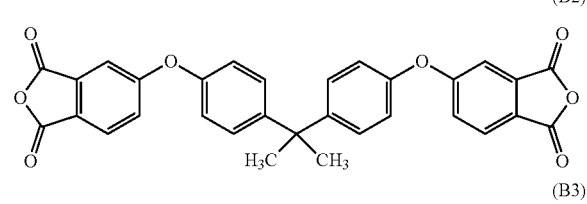

(B2)

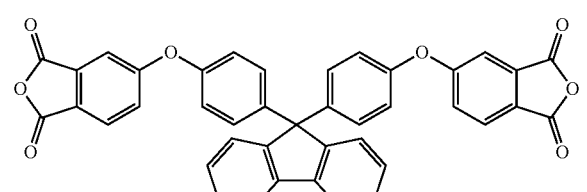

(B3)

Amine Compounds:

(C1) 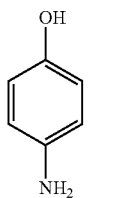

(C2) 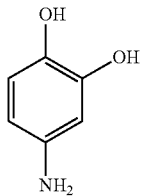

(C3) 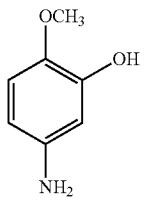

(C4) 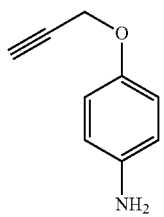

(C5) 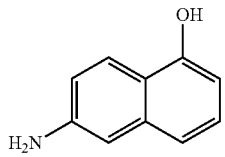

(C6) 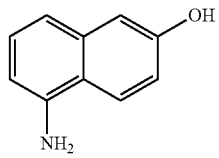

[Synthesis Example 1] Synthesis of Imide Compound (A1)

(A1) 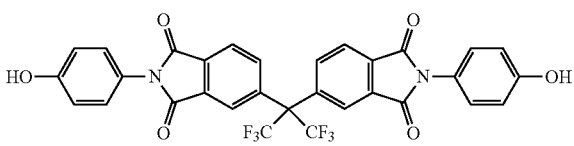

A homogeneous solution was formed by adding 150 g of N-methylpyrrolidone to 30.00 g of tetracarboxylic anhydride (B1) under a nitrogen atmosphere at an inner temperature of 40° C. Then, 14.74 g of amine compound (C1) was added, and the reaction was allowed to proceed at an inner temperature of 40° C. for 3 hours to obtain an amic acid solution. 200 g of o-xylene was added to the obtained amic acid solution, and while removing the generated low-boiling substance and the generated water from the system under an inner temperature of 150° C., the reaction was allowed to proceed for 9 hours for dehydrating imidization. After completion of the reaction, the solution was cooled to room temperature, and a crystal was precipitated with 1000 g of diisopropyl ether. The precipitated crystal was separated by filtration, washed twice with 500 g of diisopropyl ether, and collected. The collected crystal was vacuum dried at 70° C. Thus, compound (A1) was obtained.

[Synthesis Examples 2 to 6] Synthesis of Imide Compounds (A2) to (A6)

Compounds (A2) to (A6) as shown in Table 1 were obtained under the same reaction conditions as those in Synthesis Example 1, except that the tetracarboxylic anhydrides and the amine compounds shown in Table 1 were used.

TABLE 1

| Synthesis Example | Tetracarboxylic anhydride | Amine compound | Imide compound |
|---|---|---|---|
| 1 | B1: 30.00 g | C1: 14.74 g | A1 |

TABLE 1-continued

| Synthesis Example | Tetra-carboxylic anhydride | Amine compound | Imide compound |
|---|---|---|---|
| 2 | B1: 30.00 g | C4: 19.88 g | A2 |
| 3 | B2: 30.00 g | C2: 14.42 g | A3 |
| 4 | B2: 30.00 g | C5: 18.35 g | A4 |
| 5 | B3: 30.00 g | C3: 12.99 g | A5 |
| 6 | B3: 30.00 g | C6: 14.86 g | A6 |

Polymers (P1) to (P9) used in a material for forming an organic film were synthesized using the intermediates, imide compounds (A1) to (A6) and the following (D1) to (D3) as aldehyde components were used. Note that D1 was used as a 37% formalin aqueous solution.

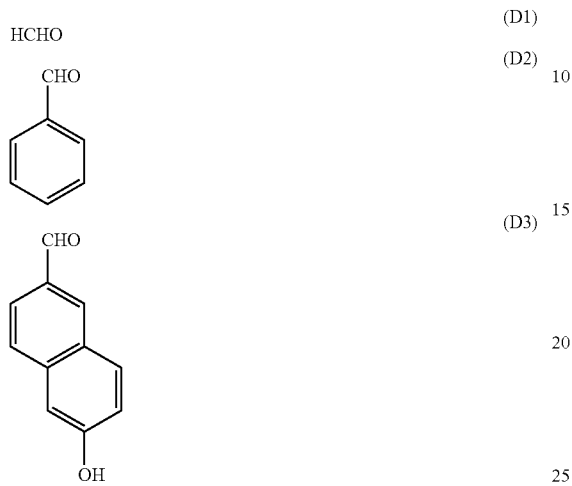

[Synthesis Example P1] Synthesis of Polymer (P1)

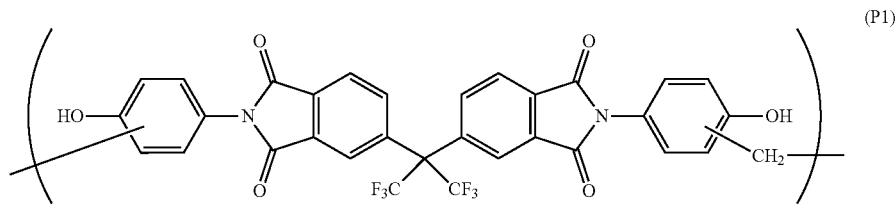

A homogeneous solution of 15.00 g of an imide compound (A1), 1.36 g of an aldehyde compound (D1), and 60 g of 2-methoxy-1-propanol was formed under a nitrogen atmosphere at an inner temperature of 80° C. Then, 1.5 g of a 2-methoxy-1-propanol solution containing 20% p-toluenesulfonic acid was added slowly, and was stirred at an inner temperature of 110° C. for 8 hours. After cooling to room temperature, 200 g of methyl isobutyl ketone was added, the organic layer was washed five times with 50 g of pure water, then, the organic layer was evaporated under reduced pressure to dryness. To the residue, 50 g of THF was added, and the polymer was reprecipitated with 200 g of hexane. The precipitated polymer was separated by filtration, and dried under reduced pressure. Thus, polymer (P1) was obtained.

When the weight-average molecular weight (Mw) and dispersity (Mw/Mn) were measured by GPC, the following results were obtained.

(P1): Mw=2820, Mw/Mn=1.72

[Synthesis Examples P2 to P9] Synthesis of Polymers (P2) to (P9)

Polymers (P2) to (P9) as shown in Table 2 were obtained under the same reaction conditions as those in Synthesis Example P1, except that the imide compounds and the aldehyde compounds shown in Table 2 were used. The structural formula, weight-average molecular weight (Mw), and dispersity (Mw/Mn) of the obtained polymers have been listed in Table 3 and Table 4.

TABLE 2

| Synthesis Example | Imide compound | Aldehyde compound | Polymer |
|---|---|---|---|
| P1 | A1: 15.00 g | D1: 1.36 g | P1 |
| P2 | A1: 15.00 g | D2: 2.03 g | P2 |
| P3 | A2: 15.00 g | D1: 1.21 g | P3 |
| P4 | A3: 15.00 g | D1: 0.99 g | P4 |
| P5 | A4: 15.00 g | D1: 0.91 g | P5 |
| P6 | A3: 15.00 g | D3: 2.57 g | P6 |
| P7 | A5: 15.00 g | D1: 0.96 g | P7 |
| P8 | A6: 15.00 g | D1: 0.86 g | P8 |
| P9 | A6: 15.00 g | D3: 2.23 g | P9 |

[Synthesis Example P10] Synthesis of Polymer (P10)

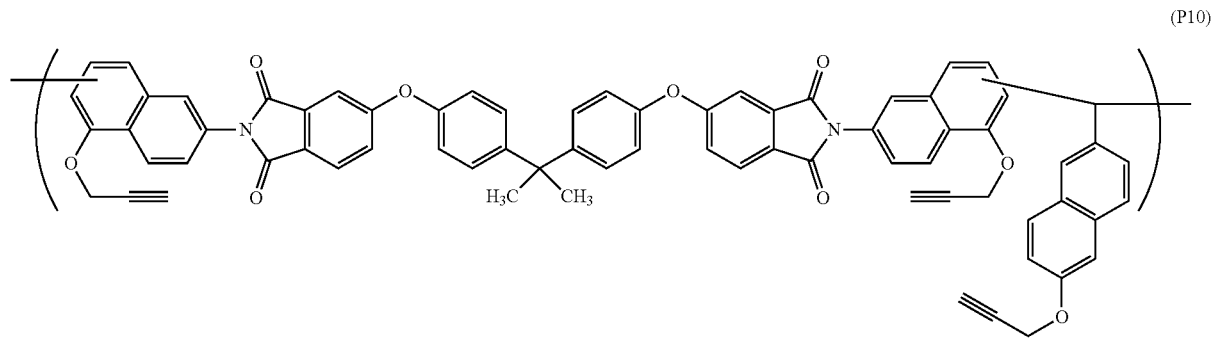

A homogeneous dispersion was formed by adding 40 g of N-methyl-2-pyrrolidone to 8.00 g of the polymer (P6) and 5.78 g of potassium carbonate under a nitrogen atmosphere at an inner temperature of 50° C. 4.94 g of propargyl bromide was slowly added dropwise, and the reaction was allowed to proceed at an inner temperature of 50° C. for 24 hours. 150 g of methyl isobutyl ketone and 50 g of pure water were added to the reaction solution for homogenization, then, the separated aqueous layer was removed. Further, the organic layer was washed six times with 50 g of a 3% nitric acid aqueous solution and 50 g of pure water. Then the organic layer was evaporated under reduced pressure to dryness. After a homogeneous solution was formed by adding 40 g of THF to the residue, a crystal was precipitated with 150 g of methanol. The precipitated crystal was separated by filtration, washed twice with 60 g of methanol, and collected. The collected crystal was vacuum dried at 70° C. Thus, polymer (P10) was obtained.

When the weight-average molecular weight (Mw) and dispersity (Mw/Mn) were measured by GPC, the following results were obtained.

(P10): Mw=3670, Mw/Mn=1.44

[Synthesis Example P11] Synthesis of Polymer (P11)

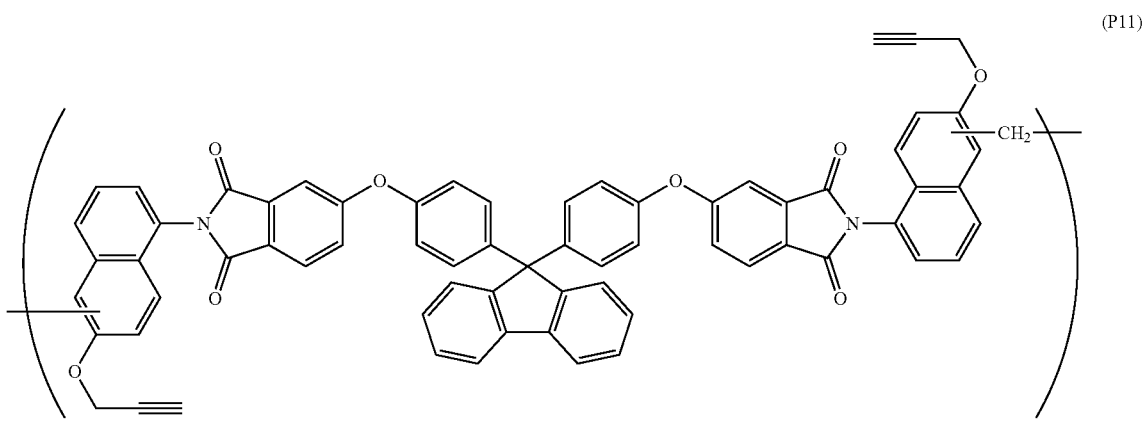

A homogeneous dispersion was formed by adding 40 g of N-methyl-2-pyrrolidone to 8.00 g of the polymer (P8) and 4.72 g of potassium carbonate under a nitrogen atmosphere at an inner temperature of 50° C. 4.04 g of propargyl bromide was slowly added dropwise, and the reaction was allowed to proceed at an inner temperature of 50° C. for 24 hours. 150 g of methyl isobutyl ketone and 50 g of pure water were added to the reaction solution for homogenization, then, the separated aqueous layer was removed. Further, the organic layer was washed six times with 50 g of a 3% nitric acid aqueous solution and 50 g of pure water. Then, the organic layer was evaporated under reduced pressure to dryness. After a homogeneous solution was formed by adding 40 g of THF to the residue, a crystal was precipitated with 150 g of methanol. The precipitated crystal was separated by filtration, washed twice with 60 g of methanol, and collected. The collected crystal was vacuum dried at 70° C. Thus, polymer (P11) was obtained.

When the weight-average molecular weight (Mw) and dispersity (Mw/Mn) were measured by GPC, the following results were obtained.

(P11): Mw=3740, Mw/Mn=1.55

[Synthesis Example P12] Synthesis of Polymer (P12)

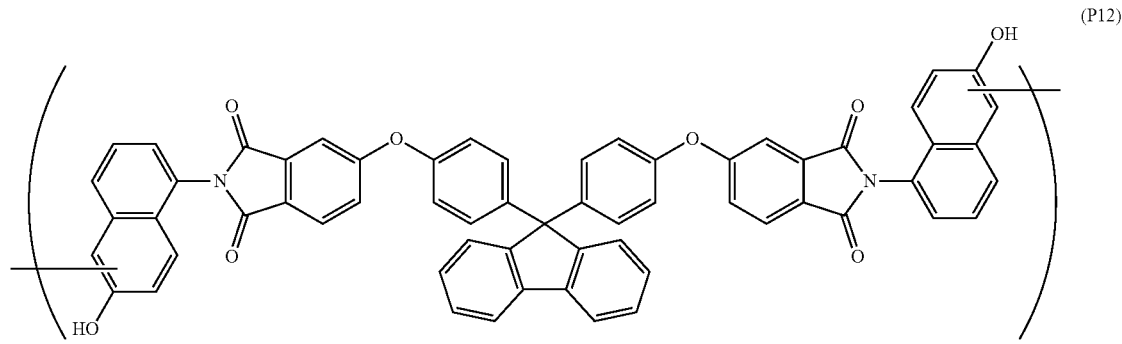

8.0 g of the imide compound (A6) and 0.10 g of di-u-hydroxo-bis[(N,N,N',N'-tetramethylethylenediamine)copper(II)]chloride were added in a flask, and dissolved with 50 g of N-methylpyrrolidone. The reaction was allowed to proceed at room temperature and in an open atmospheric system for 48 hours, and after diluting with 200 g of methyl isobutyl ketone, 50 g of a 5 wt % aqueous hydrochloric acid was added, and the reaction was stopped. The separated aqueous layer was removed, and furthermore, the organic layer was washed twice with 50 g of a 2 wt % ammonia aqueous solution, twice with 50 g of a 3 wt % nitric acid aqueous solution, and five times with 50 g of pure water. Then, the organic layer was evaporated under reduced pressure to dryness. To the residue, 50 ml of THF was added, and the polymer was reprecipitated with 200 ml of hexane. The precipitated polymer was separated by filtration, and dried under reduced pressure. Thus, polymer (P12) was obtained.

When the weight-average molecular weight (Mw) and dispersity (Mw/Mn) were measured by GPC, the following results were obtained.

(P12): Mw=3860, Mw/Mn=1.42

[Comparative Synthesis Example 1] Synthesis of Polymer (R1)

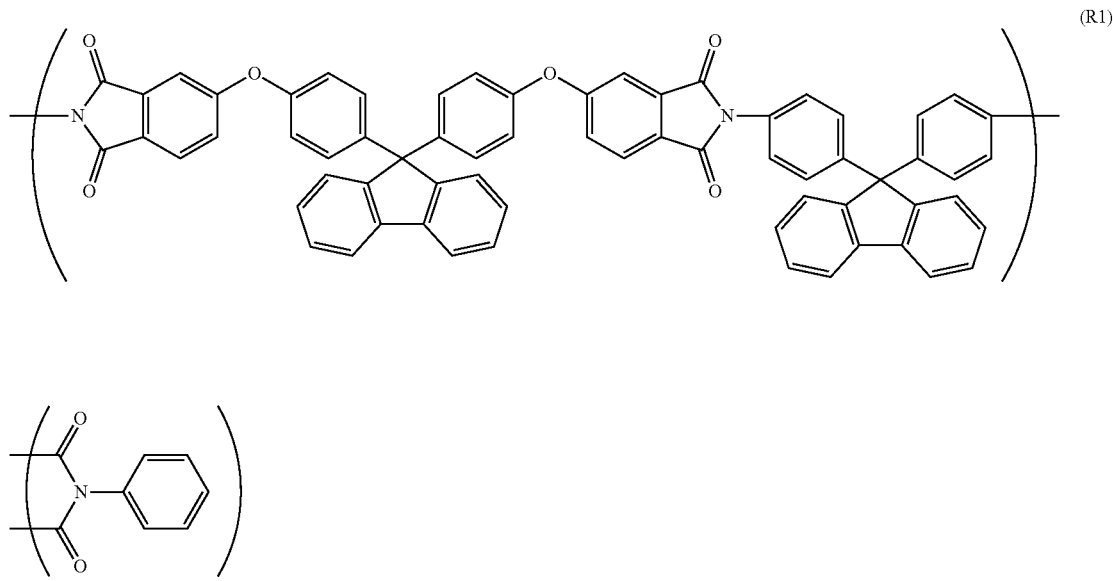

120 g of NMP (N-methyl-2-pyrrolidone) was added to 20.00 g of tetracarboxylic anhydride (B3) and 5.42 g of 9,9-bis(4-aminophenyl)fluorene, and the reaction was allowed to proceed under a nitrogen atmosphere at an inner temperature of 40° C. for 3 hours. To the obtained polyamic acid intermediate solution, 2.90 g of aniline was added as a terminal sealing agent, and the reaction was allowed to proceed at an inner temperature of 40° C. for a further 3 hours to obtain a polyimide precursor solution. 2.46 g of pyridine was added to the obtained reaction solution, and furthermore, 7.63 g of acetic anhydride was slowly added dropwise. Then, the reaction was allowed to proceed at an inner temperature of 60° C. for 4 hours for imidization. After completion of the reaction, the solution was cooled to room temperature, 400 g of methyl isobutyl ketone was added, and the organic layer was washed twice with 100 g of a 3% nitric acid aqueous solution. Thereafter, the organic layer was further washed six times with 100 g of pure water, and the organic layer was evaporated under reduced pressure to dryness. After a homogeneous solution was formed by adding 100 g of THF (tetrahydrofuran) to the residue, a crystal was precipitated with 400 g of methanol. The precipitated crystal was separated by filtration, washed twice with 300 g of methanol, and collected. The collected crystal was vacuum dried at 70° C. Thus, polymer (R1) was obtained.

When the weight-average molecular weight (Mw) and dispersity (Mw/Mn) were measured by GPC, the following results were obtained.

(R1): Mw=3520, Mw/Mn=1.46

[Comparative Synthesis Example 2] Synthesis of Polymer (R2)

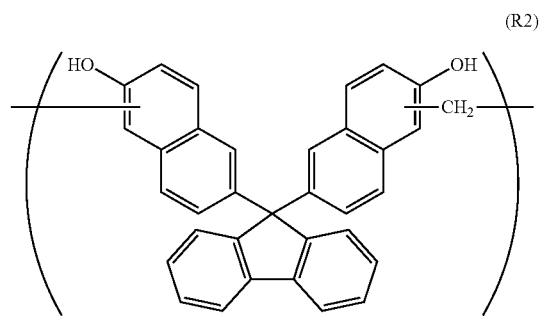

A homogeneous solution of 90.1 g of 9,9-fluorenylidene-bisnaphthol, 10.5 g of a 37% formalin solution, and 270 g of 2-methoxy-1-propanol was formed under a nitrogen atmosphere at a liquid temperature of 80° C. Then, 18 g of a 2-methoxy-1-propanol solution containing 20% p-toluenesulfonic acid was added slowly, and was stirred at a liquid temperature of 110° C. for 8 hours. After cooling to room temperature, 600 g of methyl isobutyl ketone was added, the organic layer was washed five times with 200 g of pure water, then, the organic layer was evaporated under reduced pressure to dryness. To the residue, 320 g of THF was added, and the polymer was reprecipitated with 1350 g of hexane. The precipitated polymer was separated by filtration, and dried under reduced pressure. Thus, polymer (R2) was obtained.

When the weight-average molecular weight (Mw) and dispersity (Mw/Mn) were measured by GPC, the following results were obtained.

Mw=3,700, Mw/Mn=2.82

[Comparative Synthesis Example 3] Synthesis of Polymer (R3)

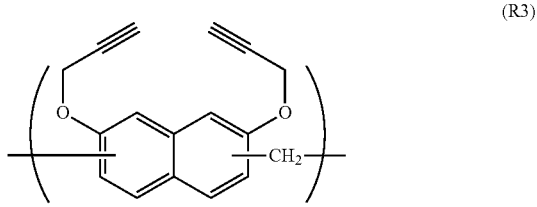
(R3)

A homogeneous solution of 78.8 g of 2,7-dipropargyloxynaphthalene, 21.6 g of a 37% formalin solution, and 250 g of 1,2-dichloroethane was formed under a nitrogen atmosphere at a liquid temperature of 70° C. Then, 5 g of a methanesulfonic acid was added slowly, and was stirred at a liquid temperature of 80° C. for 12 hours. After cooling to room temperature, 500 g of methyl isobutyl ketone was added, the organic layer was washed five times with 200 g of pure water, then, the organic layer was evaporated under reduced pressure to dryness. To the residue, 300 mL of THF was added, and the polymer was reprecipitated with 2,000 mL of hexane. The precipitated polymer was separated by filtration, and dried under reduced pressure. Thus, polymer (R3) was obtained.

When the weight-average molecular weight (Mw) and dispersity (Mw/Mn) were measured by GPC, the following results were obtained.

Mw=2,720, Mw/Mn=1.55.

The structural formula, weight-average molecular weight (Mw), and dispersity (Mw/Mn) of the polymers (P1) to (P12) obtained above are listed in Tables 3 and 4. In addition, Mw and Mw/Mn of the polymers (R1) to (R3) used in the Comparative Examples are shown in Table 5.

TABLE 3

| Synthesis Example | Polymer | Mw | Mw/Mn |
|---|---|---|---|
| P1 | (P1) | 2820 | 1.72 |
| P2 | (P2) | 3270 | 1.53 |
| P3 | (P3) | 3160 | 1.65 |
| P4 | (P4) | 2430 | 1.58 |

TABLE 3-continued
| Synthesis Example | Polymer | Mw | Mw/Mn |
|---|---|---|---|
| P5 | (P5) | 2890 | 1.59 |
| P6 | (P6) | 3370 | 1.45 |
| P7 | (P7) | 3450 | 1.70 |
TABLE 4
| Synthesis Example | Polymer | Mw | Mw/Mn |
|---|---|---|---|
| P8 | (P8) | 3310 | 1.55 |
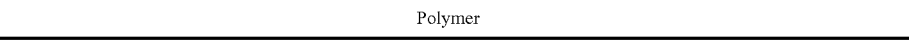

TABLE 4-continued

| Synthesis Example | Polymer | Mw | Mw/Mn |
|---|---|---|---|
| P9 | (P9) | 3070 | 1.41 |
| P10 | (P10) | 3670 | 1.44 |
| P11 | (P11) | 3740 | 1.55 |
| P12 | (P12) | 3860 | 1.42 |

TABLE 5

| Synthesis Example | Polymer | Mw | Mw/Mn |
|---|---|---|---|
| R1 | (R1) polyimide structure with fluorene and phenyl groups | 3520 | 1.46 |
| R2 | (R2) bis-naphthol fluorene structure with CH$_2$ linker | 3700 | 2.82 |
| R3 | (R3) naphthalene bis(propargyl ether) with CH$_2$ linker | 2720 | 1.55 |

Preparation of Materials (UDL-1 to -15, Comparative Examples UDL-1 to -3) for Forming Organic Film Out of the above polymers (P1) to (P12) and (R1) to (R3), those shown in the following Table 6 were used to prepare materials (UDL-1 to -15, Comparative Examples UDL-1 to -3) for forming an organic film. In addition, in preparation of materials UDL-13 to -15 for forming an organic film, (S1) 1,6-diacetoxyhexane having a boiling point of 260° C., (S2) γ-butyrolactone having a boiling point of 204° C., and (S3) tripropylene glycol monomethyl ether having a boiling point of 242° C. were each used as a high-boiling-point solvent. The polymers were dissolved using propylene glycol monomethyl ether acetate (PGMEA) and cyclohexanone (CyHO) containing 0.1 mass % of FC-4430 (manufactured by Sumitomo 3M Ltd.) in proportions shown in Table 6. The solution was then filtered through a 0.1-μm filter made of a fluorinated resin to prepare materials (UDL-1 to -15, Comparative Examples UDL-1 to -3) for forming an organic film. In preparation of materials UDL-13 to -15 for forming an organic film, a high-boiling-point solvent was introduced into the PGMEA and CyHO along with the polymer.

TABLE 6

| Composition for forming organic film | Polymer (parts by mass) | High-boiling-point solvent (parts by mass) | CYHO (parts by mass) | PGMEA (parts by mass) |
|---|---|---|---|---|
| UDL-1 | P1 (10) | — | 90 | — |
| UDL-2 | P2 (10) | — | 90 | — |
| UDL-3 | P3 (10) | — | 90 | — |
| UDL-4 | P4 (10) | — | 90 | — |
| UDL-5 | P5 (10) | — | 60 | 30 |
| UDL-6 | P6 (10) | — | 60 | 30 |
| UDL-7 | P7 (10) | — | 90 | — |
| UDL-8 | P8 (10) | — | 90 | — |
| UDL-9 | P9 (10) | — | 90 | — |
| UDL-10 | P10 (10) | — | 60 | 30 |
| UDL-11 | P11 (10) | — | 90 | — |
| UDL-12 | P12 (10) | — | 90 | — |
| UDL-13 | P8 (10) | S1 (10) | 80 | — |
| UDL-14 | P10 (10) | S2 (10) | 80 | — |
| UDL-15 | P11 (10) | S3 (10) | 80 | — |
| Comparative Example UDL-1 | R1 (10) | — | 90 | — |
| Comparative Example UDL-2 | R2 (10) | — | 90 | — |
| Comparative Example UDL-3 | R3 (10) | — | 90 | — |

Example 1: Solvent Resistance Measurement
(Examples 1-1 to 1-15, Comparative Examples 1-1
to 1-3)

The materials (UDL-1 to -15, comparative UDL-1 to -3) for forming an organic film prepared above were applied onto a silicon substrate and baked in the atmosphere at 350° C. for 60 seconds. Then, the film thickness was measured. A PGMEA solvent was dispensed on the film and allowed to stand for 30 seconds. The resultant was spin-dried and baked at 100° C. for 60 seconds to evaporate the PGMEA. The film thickness was measured to find a difference in the film thicknesses before and after the PGMEA treatment. Table 7 shows the results.

TABLE 7

| | Composition for forming organic film | Film thickness after film formation: a (Å) | thickness after PGMEA treatment: b (Å) | b/a × 100 (%) |
|---|---|---|---|---|
| Example 1-1 | UDL-1 | 2001 | 1996 | 99.8 |
| Example 1-2 | UDL-2 | 1995 | 1991 | 99.8 |
| Example 1-3 | UDL-3 | 2010 | 2004 | 99.7 |
| Example 1-4 | UDL-4 | 1993 | 1990 | 99.8 |
| Example 1-5 | UDL-5 | 2010 | 2008 | 99.9 |
| Example 1-6 | UDL-6 | 2000 | 1998 | 99.9 |
| Example 1-7 | UDL-7 | 2015 | 2010 | 99.8 |
| Example 1-8 | UDL-8 | 2005 | 2002 | 99.9 |
| Example 1-9 | UDL-9 | 2007 | 2000 | 99.7 |
| Example 1-10 | UDL-10 | 2009 | 2003 | 99.7 |
| Example 1-11 | UDL-11 | 2010 | 2006 | 99.8 |
| Example 1-12 | UDL-12 | 2003 | 1964 | 98.1 |
| Example 1-13 | UDL-13 | 1997 | 1994 | 99.8 |
| Example 1-14 | UDL-14 | 2009 | 2004 | 99.8 |
| Example 1-15 | UDL-15 | 1991 | 1990 | 99.9 |
| Comparative Example 1-1 | Comparative UDL-1 | 2001 | 1537 | 76.8 |
| Comparative Example 1-2 | Comparative UDL-2 | 2012 | 2001 | 99.5 |
| Comparative Example 1-3 | Comparative UDL-3 | 2001 | 1994 | 99.7 |

As shown in Table 7, in Examples 1-1 to 1-15 using the inventive material for forming an organic film, the film remaining percentages after the PGMEA treatment were 98% or more. This indicates that a curing reaction was performed by the heat treatment, and sufficient solvent resistance was exhibited. Furthermore, compared with the case of Example 1-12, where an oxidative coupling polymer was used, Example 1-1 to Example 1-11 and -13 to -15 showed slightly more excellent solvent resistance results. From these results, it is revealed that a polymer that has novolak resinified by a condensation reaction with an aldehyde component undergoes a curing reaction more efficiently. Meanwhile, in Comparative Example 1-1, where a polyimide was used, the film remaining percentage after the PGMEA treatment was 80% or less, since there was no part contributing to the curing reaction. Thus, solvent resistance was not exhibited. These results reveal that the inventive polymer for forming an organic film is provided with sufficient curability for exhibiting excellent solvent resistance, and is provided with a further enhanced curability by novolak formation. Note that in Comparative Example 1-2 and Comparative Example 1-3, it can be conjectured that a solvent resistance equivalent to those in Examples 1-1 to 1-15 was exhibited because polymers R2 and R3, being novolak resins, were used.

Example 2: Heat Resistance Evaluation (Examples
2-1 to 2-15, Comparative Examples 2-1 to 2-3)

The organic film materials (UDL-1 to -15, comparative UDL-1 to -3) were each applied onto a silicon substrate and baked in the atmosphere at 350° C. for 60 seconds to form a coating film of 200 nm. The film thickness A was measured. This substrate was further baked at 450° C. for a further 10 minutes under such a nitrogen stream that the oxygen concentration was controlled to 0.2% or less. Then, the film thickness B was measured. The proportion (%) of the film thickness B to the film thickness A was calculated as a film remaining percentage. Table 8 shows the results.

TABLE 8

| | Composition for forming organic film | Film thickness at 350° C.: A (Å) | Film thickness at 450° C.: B (Å) | Film remaining percentage % (B/A) |
|---|---|---|---|---|
| Example 2-1 | UDL-1 | 2000 | 1968 | 98.4 |
| Example 2-2 | UDL-2 | 2010 | 1976 | 98.3 |
| Example 2-3 | UDL-3 | 1992 | 1964 | 98.6 |
| Example 2-4 | UDL-4 | 2010 | 1969 | 98.0 |
| Example 2-5 | UDL-5 | 2001 | 1996 | 99.8 |
| Example 2-6 | UDL-6 | 1996 | 1989 | 99.6 |
| Example 2-7 | UDL-7 | 1993 | 1965 | 98.6 |
| Example 2-8 | UDL-8 | 1988 | 1984 | 99.8 |
| Example 2-9 | UDL-9 | 2003 | 1995 | 99.6 |
| Example 2-10 | UDL-10 | 1994 | 1985 | 99.5 |
| Example 2-11 | UDL-11 | 2010 | 2001 | 99.6 |
| Example 2-12 | UDL-12 | 2007 | 2001 | 99.7 |
| Example 2-13 | UDL-13 | 1998 | 1990 | 99.6 |
| Example 2-14 | UDL-14 | 2006 | 2000 | 99.7 |
| Example 2-15 | UDL-15 | 1986 | 1979 | 99.6 |
| Comparative Example 2-1 | Comparative UDL-1 | 1998 | 1770 | 88.6 |
| Comparative Example 2-2 | Comparative UDL-2 | 2007 | 1930 | 96.2 |
| Comparative Example 2-3 | Comparative UDL-3 | 1987 | 1579 | 79.5 |

As shown in Table 8, in Examples 2-1 to 2-15, where the inventive materials for forming an organic film were used, the film thicknesses were decreased by less than 2% even after the baking under a nitrogen stream at 450° C., and resulted in having little change in the film thickness even after baking at high temperature. In particular, in Examples 2-5, 2-6, and 2-8 to 2-15, where polymers having a naphthalene ring structure were used, the film loss was suppressed to less than 1%, and it is revealed that heat resistance was even more excellent. In contrast, in Comparative Example 2-1, where a polyimide having no structure contributing to crosslinking was used, the film thickness was decreased by over 10%, and resulted in poor heat resistance. Furthermore, in Comparative Example 2-3, where the heat resistance of the main chain was low, the film was decreased by about 20%, and in Comparative Example 2-2, where a novolak resin having no imide structure and having a rigid structure was used, the film thickness was also decreased by about 4%. From these results, it is revealed that the inventive polymer having the imide skeleton has excellent heat resistance.

Example 3: Filling Property Evaluation (Examples
3-1 to 3-15, Comparative Examples 3-1 to 3-3)

As shown in FIG. 2, the materials (UDL-1 to -15, comparative UDL-1 to -3) for forming an organic film were each applied onto a SiO$_2$ wafer substrate having a dense hole pattern (hole diameter: 0.16 μm, hole depth: 0.50 μm, distance between the centers of two adjacent holes: 0.32 μm) and baked using a hot plate in the atmosphere at 350° C. for 60 seconds to form an organic film. After baking similarly in the atmosphere at 350° C. for 60 seconds, the resultant was further baked under such a nitrogen stream that the oxygen concentration was controlled to 0.2% or less at 450° C. for 60 seconds. Thereby, an organic film was formed. The substrate used was a base substrate 7 ($SiO_2$ wafer substrate) having a dense hole pattern as shown in FIG. 2 (G) (top view) and (H) (sectional view). The sectional shapes of the resulting wafer substrates were observed with a scanning electron microscope (SEM) to check whether or not the holes were filled with the organic film without voids (space) under each baking condition. Table 9 shows the results. If a material for forming an organic film having poor filling property is used, voids occur inside the holes in this evaluation. When a material for forming an organic film having good filling property is used, the holes are filled with the organic film 8 without voids in this evaluation as shown in FIG. 2 (I).

TABLE 9

| | Composition for forming organic film | Presence/absence of voids | |
| --- | --- | --- | --- |
| | | Baking at 350° C. | Baking at 450° C. |
| Example 3-1 | UDL-1 | Absent | Absent |
| Example 3-2 | UDL-2 | Absent | Absent |
| Example 3-3 | UDL-3 | Absent | Absent |
| Example 3-4 | UDL-4 | Absent | Absent |
| Example 3-5 | UDL-5 | Absent | Absent |
| Example 3-6 | UDL-6 | Absent | Absent |
| Example 3-7 | UDL-7 | Absent | Absent |
| Example 3-8 | UDL-8 | Absent | Absent |
| Example 3-9 | UDL-9 | Absent | Absent |
| Example 3-10 | UDL-10 | Absent | Absent |
| Example 3-11 | UDL-11 | Absent | Absent |
| Example 3-12 | UDL-12 | Absent | Absent |
| Example 3-13 | UDL-13 | Absent | Absent |
| Example 3-14 | UDL-14 | Absent | Absent |
| Example 3-15 | UDL-15 | Absent | Absent |
| Comparative Example 3-1 | Comparative Example UDL-1 | Present | Present |
| Comparative Example 3-2 | Comparative Example UDL-2 | Present | Present |
| Comparative Example 3-3 | Comparative Example UDL-3 | Absent | Present |

As shown in Table 9, in Examples 3-1 to 3-15 where the inventive materials for forming an organic film were used, it was possible to fill the hole patterns without voids, confirming that the filling property was favorable. On the other hand, in Comparative Examples 3-1 to 3-3, voids occurred under some baking conditions, confirming that the filling property was poor. In Comparative Examples 3-1 to 3-2, it can be conjectured that the filling property was insufficient at the baking at 350° C. because the flowability of the polymer itself was low. In Comparative Example 3-3, it can be conjectured that although there was no problem with the flowability of the polymer, voids occurred due to the baking at 450° C. because the heat resistance was insufficient.

Example 4: Planarizing Property Evaluation
(Examples 4-1 to 4-15 Comparative Examples 4-1 to 4-3)

The materials (UDL-1 to -15, comparative UDL-1 to -3) for forming an organic film were each applied onto a base substrate 9 ($SiO_2$ wafer substrate) having a giant isolated trench pattern (FIG. 3 (J), trench width: 10 μm, trench depth: 0.10 μm), baked in the atmosphere at 350° C. for 60 seconds, and then, further baked at 450° C. for 60 seconds under such a nitrogen stream that the oxygen concentration was controlled to 0.2% or less to form an organic film. Then, a step (delta 10 in FIG. 3 (K)) between the trench portion and the non-trench portion of an organic film 10 was observed with an atomic force microscope (AFM) NX10 manufactured by Park systems Corp. Table 10 shows the results. In this evaluation, the smaller the step, the better the planarizing property. Note that, in this evaluation, a trench pattern having a depth of 0.10 μm was generally planarized using an organic film material having a film thickness of approximately 0.2 μm. This is a severe evaluation condition to evaluate the planarizing property.

TABLE 10

| | Composition for forming organic film | Step (nm) |
| --- | --- | --- |
| Example 4-1 | UDL-1 | 70 |
| Example 4-2 | UDL-2 | 65 |
| Example 4-3 | UDL-3 | 55 |
| Example 4-4 | UDL-4 | 70 |
| Example 4-5 | UDL-5 | 70 |
| Example 4-6 | UDL-6 | 70 |
| Example 4-7 | UDL-7 | 65 |
| Example 4-8 | UDL-8 | 70 |
| Example 4-9 | UDL-9 | 65 |
| Example 4-10 | UDL-10 | 60 |
| Example 4-11 | UDL-11 | 55 |
| Example 4-12 | UDL-12 | 70 |
| Example 4-13 | UDL-13 | 50 |
| Example 4-14 | UDL-14 | 45 |
| Example 4-15 | UDL-15 | 45 |
| Comparative Example 4-1 | Comparative UDL-1 | 90 |
| Comparative Example 4-2 | Comparative UDL-2 | 90 |
| Comparative Example 4-3 | Comparative UDL-3 | 85 |

As shown in Table 10, in Examples 4-1 to 4-15 using the inventive materials for forming an organic film, the organic films had smaller steps between the trench portion and the non-trench portion compared with Comparative Examples 4-1 to 4-3, confirming that the planarizing property is excellent. Furthermore, in Examples 4-13 to 4-15, where a high-boiling-point solvent was added, it can be seen that the planarizing property is further improved by adding the high-boiling-point solvent. In Comparative Example 4-3, the heat resistance is poor, as shown in the results of the heat resistance evaluation shown in Table 8. Therefore, the film loss that occurs due to baking at high temperature was large, and the difference in the film thicknesses of the upper step and the lower step was emphasized, degrading the planarizing property, and leading to the above result. Meanwhile, in Comparative Examples 4-1 and 4-2, as seen from the results of the filling property evaluation test, poor filling occurred at the baking at 350° C., and thus, it can be conjectured that the result of the planarizing property was poor because the flowability itself was insufficient.

Example 5: Patterning Test 1 (Examples 5-1 to 5-15, Comparative Examples 5-1 to 5-3)

The materials (UDL-1 to -15, comparative UDL-1 to -3) for forming an organic film were each applied onto a silicon wafer substrate on which a $SiO_2$ film of 300 nm had been formed. Then, the resulting substrate was baked in the atmosphere at 350° C. for 60 seconds. Thereby, an organic film having a film thickness of 200 nm was formed. A CVD-SiON hard mask was formed thereon, and further an organic antireflective coating material (ARC-29A: manufactured by Nissan Chemical Industries, Ltd.) was applied and baked at 210° C. for 60 seconds to form an organic antireflective coating having a film thickness of 80 nm. A monolayer resist for ArF was applied thereon as a resist upper layer film material and baked at 105° C. for 60 seconds to form a photoresist film having a film thickness of 100 nm. A liquid immersion top coat material (TC-1) was applied on the photoresist film and baked at 90° C. for 60 seconds to form a top coat having a film thickness of 50 nm.

The resist upper layer film material (monolayer resist for ArF) was prepared by: dissolving a polymer (RP1), an acid generator (PAG1), and a basic compound (Amine1) into a solvent containing 0.1 mass % surfactant FC-430 (manufactured by Sumitomo 3M Ltd.) in proportions shown in Table 11; and filtering the solution through a 0.1-μm filter made of a fluorinated resin.

TABLE 11

| | Polymer (parts by mass) | Acid generator (parts by mass) | Basic compound (parts by mass) | Solvent (parts by mass) |
| --- | --- | --- | --- | --- |
| Monolayer resist for ArF | RP1 (100) | PAG1 (6.6) | Amine1 (0.8) | PGMEA (2500) |

The polymer (RP1), acid generator (PAG1), and basic compound (Amine1) used in the resist upper layer film material (monolayer resist for ArF) are shown below.

RP1

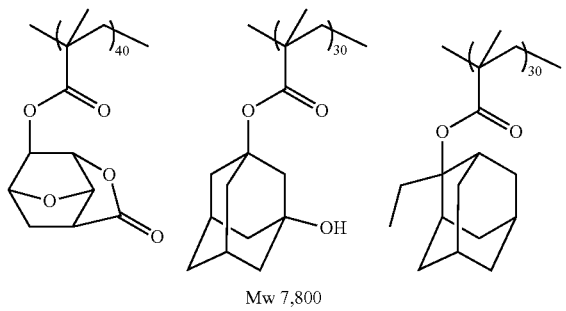

Mw 7,800

PAG1

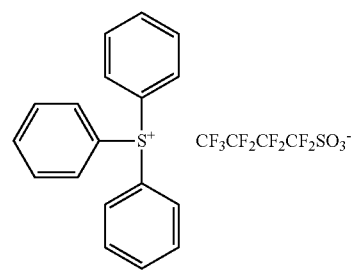

Amine1

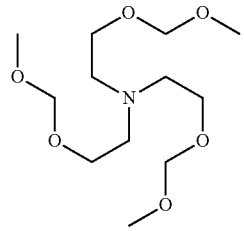

The liquid immersion top coat material (TC-1) was prepared by: dissolving a top coat polymer (PP1) into organic solvents in proportions shown in Table 12; and filtering the solution through a 0.1-μm filter made of a fluorinated resin.

TABLE 12

| | Polymer (parts by mass) | Organic solvent (parts by mass) |
| --- | --- | --- |
| TC-1 | PP1 (100) | Diisoamyl ether (2700) 2-methyl-1-butanol (270) |

The polymer (PP1) used in the immersion top coat material (TC-1) is shown below.

PP1

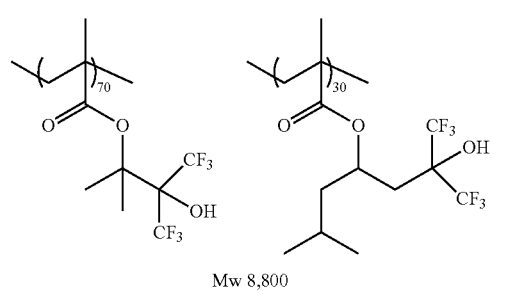

Mw 8,800

Next, the resulting substrate was exposed to light with an ArF liquid immersion exposure apparatus (NSR—S610C manufactured by Nikon Corporation, NA: 1.30, σ: 0.98/0.65, 35° s-polarized dipole illumination, 6% halftone phase shift mask), baked (PEB) at 100° C. for 60 seconds, and developed with a 2.38 mass % tetramethylammonium hydroxide (TMAH) aqueous solution for 30 seconds. Thus, a 55 nm 1:1 positive line and space pattern was obtained.

Next, the organic antireflective coating and the CVD-SiON hard mask were processed by dry etching while using the resist pattern as a mask with an etching apparatus Telius manufactured by Tokyo Electron Limited to form a hard mask pattern. The organic film was etched while using the obtained hard mask pattern as a mask to form an organic film pattern. The SiO$_2$ film was processed by etching while using the obtained organic film pattern as a mask. The etching conditions were as described below.

Conditions for transferring the resist pattern to the SiON hard mask.
Chamber pressure: 10.0 Pa
RF power: 1,500 W
CF$_4$ gas flow rate: 75 sccm
O$_2$ gas flow rate: 15 sccm
Time: 15 sec Conditions for transferring the hard mask pattern to the organic film.
 Chamber pressure: 2.0 Pa
 RF power: 500 W
 Ar gas flow rate: 75 sccm
 O₂ gas flow rate: 45 sccm
 Time: 120 sec
Conditions for transferring the organic film pattern to the SiO₂ film.
 Chamber pressure: 2.0 Pa
 RF power: 2,200 W
 C₅F₁₂ gas flow rate: 20 sccm
 C₂F₆ gas flow rate: 10 sccm
 Ar gas flow rate: 300 sccm
 O₂ gas flow rate: 60 sccm
 Time: 90 sec The pattern cross sections were observed with an electron microscope (S-4700) manufactured by Hitachi, Ltd. Table 13 shows the results.

TABLE 13

|  | Composition for forming organic film | Pattern profile after etching for transferring to substrate |
|---|---|---|
| Example 5-1 | UDL-1 | Vertical profile |
| Example 5-2 | UDL-2 | Vertical profile |
| Example 5-3 | UDL-3 | Vertical profile |
| Example 5-4 | UDL-4 | Vertical profile |
| Example 5-5 | UDL-5 | Vertical profile |
| Example 5-6 | UDL-6 | Vertical profile |
| Example 5-7 | UDL-7 | Vertical profile |
| Example 5-8 | UDL-8 | Vertical profile |
| Example 5-9 | UDL-9 | Vertical profile |
| Example 5-10 | UDL-10 | Vertical profile |
| Example 5-11 | UDL-11 | Vertical profile |
| Example 5-12 | UDL-12 | Vertical profile |
| Example 5-13 | UDL-13 | Vertical profile |
| Example 5-14 | UDL-14 | Vertical profile |
| Example 5-15 | UDL-15 | Vertical profile |
| Comparative Example 5-1 | Comparative UDL-1 | Pattern collapse |
| Comparative Example 5-2 | Comparative UDL-2 | Vertical profile |
| Comparative Example 5-3 | Comparative UDL-3 | Pattern collapse |

As clearly seen from the results shown in Table 13, in Examples 5-1 to 5-15 using the inventive materials for forming an organic film, the resist upper layer film pattern was favorably transferred to the final substrate in each case, confirming that the inventive organic film materials are suitably used in fine processing according to the multilayer resist method. On the other hand, in Comparative Examples 5-1 and 5-3, heat resistance was insufficient, and defects were generated in the film due to exposure to high temperature when forming a CVD-SiON hard mask, and therefore, it was not possible to form the patterns.

Example 6: Patterning Test 2 (Examples 6-1 to 6-15, Comparative Examples 6-1 to 6-3)

Coating films were formed by the same methods as those in the patterning test 1, except that the materials (UDL-1 to -15, comparative UDL-1 to -3) for forming an organic film were each applied onto a SiO₂ wafer substrate having a trench pattern (trench width: 10 μm, trench depth: 0.10 μm). Then, the coating films were subjected to patterning and dry etching, and the resulting pattern profiles were observed. Table 14 shows the results.

TABLE 14

|  | Composition for forming organic film | Pattern profile after etching for transferring to substrate |
|---|---|---|
| Example 6-1 | UDL-1 | Vertical profile |
| Example 6-2 | UDL-2 | Vertical profile |
| Example 6-3 | UDL-3 | Vertical profile |
| Example 6-4 | UDL-4 | Vertical profile |
| Example 6-5 | UDL-5 | Vertical profile |
| Example 6-6 | UDL-6 | Vertical profile |
| Example 6-7 | UDL-7 | Vertical profile |
| Example 6-8 | UDL-8 | Vertical profile |
| Example 6-9 | UDL-9 | Vertical profile |
| Example 6-10 | UDL-10 | Vertical profile |
| Example 6-11 | UDL-11 | Vertical profile |
| Example 6-12 | UDL-12 | Vertical profile |
| Example 6-13 | UDL-13 | Vertical profile |
| Example 6-14 | UDL-14 | Vertical profile |
| Example 6-15 | UDL-15 | Vertical profile |
| Comparative Example 6-1 | Comparative UDL-1 | Pattern collapse |
| Comparative Example 6-2 | Comparative UDL-2 | Pattern collapse |
| Comparative Example 6-3 | Comparative UDL-3 | Pattern collapse |

As clearly seen from the results shown in Table 14, in Examples 6-1 to 6-15 using the inventive materials for forming an organic film, the resist upper layer film pattern was favorably transferred to the final substrate in each case, confirming that the inventive organic film materials are suitably used in fine processing according to the multilayer resist method. On the other hand, in Comparative Examples 6-1 and 6-3, it was not possible to form the patterns due to insufficient heat resistance as in the patterning test 1. In Comparative Example 6-2, heat resistance and solvent resistance were ensured, but pattern collapse occurred at the time of the patterning due to poor pattern filling, and it was not possible to obtain a favorable pattern in the end.

From the above, it was revealed that the inventive materials for forming an organic film containing the inventive polymers for forming an organic film have excellent solvent resistance, high heat resistance that can withstand high temperature conditions of 400° C. or higher, high filling property, excellent planarizing property, and excellent adhesion. Thus, the inventive materials for forming an organic film are extremely useful as materials for forming an organic film used in multilayer resist methods. Moreover, the inventive patterning process using these materials can form a fine pattern with high precision even when a body to be processed is a stepped substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A material for forming an organic film, the material comprising:
 an organic solvent; and
 a polymer having a structure shown by the following general formula (1A) as a partial structure:

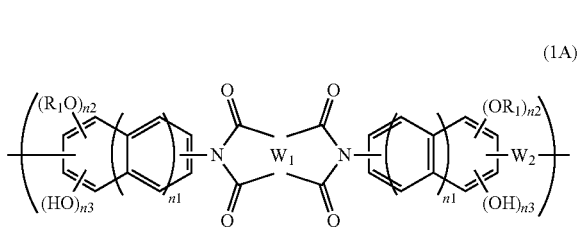

(1A)

wherein in the general formula (1A):

$R_1$ represents a hydrogen atom or a monovalent organic group having 1 to 10 carbon atoms, n1 represents an integer of 0 or 1, n2 and n3 satisfy:

$0 \leq n2 \leq 6$, $0 \leq n3 \leq 6$, and $1 \leq n2+n3 \leq 6$, $W_1$ represents a tetravalent organic group and is shown by any of the following formulae (1D):

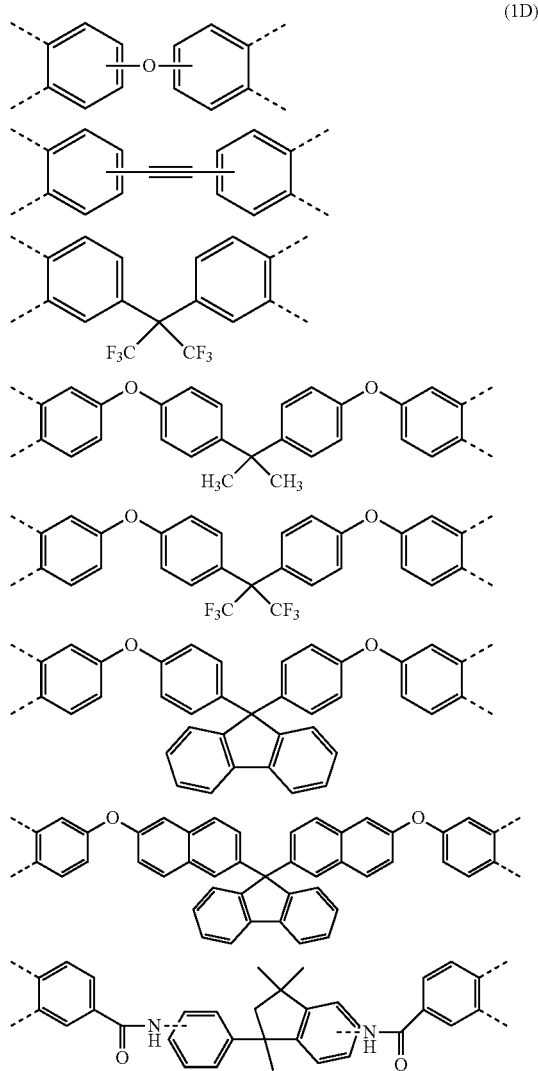

(1D)

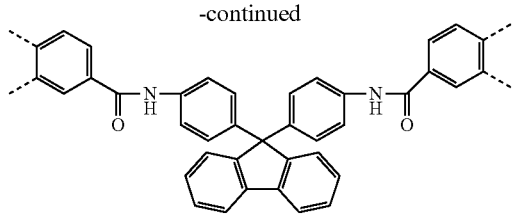

wherein an aromatic ring in the formula (1D) optionally has a substituent thereon, and $W_2$ is shown by the following formula (1E):

(1E).

2. The material for forming an organic film according to claim 1, wherein the polymer has a weight-average molecular weight of 1000 to 10000.

3. The material for forming an organic film according to claim 1, wherein the polymer is a novolak resin having the partial structure shown by the general formula (1A).

4. The material for forming an organic film according to claim 1, further comprising at least one of a surfactant and a plasticizer.

5. A patterning process comprising:
forming an organic film by using the material for forming an organic film according to claim 1 on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

6. The patterning process according to claim 5, wherein the pattern formation on the resist upper layer film is performed by a photolithography using light with a wavelength of 10 nm or more to 300 nm or less, a direct drawing by electron beam, a nanoimprinting, or a combination thereof.

7. The patterning process according to claim 5, wherein the pattern formation on the resist upper layer film comprises alkaline development or development with an organic solvent.

8. The patterning process according to claim 5, wherein the body to be processed is a semiconductor device substrate, a metal film, a metal carbide film, a metal oxide film, a metal nitride film, a metal oxycarbide film, or a metal oxynitride film.

9. The patterning process according to claim 5, wherein the body to be processed comprises silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

10. A patterning process comprising:
forming an organic film by using the material for forming an organic film according to claim 1 on a body to be processed;
forming a silicon-containing resist underlayer film by using a silicon-containing resist underlayer film material on the organic film;
forming an organic antireflective coating on the silicon-containing resist underlayer film;
forming a resist upper layer film by using a photoresist composition on the organic antireflective coating, so that a 4-layered film structure is constructed;
forming a circuit pattern in the resist upper layer film;
transferring the pattern to the organic antireflective coating and the silicon-containing resist underlayer film by etching the organic antireflective coating and the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

11. A patterning process comprising:
forming an organic film by using the material for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

12. The patterning process according to claim 11, wherein the inorganic hard mask is formed by a CVD method or an ALD method.

13. A patterning process comprising:
forming an organic film by using the material for forming an organic film according to claim 1 on a body to be processed;
forming an inorganic hard mask selected from a silicon oxide film, a silicon nitride film, and a silicon oxynitride film on the organic film;
forming an organic antireflective coating on the inorganic hard mask;
forming a resist upper layer film by using a photoresist composition on the organic antireflective coating, so that a 4-layered film structure is constructed;
forming a circuit pattern in the resist upper layer film;
transferring the pattern to the organic antireflective coating and the inorganic hard mask by etching the organic antireflective coating and the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

14. A material for forming an organic film, the material comprising:
a mixture of (i) one or more organic solvents each having a boiling point of lower than 180° C. and (ii) one or more organic solvents each having a boiling point of 180° C. or higher; and
a polymer having a structure shown by the following general formula (1A) as a partial structure:

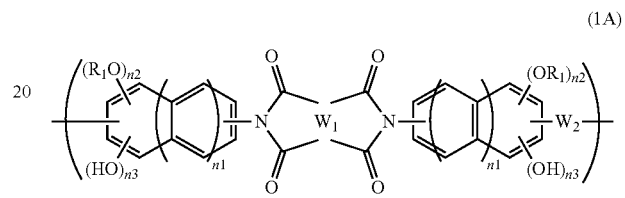

wherein in the general formula (1A):
R$_1$ represents a hydrogen atom or a monovalent organic group having 1 to 10 carbon atoms,
n1 represents an integer of 0 or 1,
n2 and n3 satisfy:
0≤n2≤6,
0≤n3≤6, and
1≤n2+n3≤6,
W$_1$ represents a tetravalent organic group and is shown by any of the following formulae (1D):

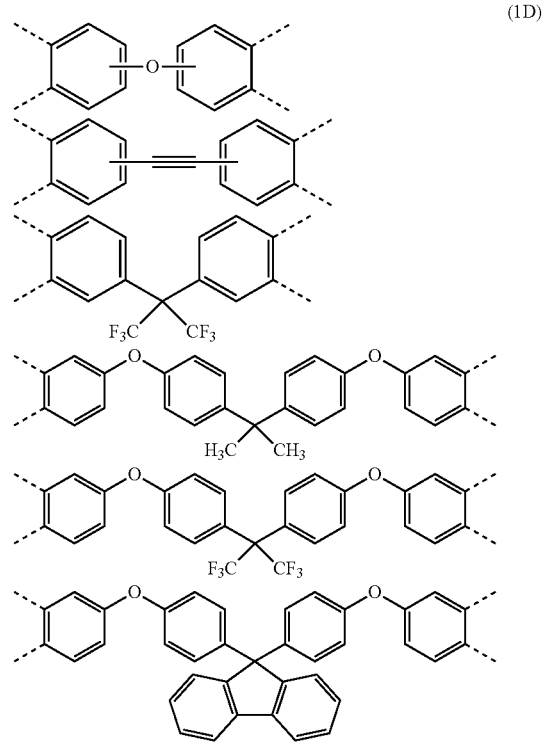

-continued

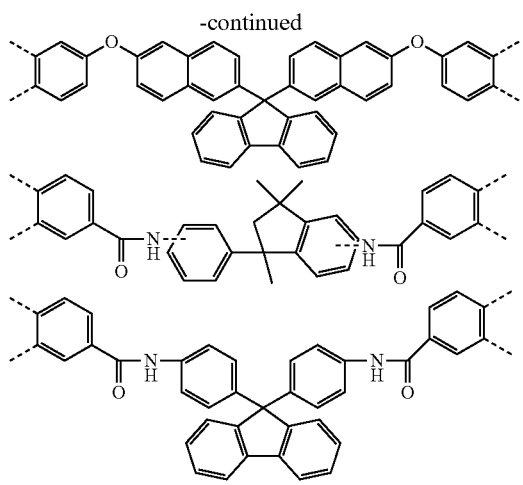

wherein an aromatic ring in the formula (1D) optionally has a substituent thereon, and $W_2$ represents a single bond or a linking group shown by the following formula (1B):

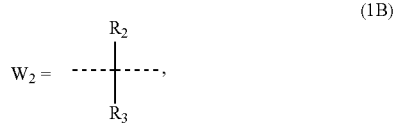

wherein:
when n1=1, $R_2$ and $R_3$ each independently represent hydrogen or an organic group having 1 to 30 carbon atoms, and the organic group $R_2$ and the organic group $R_3$ optionally bond to each other within a molecule to form a cyclic organic group, and
when n1=0, $R_2$ and $R_3$ each independently represent an organic group having 1 to 30 carbon atoms, and the organic group $R_2$ and the organic group $R_3$ optionally bond to each other within a molecule to form a cyclic organic group.

15. A patterning process comprising:
forming an organic film by using the material for forming an organic film according to claim 7 on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

16. A patterning process comprising:
forming an organic film by using the material for forming an organic film according to claim 14 on a body to be processed;
forming a silicon-containing resist underlayer film by using a silicon-containing resist underlayer film material on the organic film;
forming an organic antireflective coating on the silicon-containing resist underlayer film;
forming a resist upper layer film by using a photoresist composition on the organic antireflective coating, so that a 4-layered film structure is constructed;
forming a circuit pattern in the resist upper layer film;
transferring the pattern to the organic antireflective coating and the silicon-containing resist underlayer film by etching the organic antireflective coating and the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

17. A patterning process comprising:
forming an organic film by using the material for forming an organic film according to claim 14 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

18. A patterning process comprising:
forming an organic film by using the material for forming an organic film according to claim 14 on a body to be processed;
forming an inorganic hard mask selected from a silicon oxide film, a silicon nitride film, and a silicon oxynitride film on the organic film;
forming an organic antireflective coating on the inorganic hard mask;
forming a resist upper layer film by using a photoresist composition on the organic antireflective coating, so that a 4-layered film structure is constructed;
forming a circuit pattern in the resist upper layer film;
transferring the pattern to the organic antireflective coating and the inorganic hard mask by etching the organic antireflective coating and the inorganic hard mask while using the resist upper layer film having the formed pattern as a mask;
transferring the pattern to the organic film by etching the organic film while using the inorganic hard mask having the formed pattern as a mask; and further forming the pattern on the body to be processed by etching the body to be processed while using the organic film having the formed pattern as a mask.

19. A polymer having a structure shown by the following general formula (1A) as a partial structure:

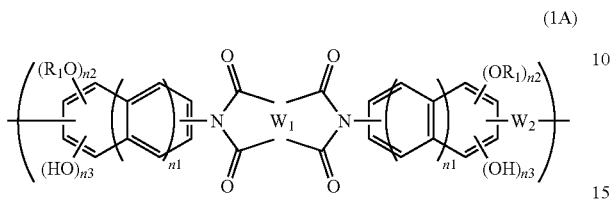
(1A)

wherein in the general formula (1A):

$R_1$ represents a hydrogen atom or a monovalent organic group having 1 to 10 carbon atoms, n1 represents an integer of 0 or 1, n2 and n3 satisfy;

$0 \leq n2 \leq 6$, $0 \leq n3 \leq 6$, and $1 \leq n2+n3 \leq 6$, $W_1$ represents a tetravalent organic group and is shown by any of the following formulae (1D):

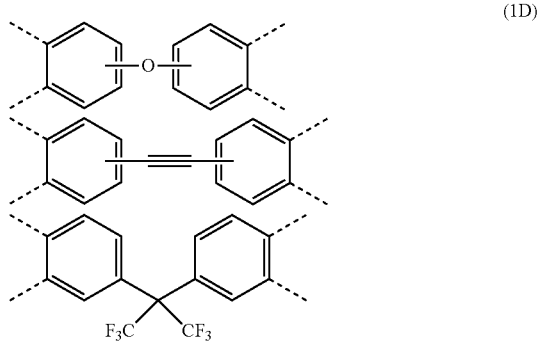
(1D)

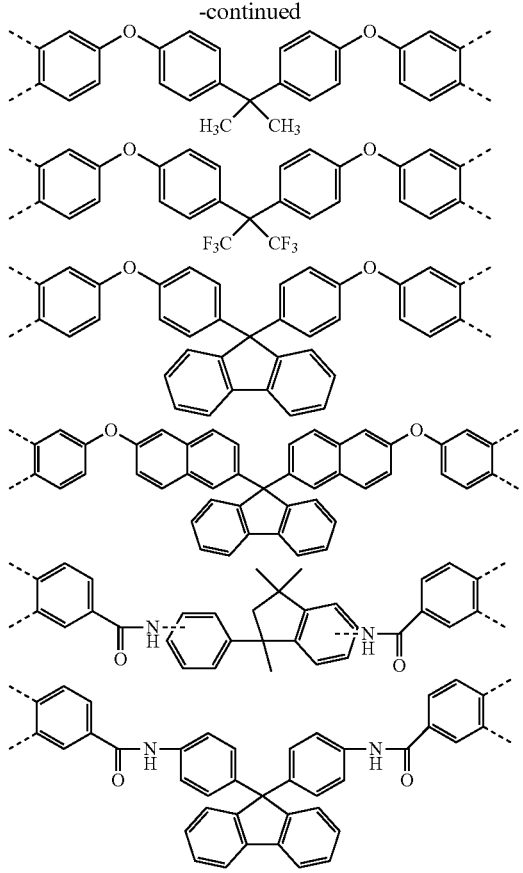

wherein an aromatic ring in the formula (1D) optionally has a substituent thereon, and $W_2$ is shown by the following formula (1E):

$W_2 = -CH_2-$  (1E).

20. The polymer according to claim 19, having a weight-average molecular weight of 1000 to 10000.

21. The polymer according to claim 19, being a novolak resin having the partial structure shown by the general formula (1A).

* * * * *